(12) United States Patent
Lee et al.

(10) Patent No.: US 10,672,890 B2
(45) Date of Patent: Jun. 2, 2020

(54) INTEGRATED CIRCUIT DEVICE

(71) Applicant: Samsung Electronics Co., Ltd., Suwon-si, Gyeonggi-do (KR)

(72) Inventors: Min-seong Lee, Hwaseong-si (KR); Il-ryong Kim, Seongnam-si (KR); Kyoung-hwan Yeo, Seoul (KR); Jae-yup Chung, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/166,801

(22) Filed: Oct. 22, 2018

(65) Prior Publication Data

US 2019/0312130 A1    Oct. 10, 2019

(30) Foreign Application Priority Data

Apr. 10, 2018 (KR) .................. 10-2018-0041716

(51) Int. Cl.
*H01L 29/66* (2006.01)
*H01L 27/088* (2006.01)
*H01L 21/8234* (2006.01)

(52) U.S. Cl.
CPC .......... *H01L 29/66795* (2013.01); *H01L 21/823431* (2013.01); *H01L 21/823437* (2013.01); *H01L 27/0886* (2013.01); *H01L 29/66545* (2013.01)

(58) Field of Classification Search
CPC ..... H01L 21/823431; H01L 21/823437; H01L 21/823481; H01L 21/823878; H01L 27/0886; H01L 29/66545; H01L 29/66795; H01L 29/66818
See application file for complete search history.

(56) References Cited

U.S. PATENT DOCUMENTS

| | | | |
|---|---|---|---|
| 9,305,825 B2 * | 4/2016 | Youn | .............. H01L 21/763 |
| 9,337,190 B2 | 5/2016 | Fung | |
| 9,373,624 B1 | 6/2016 | Balakrishnan et al. | |
| 9,613,953 B2 | 4/2017 | Liaw | |
| 9,865,704 B2 | 1/2018 | Xie et al. | |
| 2007/0267680 A1 | 11/2007 | Uchino et al. | |

(Continued)

FOREIGN PATENT DOCUMENTS

| | | |
|---|---|---|
| JP | 2007-311491 A | 11/2007 |
| KR | 10-2016-0066103 A | 6/2016 |
| KR | 10-2016-122910 | 10/2016 |

*Primary Examiner* — Allan R Wilson
(74) *Attorney, Agent, or Firm* — Harness, Dickey & Pierce, P.L.C.

(57) ABSTRACT

An integrated circuit device includes a substrate including a first device region and a second device region; a first fin separation insulating portion on the first device region; a pair of first fin-type active regions spaced from each other with the first fin separation insulating portion therebetween in the first device region and collinearly extending in a first horizontal direction; a second fin separation insulating portion extending in a second horizontal direction over the first device region and the second device region; and a pair of second fin-type active regions spaced from each other with the second fin separation insulating portion therebetween and collinearly extending in the first horizontal direction, wherein the first fin separation insulating portion and the second fin separation insulating portion vertically overlap each other.

20 Claims, 68 Drawing Sheets

(56) References Cited

U.S. PATENT DOCUMENTS

| | | | |
|---|---|---|---|
| 2014/0264610 A1 | 9/2014 | Yang et al. | |
| 2015/0214341 A1* | 7/2015 | Shin | H01L 29/785 |
| | | | 257/401 |
| 2016/0155741 A1 | 6/2016 | Yoo et al. | |
| 2016/0225764 A1* | 8/2016 | Chang | H01L 27/0886 |
| 2016/0307890 A1 | 10/2016 | Yeo et al. | |
| 2016/0379982 A1* | 12/2016 | You | H01L 29/0657 |
| | | | 257/369 |
| 2017/0062475 A1 | 3/2017 | Song et al. | |
| 2017/0154967 A1* | 6/2017 | Huang | H01L 21/0217 |
| 2017/0271336 A1 | 9/2017 | Park et al. | |
| 2019/0312034 A1* | 10/2019 | Lee | H01L 21/823821 |

\* cited by examiner

X1 – X1'

X1 – X1'

X2 – X2'

INTEGRATED CIRCUIT DEVICE

CROSS-REFERENCE TO RELATED APPLICATION

This application claims the benefit of Korean Patent Application No. 10-2018-0041716, filed on Apr. 10, 2018, in the Korean Intellectual Property Office, the disclosure of which is incorporated herein in its entirety by reference.

BACKGROUND

Inventive concepts relate to an integrated circuit device, and more particularly, to an integrated circuit device including a fin field-effect transistor.

Recently, as down-scaling of integrated circuit devices rapidly progresses, the desire for obtaining not only high operation speed but also operational accuracy in integrated circuit devices has increased. Accordingly, various studies for providing an integrated circuit device having an optimized or improved structure capable of implementing an integrated circuit device including a transistor providing optimum or improved performance have been conducted.

SUMMARY

Inventive concepts provides an integrated circuit device having a structure in which optimum or improved performance may be provided according to each channel type in transistors even though the area of a device region is reduced according to down-scaling of the integrated circuit device.

According to some example embodiments of inventive concepts, there is provided an integrated circuit device including a substrate comprising a first device region and a second device region spaced from the first device region, a device isolation region between the first device region and the second device region, a first fin separation insulating portion arranged on the first device region and having a first width in a first horizontal direction, a pair of first fin-type active regions in the first device region, the pair of first fin-type active regions including a first element and a second element spaced from each other, with the first fin separation insulating portion between the first element and the second element, the first element and the second element collinearly extending in the first horizontal direction, a second fin separation insulating portion extending in a second horizontal direction over the first device region, the device isolation region, and the second device region, and having a second width in the first horizontal direction that is less than the first width, the second horizontal direction crossing the first horizontal direction, and a pair of second fin-type active regions spaced from each other with the second fin separation insulating portion therebetween in the second device region and collinearly extending in the first horizontal direction. The first fin separation insulating portion and the second fin separation insulating portion vertically overlap each other.

According to some example embodiments of inventive concepts, there is provided an integrated circuit device including a substrate comprising a first device region and a second device region spaced from the first region, a device isolation region between the first device region and the second device region, a first fin separation insulating portion on the first device region, a plurality of pairs of first fin-type active regions in the first device region, each of the plurality of pairs including a first element and a second element spaced from the first element with the first fin separation insulating portion therebetween, the first element collinearly extending with the second element in a first horizontal direction, a plurality of second fin separation insulating portions extending in a second horizontal direction over the first device region, the device isolation region, and the second device region, and spaced apart from each other, the second horizontal direction crossing the first horizontal direction, and a plurality of second fin-type active regions in the second device region, the plurality of second fin-type active regions arranged in a straight line extending in a direction across the plurality of second fin separation insulating portions. The first fin separation insulating portion and the plurality of second fin separation insulating portions vertically overlap each other.

According to some example embodiments of inventive concepts, there is provided an integrated circuit device including a substrate comprising a first device region and a second device region spaced apart from each other, a first fin separation insulating portion over the first device region, a pair of first fin-type active regions in the first device region, the pair of first fin-type active regions including a first element and a second element spaced from the first element with the first fin separation insulating portion therebetween, the first element collinearly extending with the second element in a first horizontal direction, a device isolation region, a plurality of second fin separation insulating portions covering an upper surface of the first fin separation insulating portion and vertically overlapping the first fin separation insulating portion, the plurality of second fin separation insulating portions extending in a second horizontal direction from an upper portion of the first device region to an upper portion of the second device region through the device isolation region, the second horizontal direction crossing the first horizontal direction, and a plurality of second fin-type active regions in the second device region, the plurality of second fin-type active regions spaced from each other with the plurality of second fin separation insulating portions therebetween, the plurality of second fin-type active regions collinearly extending in the first horizontal direction.

BRIEF DESCRIPTION OF THE DRAWINGS

Embodiments of inventive concepts will be more clearly understood from the following detailed description taken in conjunction with the accompanying drawings in which:

FIGS. 7A to 17D are cross-sectional views according to a process sequence, for explaining a method of manufacturing an integrated circuit device, according to some example embodiments, in which each of FIGS. 7A, 8A, 9A, 10A, 11A, 12A, 13A, 14A, 15A, 16A FIG. 17D is a cross-sectional view according to a process sequence of a portion corresponding to a cross section taken along line Y2-Y2' of FIG. 1;

DETAILED DESCRIPTION OF EXAMPLE EMBODIMENTS

Figure 1:
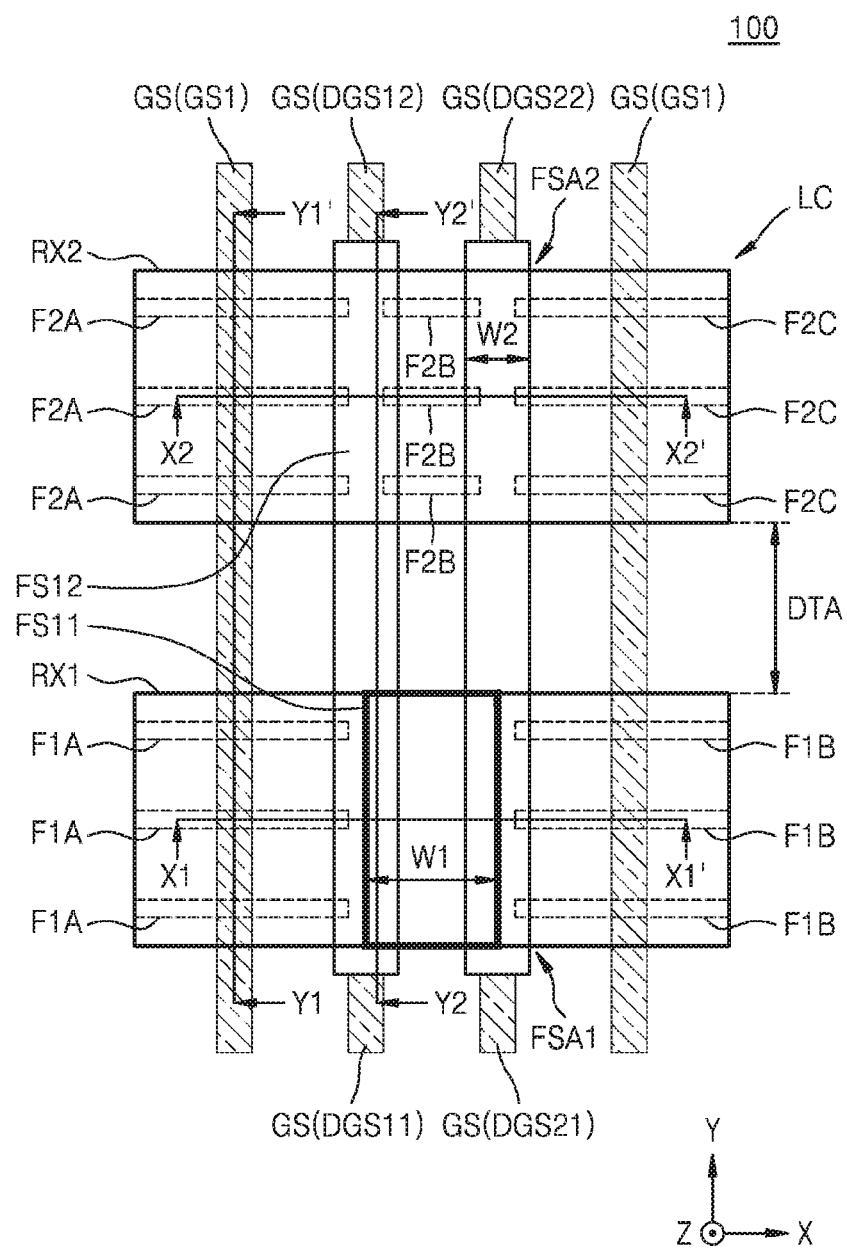
FIG. 1 is a plan layout diagram for explaining an integrated circuit device according to some example embodiments.

Hereinafter, example embodiments will be described in detail with reference to the accompanying drawings. In the drawings, like elements are denoted by like reference numerals, and a repeated description thereof is omitted below.

Figure 2A:
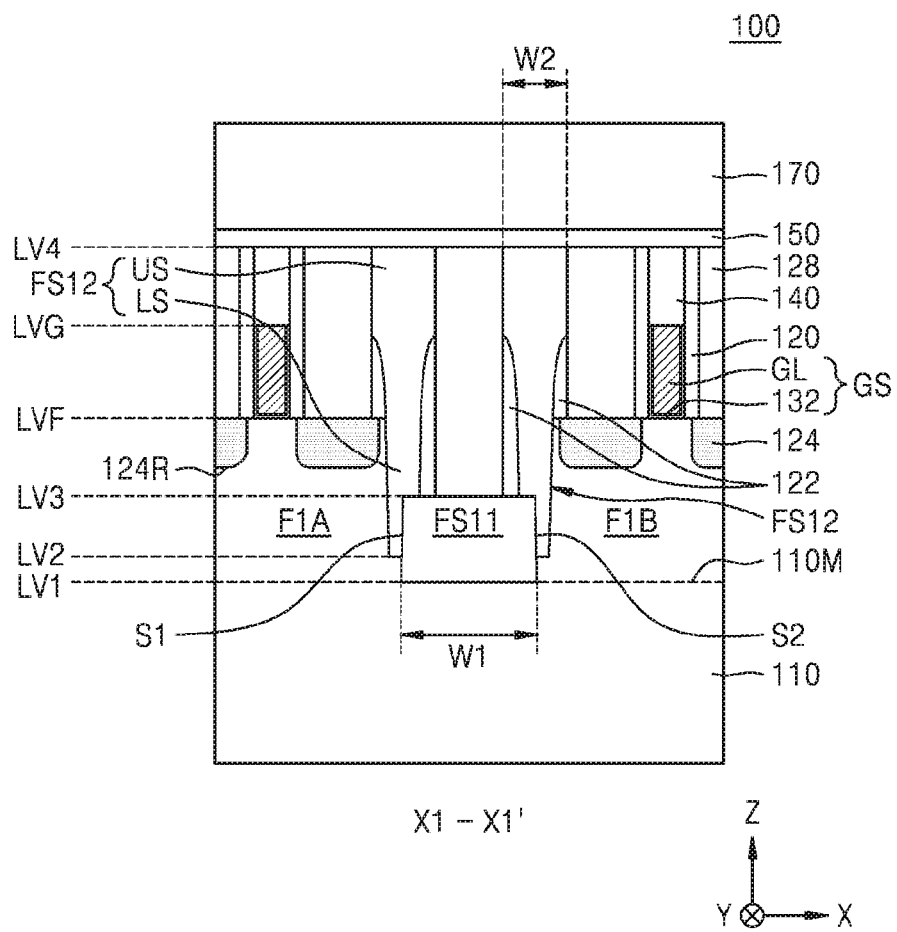
FIG. 2A is a cross-sectional view taken along line X1-X1' of FIG. 1.
Figure 2B:
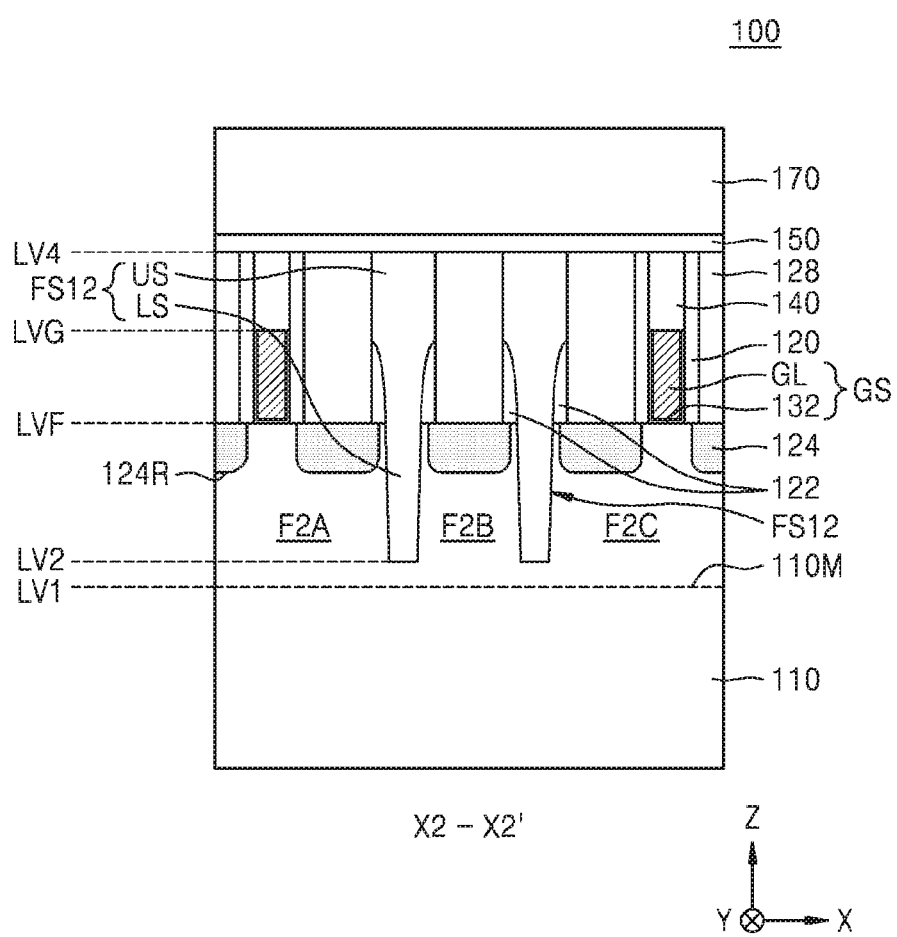
FIG. 2B is a cross-sectional view taken along line X2-X2' of FIG. 1.
Figure 2C:
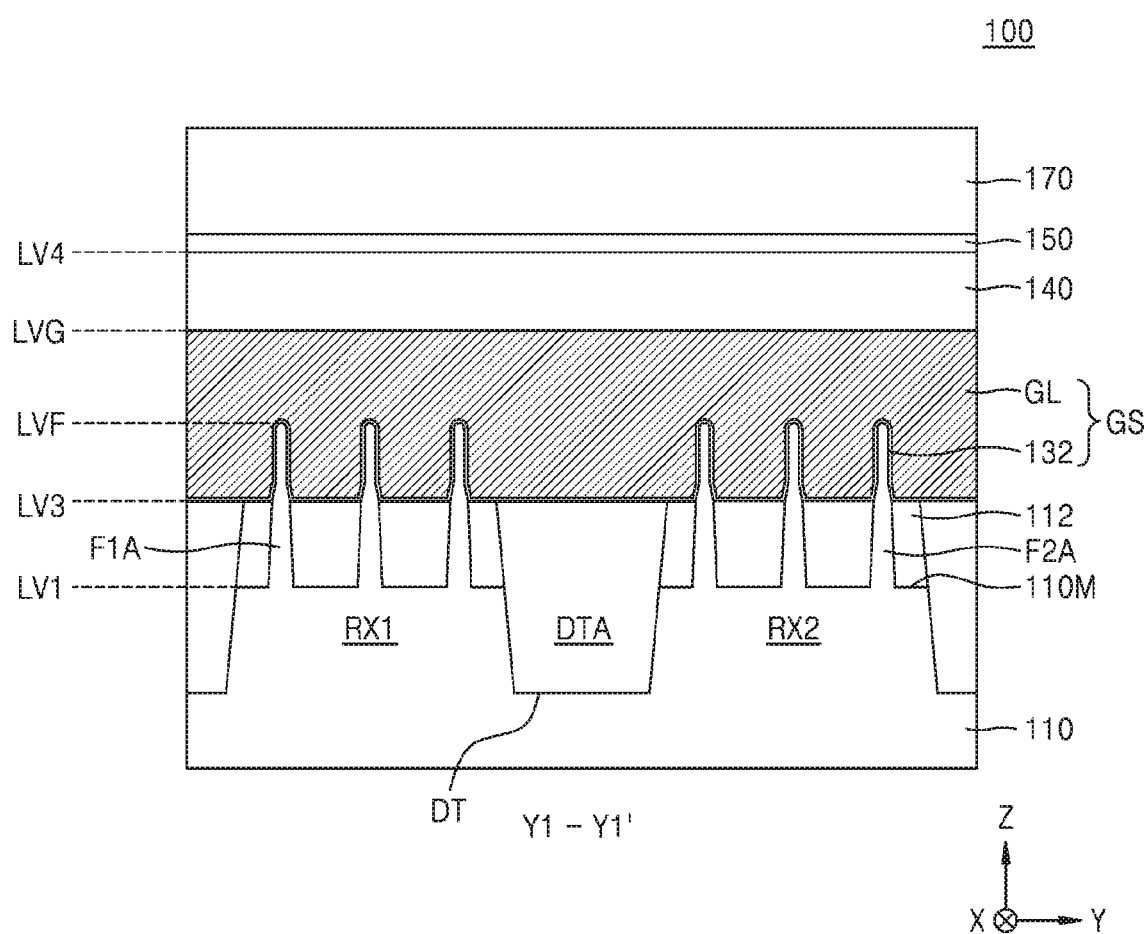
FIG. 2C is a cross-sectional view taken along line Y1-Y1' of FIG. 1.
Figure 2D:
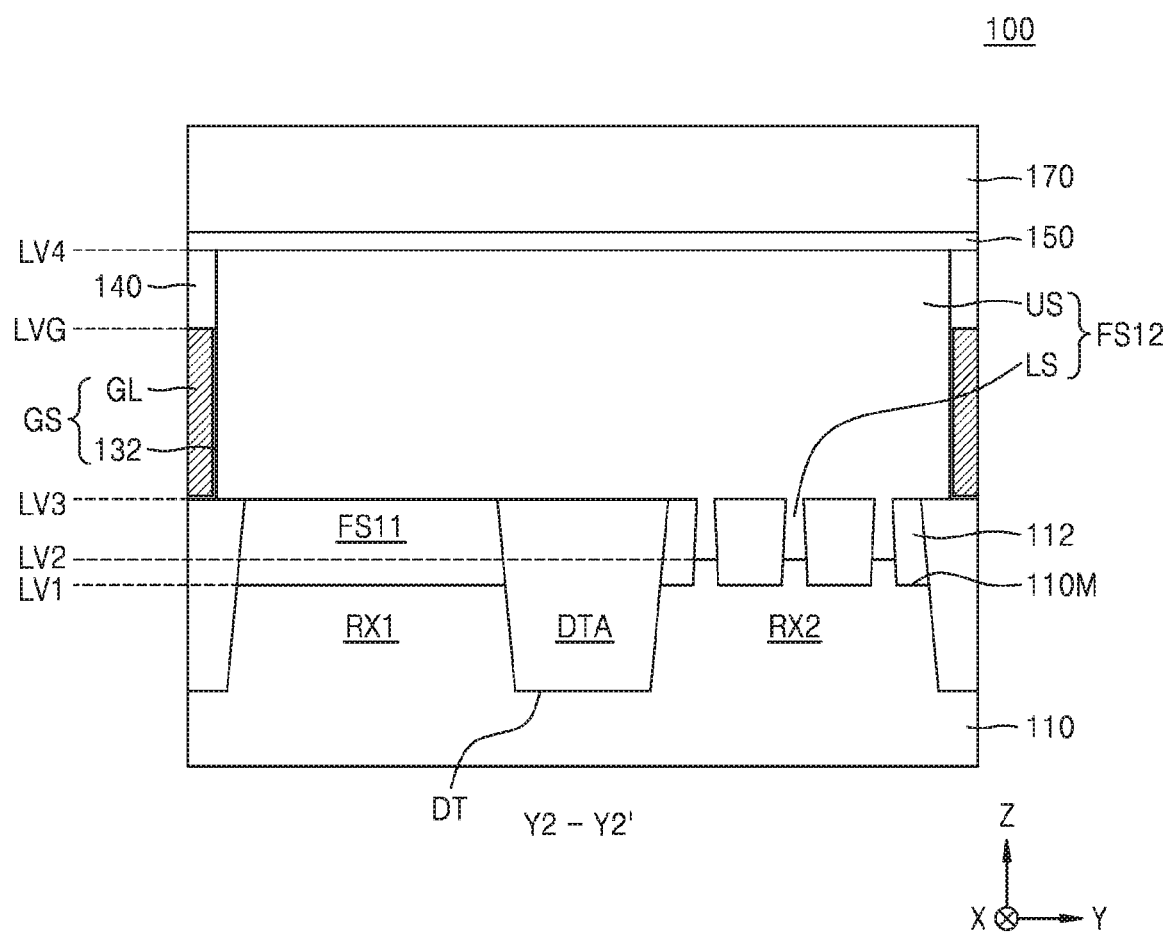
FIG. 2D is a cross-sectional view taken along line Y2-Y2' of FIG. 1.

FIGS. 1 to 2D are diagrams for explaining an integrated circuit device 100 according to some example embodiments. FIG. 1 is a plan layout diagram illustrating major components of the integrated circuit device 100, FIG. 2A is a cross-sectional view taken along line X1-X1' of FIG. 1, FIG. 2B is a cross-sectional view taken along line X2-X2' of FIG. 1, FIG. 2C is a cross-sectional view taken along line Y1-Y1' of FIG. 1, and FIG. 2D is a cross-sectional view taken along line Y2-Y2' of FIG. 1. The integrated circuit device 100 may include a logic cell including a fin field-effect transistor (FinFET).

Referring to FIGS. 1 to 2D, the integrated circuit device 100 includes a logic cell LC on a substrate 110.

The substrate 110 may have a main surface 110M extending in a horizontal direction (e.g. an X-Y plane direction) at a vertical level LV1. The substrate 110 may include a semiconductor such as Si or Ge, or a compound semiconductor such as SiGe, SiC, GaAs, InAs, or InP. The substrate 110 may include a conductive region, for example, a well doped with impurities, or a structure doped with impurities.

The logic cell LC may include a first device region RX1 and a second device region RX2. In the first device region RX1, there are a plurality of first fin-type active regions F1A and F1B vertically protruding from the substrate 110. In the second device region RX2, there are a plurality of second fin-type active regions F2A, F2B, and F2C vertically protruding from the substrate 110. Between the first device region RX1 and the second device region RX2, there may be or may include a deep trench DT in the substrate 110, and in the deep trench DT, there may be or may include a device isolation region DTA. The plurality of first fin-type active regions F1A and F1B and the plurality of second fin-type active regions F2A, F2B, and F2C may extend parallel to each other in a width direction (e.g. the X) of the logic cell LC.

On the first device region RX1 and the second device region RX2, there may be or may include a device isolation film 112 between each of the plurality of first fin-type active regions F1A and F1B and between each of the plurality of second fin-type active regions F2A, F2B, and F2C. The device isolation film 112 may cover both side walls of each of the plurality of first fin-type active regions F1A and F1B and both side walls of each of the plurality of second fin-type active regions F2A, F2B, and F2C. The plurality of first fin-type active regions F1A and F1B and the plurality of second fin-type active regions F2A, F2B, and F2C may protrude above the device isolation film 112.

A first fin separation insulating portion FS11 may be or may include arranged over the first device region RX1. In some example embodiments, the first fin separation insulating portion FS11 may be or may include a portion of the device isolation film 112. The first fin separation insulating portion FS11 may have a first width W1 in the X direction.

In some example embodiments, the device isolation film 112, the device isolation area DTA, and the first fin separation insulating portion FS11 may include the same insulating material as one another. For example, the device isolation film 112, the device isolation area DTA, and the first fin separation insulating portion FS11 may each include a silicon oxide film, but inventive concepts are not limited thereto.

In the first device region RX1, the plurality of first fin-type active regions F1A and F1B may include a pair of first fin-type active regions F1A and F1B spaced from each other, with the first fin separation insulating portion FS11 therebetween and collinearly extending in the X direction.

A plurality of second fin separation insulating portions FS12 spaced apart from each other may be or may include arranged over the second device region RX2. The plurality of second fin separation insulating portions FS12 may extend long over each of the first device region RX1, the device isolation area DTA, and the second device region RX2 in a height direction (e.g. a Y direction) of the logic cell LC. The plurality of second fin separation insulating portions FS12 may each have a second width W2 in the X direction, which is less than the first width W1. In the X direction, the second width W2 may be greater than a width of a gate structure GS. Although FIG. 1 illustrates the plurality of second fin separation insulating portions FS12 having substantially identical widths in the X direction, inventive concepts are not limited thereto. The plurality of second fin separation insulating portions FS12 may have different widths from each other. Although FIG. 1 illustrates the plurality of second fin separation insulating portions FS12 having substantially identical lengths in the Y direction, inventive concepts are not limited thereto. In some example embodiments, the plurality of second fin separation insulating portions FS12 may have different lengths from each other in the Y direction.

In the second device region RX2, the plurality of second fin-type active regions F2A, F2B, and F2C may include three second fin-type active regions F2A, F2B, and F2C arranged in a straight line extending in the X direction across the plurality of second fin separation insulating portions FS12. From among the three second fin-type active regions F2A, F2B, and F2C, one pair of neighboring second fin-type active regions F2A and F2B and one pair of neighboring second fin-type active regions F2B and F2C may each be spaced from each other with one second fin separation insulating portion FS12 therebetween. On the second device region RX2, the plurality of second fin separation insulating portions FS12 may each extend between a pair of second fin-type active regions F2A and F2B or a pair of second fin-type active regions F2B and F2C.

The second fin separation insulating portion FS12 may include an upper insulating portion US and a lower insulating portion LS integrally connected to each other. The upper insulating portion US may extend long over the first device region RX1, the device isolation region DTA, and the second device region RX2 in the Y direction. The lower insulating portion LS may protrude from the upper insulating portion US toward the substrate 110. The lower insulating portion LS may not be arranged in the device isolation region DTA. Over the first device region RX1, the lower insulating portion LS of the second fin separation insulating portion FS12 may be between a pair of first fin-type active regions F1A and F1B. Over the second device region RX2, the lower insulating portion LS of the second fin separation insulating portion FS12 may be between a pair of second fin-type active regions F2A and F2B or between a pair of second fin-type active regions F2B and F2C.

On the first device region RX1, a portion of the first fin separation insulating portion FS11 and a portion of the second fin separation insulating portion FS12 may vertically overlap each other. The first fin separation insulating portion FS11 may include a first side wall S1 and a second side wall S2 facing opposite sides to each other in the X direction. In the first device region RX1, one of the plurality of second fin separation insulating portions FS12 may contact the first side wall S1, and the other may contact the second side wall S2.

A vertical length (e.g. a length in the Z direction) of each of the plurality of second fin separation insulating portions FS12 may be greater than a vertical length of the first fin separation insulating portion FS11. A lowermost surface vertical level of the first fin separation insulating portion FS11 may be substantially the same as the vertical level LV1 of the main surface 110M of the substrate 110. However, inventive concepts are not limited thereto. In some example embodiments, the lowermost surface vertical level of the first fin separation insulating portion FS11 may be lower or higher than the vertical level LV1 of the main surface 110M of the substrate 110. The term "vertical level" used herein refers to a length in a vertical direction, for example, the ±Z direction, with respect to the main surface 110M of the substrate 110.

A lowermost surface vertical level LV2 of the second fin separation insulating portion FS12 may be higher than the lowermost surface vertical level LV1 of the first fin separation insulating portion FS11. An uppermost surface vertical level LV3 of the first fin separation insulating portion FS11 and an uppermost surface vertical level LV4 of the second fin separation insulating portion FS12 may be different from each other. In some example embodiments, the uppermost surface vertical level LV4 of the second fin separation insulating portion FS12 may be higher than the uppermost surface vertical level LV3 of the first fin separation insulating portion FS11. The uppermost surface vertical level LV3 of the first fin separation insulating portion FS11 may be substantially the same as an uppermost surface vertical level of the device isolation film 112. The uppermost surface vertical level LV3 of the first fin separation insulating portion FS11 may be lower than an uppermost surface vertical level LVF of a pair of first fin-type active regions F1A and F1B, and the uppermost surface vertical level LV4 of the second fin separation insulating portion FS12 may be higher than the uppermost surface vertical level LVF of the pair of first fin-type active regions F1A and F1B.

A plurality of gate structures GS may extend long over the substrate 110 in the Y direction. The plurality of gate structures GS may respectively have identical widths in the X direction and may be or may include arranged at regular pitches in the X direction. The uppermost surface vertical level LV4 of the second fin separation insulating portion FS12 may be higher than an uppermost surface vertical level LVG of the plurality of gate structures GS.

The plurality of gate structures GS may include a normal gate structure GS1 extending long over the first device region RX1, the device isolation region DTA, and the second device region RX2 in the Y direction. The second fin separation insulating portion FS12 may extend parallel to the normal gate structure GS1 over the first device region RX1, the device isolation region DTA, and the second device region RX2.

In the first device region RX1 and the second device region RX2, the normal gate structure GS1 of the plurality of gate structures GS may cover an upper surface and both side walls of each of the plurality of first fin-type active regions F1A and F1B and the plurality of second fin-type active regions F2A, F2B, and F2C and an upper surface of the device isolation film 112. In the first device region RX1 and the second device region RX2, there may be or may include a plurality of MOS transistors along a plurality of normal gate structures GS1. The plurality of MOS transistors may be three-dimensional MOS transistors in which a channel is formed at an upper surface and both side walls of each of the plurality of first fin-type active regions F1A and F1B and the plurality of second fin-type active regions F2A, F2B, and F2C. In some example embodiments, the first device region RX1 may be or may include an NMOS transistor region, and the plurality of first fin-type active regions F1A and F1B may include an N-type channel region. The second device region RX2 may be or may include a PMOS transistor region, and the plurality of second fin-type active regions F2A, F2B, and F2C may include a P-type channel region. However, inventive concepts are not limited thereto, and various modifications and changes may be made therein. For example, the first device region RX1 may be or may include a PMOS transistor region, and the second device region RX2 may be or may include an NMOS transistor region.

The plurality of gate structures GS may include one pair of dummy gate structures DGS11 and DGS12 and one pair of dummy gate structures DGS21 and DGS22 each spaced from each other in the Y direction with the second fin separation insulating portion FS12 therebetween. The pair of dummy gate structures DGS11 and DGS12 and the pair of dummy gate structures DGS21 and DGS22 may each collinearly extend along with the second fin separation insulating portion FS12 in the Y direction.

In the plurality of gate structures GS, the normal gate structure GS1 and the dummy gate structures DGS11, DGS12, DGS21, and DGS22 may include the same material as each other. In some example embodiments, the normal gate structure GS1 and the dummy gate structures DGS11, DGS12, DGS21, and DGS22 may include the same metal as each other and may have substantially the same stack structure as each other. However, the dummy gate structures DGS11, DGS12, DGS21, and DGS22 may maintain an electric floating state during an operation of the integrated circuit device 100.

The plurality of gate structures GS may each have a stack structure of a gate insulating film 132 and a gate line GL. The gate insulating film 132 may cover a bottom surface and both side walls of the gate line GL. The gate insulating film 132 may include a silicon oxide film, a high k dielectric film, or a combination thereof. The high k dielectric film may include a material having a dielectric constant that is greater than that of a silicon oxide film. The high k dielectric film may include a metal oxide or a metal oxynitride. There may be or may include an interface film (not shown) between first fin-type active regions F1A and F1B in the first device region RX1 and the gate insulating film 132 and between second fin-type active regions F2A, F2B, and F2C in the second device region RX2 and the gate insulating film 132. The interface film may include an oxide film, a nitride film, and/or an oxynitride film.

A plurality of gate lines GL may have a structure in which a metal nitride layer, a metal layer, a conductive capping layer, and a gap-fill metal film are stacked in this stated order. The metal nitride layer and the metal layer may include at least one metal selected from Ti, Ta, W, Ru, Nb, Mo, and Hf. The gap-fill metal film may include a W film or an Al film. The plurality of gate lines GL may each include a work function metal containing layer. The work function metal containing layer may include at least one metal selected from Ti, W, Ru, Nb, Mo, Hf, Ni, Co, Pt, Yb, Tb, Dy, Er, and Pd. In some example embodiments, the plurality of gate lines GL may each include a stack structure of TiAlC/TiN/W, a stack structure of TiN/TaN/TiAlC/TiN/W, or a stack structure of TiN/TaN/TiN/TiAlC/TiN/W, but inventive concepts are not limited thereto.

An upper surface of each of the plurality of gate structures GS may be covered by a gate insulating capping layer 140. The gate insulating capping layer 140 may include a silicon nitride film.

A plurality of first insulating spacers 120 may cover both side walls of each of the plurality of gate structures GS. The plurality of first insulating spacers 120 may extend long in a line shape in the Y direction, together with the plurality of gate structures GS. A plurality of second insulating spacers 122 may cover both side walls of each of the plurality of second fin separation insulating portions FS12. The plurality of second insulating spacers 122 may extend long in a line shape in the Y direction, together with the plurality of second fin separation insulating portions FS12. The plurality of first insulating spacers 120 and the plurality of second insulating spacers 122 may include a silicon nitride, a SiOCN film, a SiCN film, or a combination thereof.

A vertical length (a length in the Z direction) of the plurality of second insulating spacers 122 may be different from that of the plurality of first insulating spacers 120. In some example embodiments, a vertical length of some of the plurality of second insulating spacers 122 may be less than that of the plurality of first insulating spacers 120. A vertical level of an uppermost surface of the plurality of second insulating spacers 122 may be lower than that of an uppermost surface of the plurality of first insulating spacers 120.

Over the first device region RX1, a lowermost surface vertical level of some of the plurality of second insulating spacers 122 may be lower than the uppermost surface vertical level LVF of each of the plurality of first fin-type active regions F1A and F1B. In some example embodiments, a lowermost surface vertical level of the others of the plurality of second insulating spacers 122 may be substantially the same as the uppermost surface vertical level LV3 of the first fin separation insulating portion FS11.

In the first device region RX1 and the second device region RX2, there may be or may include a plurality of recesses 124R in the plurality of first fin-type active regions F1A and F1B and the plurality of second fin-type active regions F2A, F2B, and F2C. The plurality of recesses 124R may be filled with a plurality of source/drain regions 124. The plurality of source/drain regions 124 may include a semiconductor layer epitaxially grown from a surface of each of the plurality of first fin-type active regions F1A and F1B and the plurality of second fin-type active regions F2A, F2B, and F2C included in inner walls of the plurality of recesses 124R. In some example embodiments, the plurality of source/drain regions 124 may include a plurality of epitaxially grown SiGe layers, an epitaxially grown Si layer, and/or an epitaxially grown SiC layer. In some example embodiments, the plurality of source/drain regions 124 on the first device region RX1 may include an epitaxially grown Si layer, and/or an epitaxially grown SiC layer. In some example embodiments, the plurality of source/drain regions 124 on the second device region RX2 may include a plurality of epitaxially grown SiGe layers.

An inter-gate insulating film 128 may be in each of between the plurality of gate structures GS, between two neighboring second fin separation insulating portions FS12, and between the gate structure GS and the second fin separation insulating portion FS12. The plurality of source/drain regions 124 may be covered by the inter-gate insulating film 128. The inter-gate insulating film 128 may include a portion that contacts an upper surface of the first fin separation insulating portion FS11. The inter-gate insulating film 128 may include a silicon oxide film.

An upper insulating capping layer 150 may extend parallel to the main surface 110M of the substrate 110 to cover a plurality of gate insulating capping layers 140, the plurality of first insulating spacers 120, the plurality of second fin separation insulating portions FS12, and the inter-gate insulating film 128. The upper insulating capping layer 150 may include a silicon oxide film, a silicon nitride film, a polysilicon film, or a combination thereof. An interlayer insulation film 170 may be on the upper insulating capping layer 150. The interlayer insulation film 170 may include a silicon oxide film, a silicon nitride film, or a combination thereof.

Although FIGS. 2A to 2D illustrate the first fin separation insulating portion FS11 and the plurality of second fin separation insulating portions FS12 each having a bottom surface that includes a planar surface, inventive concepts are not limited thereto. In some example embodiments, a bottom surface of each of the first fin separation insulating portion FS11 and the plurality of second fin separation insulating portions FS12 may include a curved surface included in a portion of a circle or a portion of an oval. In some example embodiments, a bottom surface of each of the first fin separation insulating portion FS11 and the plurality of second fin separation insulating portions FS12 may include a non-planar surface having a point sharply protruding toward the substrate 110.

In some example embodiments, each of the first fin separation insulating portion FS11 and the plurality of second fin separation insulating portions FS12 may include a single insulating film or a complex insulating film which is a combination of a plurality of insulating films. Although an insulating film included in the first fin separation insulating portion FS11 and the plurality of second fin separation insulating portions FS12 may include a silicon oxide film, a silicon nitride film, a SiOCN film, a SiCN film, or a combination thereof, inventive concepts are not limited thereto. In some example embodiments, at least some of the first fin separation insulating portion FS11 and the plurality of second fin separation insulating portions FS12 may include an air gap.

The integrated circuit device 100 illustrated in FIGS. 1 to 2D includes a first fin separation region FSA1 including a combination of the first fin separation insulating portion FS11 and the plurality of second fin separation insulating portions FS12 on the first device region RX1, and includes a second fin separation region FSA2 including the plurality of second fin separation insulating portions FS12 on the second device region RX2. When the integrated circuit device 100 includes transistors having different types of channels from each other in the first device region RX1 as opposed to the second device region RX2, the integrated circuit device 100 may include fin separation regions having different structures and different combinations from each other in the first device region RX1 and the second device region RX2, and thus, carrier mobility may independently improve according to a conductive type of each channel region in the first device region RX1 and the second device region RX2 including channel regions of different conductive types from each other. As describe above, the first fin separation region FSA1 or the second fin separation region FSA2 may be provided by using an optimum or improved combination of the first fin separation insulating portion FS11 and the plurality of second fin separation insulating portions FS12 according to a channel type of transistors included in each of the first device region RX1 and the second device region RX2 of the integrated circuit device 100. Thus, while a stable isolation region may be provided between transistors included in the integrated circuit device 100, optimum or improved performance may be provided according to a channel type of each of the transistors, and reliability of an integrated circuit device may be improved.

Figure 3A:
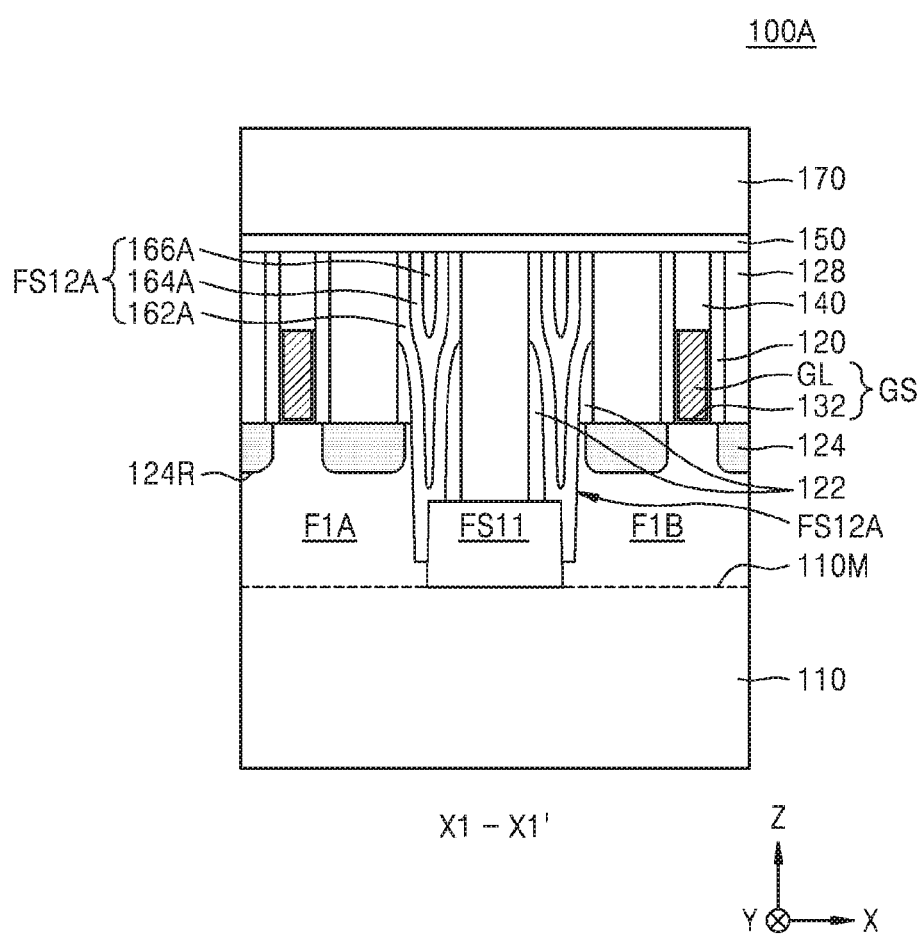
FIG. 3A is a cross-sectional view for explaining an integrated circuit device according to some example embodiments.

FIG. 3A is a cross-sectional view for explaining an integrated circuit device 100A according to some example embodiments and is a cross-sectional view of a portion corresponding to a cross-section taken long line X1-X1' of FIG. 1. In FIG. 3A, elements that are the same as those in FIGS. 1 to 2D are designated by the same reference numerals, and a repeated description thereof is omitted below.

Referring to FIG. 3A, the integrated circuit device 100A may have substantially the same configurations as the integrated circuit device 100 illustrated in FIGS. 1 to 2D. However, the integrated circuit device 100A includes a plurality of second fin separation insulating portions FS12A instead of the plurality of second fin separation insulating portions FS12.

The plurality of second fin separation insulating portions FS12A may each have a multiple layer structure in which a first insulating film 162A, a second insulating film 164A, and a third insulating film 166A are stacked in this stated order.

On the first device region RX1 (refer to FIG. 1), the first insulating film 162A may contact the first fin separation insulating portion FS11. The first insulating film 162A may have a different composition from the first fin separation insulating portion FS11. In some example embodiments, the first fin separation insulating portion FS11 may include a silicon oxide film, and the first insulating film 162A may include a silicon nitride film. The first insulating film 162A may cover side walls of the first fin-type active regions F1A and F1B, side walls of the plurality of second insulating spacers 122, and a side wall of the inter-gate insulating film 128. In some example embodiments, the first insulating film 162A may be formed by atomic layer deposition (ALD) processes.

The second insulating film 164A and the third insulating film 166A may include silicon oxide films formed by different deposition methods from each other. For example, the second insulating film 164A may be or may include a film formed by ALD processes, and the third insulating film 166A may be or may include a film formed by chemical vapor deposition (CVD) processes, such as a plasma enhanced chemical vapor deposition (PECVD) process. In the plurality of second fin separation insulating portions FS12A, a portion in a space between a pair of first fin-type active regions F1A and F1B may include the first insulating film 162A and the second insulating film 164A, and a portion that is at a vertical level higher than that of the pair of first fin-type active regions F1A and F1B may include the first insulating film 162A, the second insulating film 164A, and the third insulating film 166A. Detailed configurations of the plurality of second fin separation insulating portions FS12A are substantially the same as those of the plurality of second fin separation insulating portions FS12 described above with reference to FIGS. 1 to 2D.

Figure 3B:
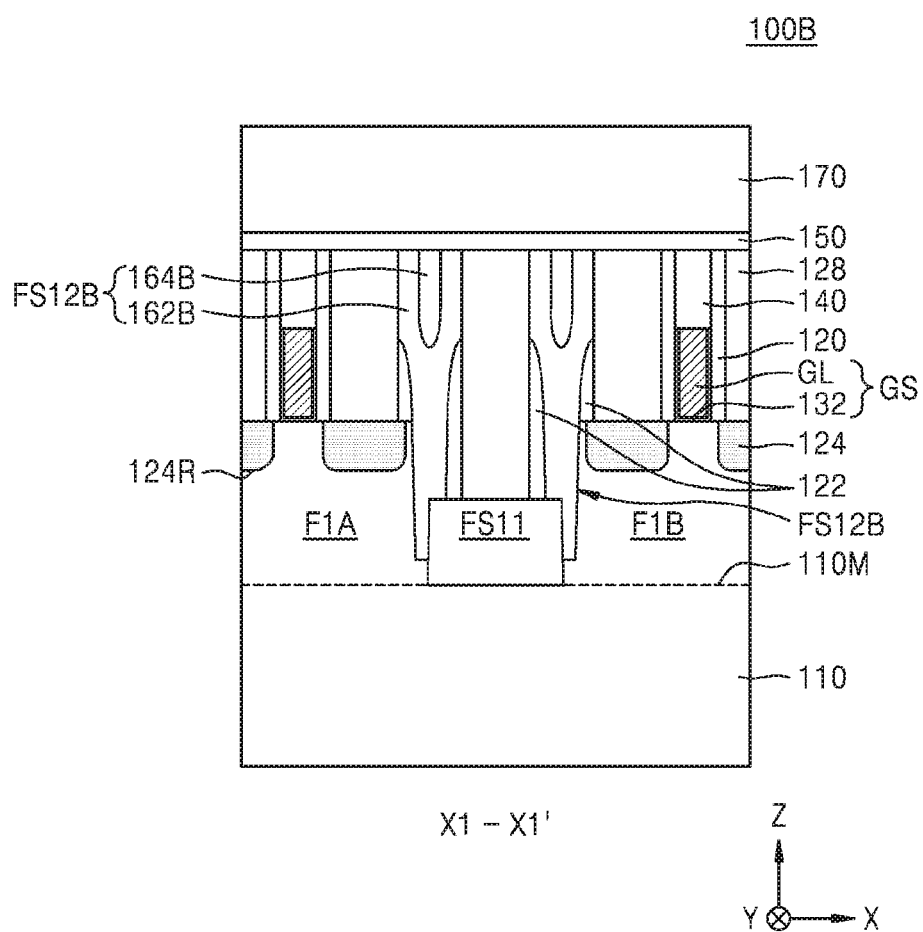
FIG. 3B is a cross-sectional view for explaining an integrated circuit device according to some example embodiments.

FIG. 3B is a cross-sectional view for explaining an integrated circuit device 100B according to some example embodiments and is a cross-sectional view of a portion corresponding to a cross section taken long line X1-X1' of FIG. 1. In FIG. 3B, elements that are the same as those in FIGS. 1 to 2D are designated by the same reference numerals, and a repeated description thereof is omitted below.

Referring to FIG. 3B, the integrated circuit device 100B may have substantially the same configurations as the integrated circuit device 100 illustrated in FIGS. 1 to 2D. However, the integrated circuit device 100B includes a plurality of second fin separation insulating portions FS12B instead of the plurality of second fin separation insulating portions FS12.

The plurality of second fin separation insulating portions FS12B may each have a multiple layer structure in which a first insulating film 162B and a second insulating film 164B are stacked in this stated order.

On the first device region RX1, first insulating films 162B of the plurality of second fin separation insulating portions FS12B may contact the first fin separation insulating portion FS11. The first insulating film 162B may have a different composition from the first fin separation insulating portion FS11. In some example embodiments, the first fin separation insulating portion FS11 may include a silicon oxide film, and the first insulating film 162B contacting the first fin separation insulating portion FS11 may include a silicon nitride film. The first insulating film 162B may be formed by ALD processes. The second insulating film 164B may include a silicon oxide film. The second insulating film 164B may include a silicon oxide film formed by CVD processes, e.g. PECVD processes. In the plurality of second fin separation insulating portions FS12B, a portion in a space between a pair of first fin-type active regions F1A and F1B may include the first insulating film 162B, and a portion that is at a vertical level higher than that of the pair of first fin-type active regions F1A and F1B may include the first insulating film 162B and the second insulating film 164B. Detailed configurations of the plurality of second fin separation insulating portions FS12B are substantially the same as those of the plurality of second fin separation insulating portions FS12 described above with reference to FIGS. 1 to 2D.

Figure 4A:
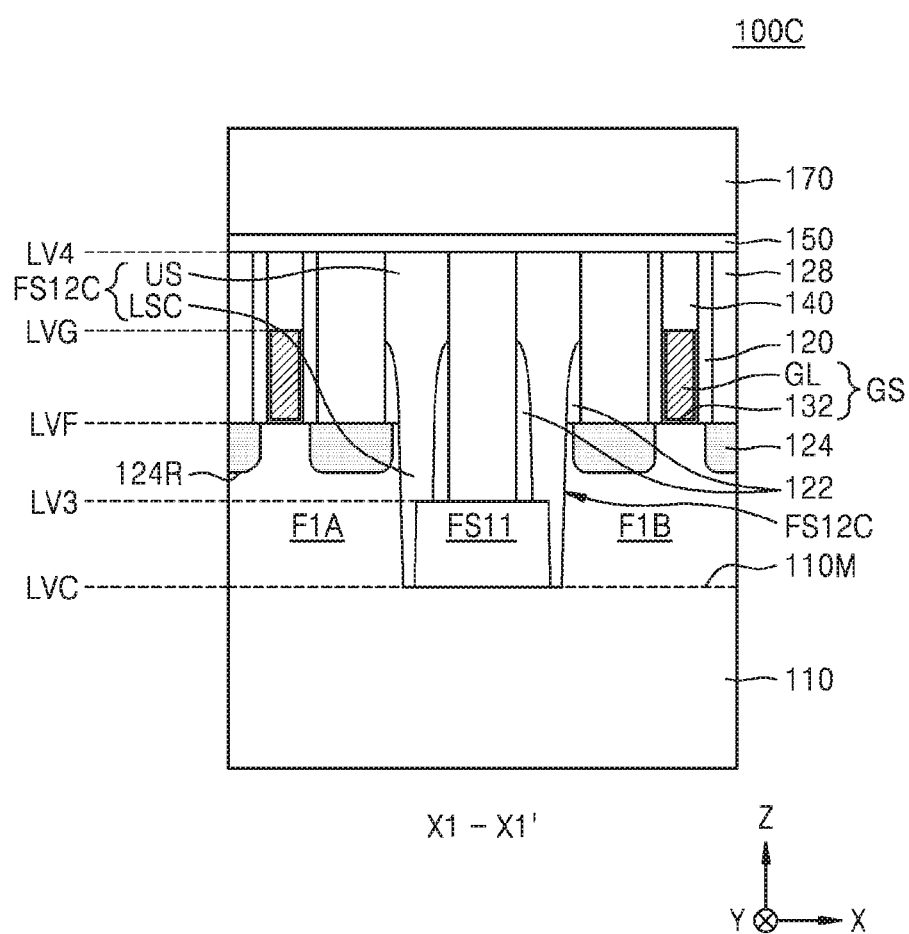
FIGS. 4A and 4B are cross-sectional views for explaining an integrated circuit device according to some example embodiments.
Figure 4B:
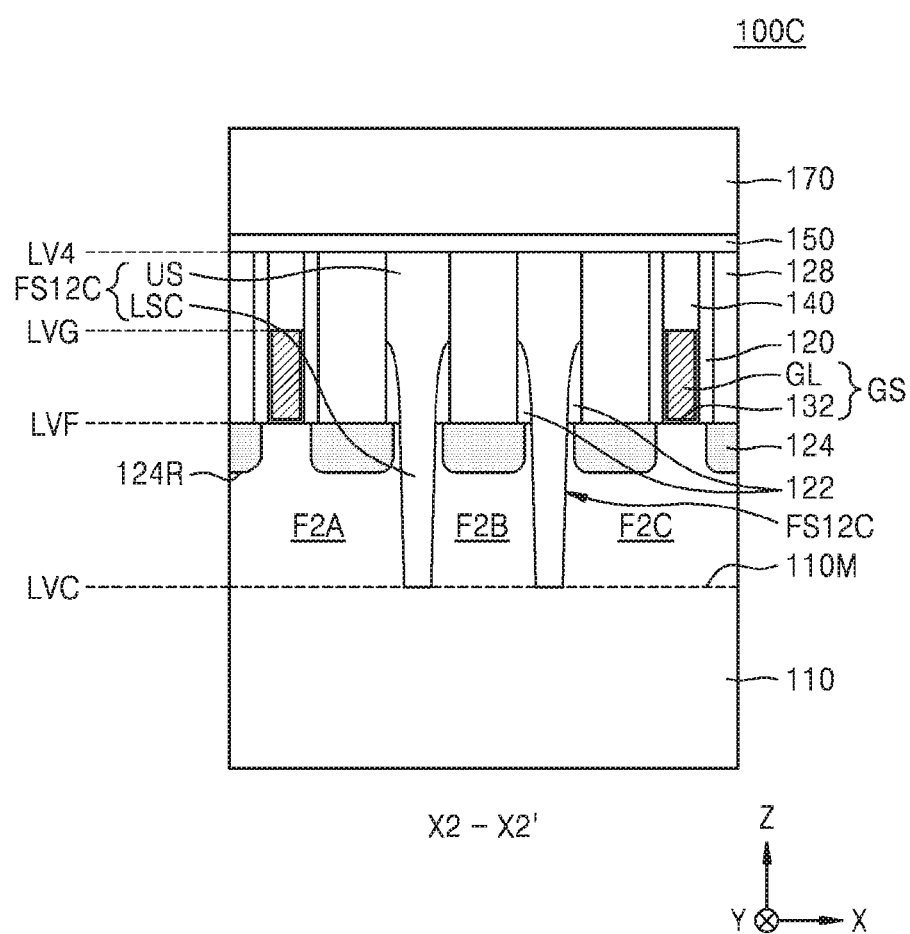

FIGS. 4A and 4B are cross-sectional views for explaining an integrated circuit device 100C according to some example embodiments. FIG. 4A is a cross-sectional view of a portion corresponding to a cross section taken long line X1-X1' of FIG. 1, and FIG. 4B is a cross-sectional view of a portion corresponding to a cross section taken long line X2-X2' of FIG. 1. In FIGS. 4A and 4B, elements that are the same as those in FIGS. 1 to 2D are designated by the same reference numerals, and a repeated description thereof is omitted below.

Referring to FIGS. 4A and 4B, the integrated circuit device 100C may have substantially the same configurations as the integrated circuit device 100 illustrated in FIGS. 1 to 2D. However, the integrated circuit device 100C includes a plurality of second fin separation insulating portions FS12C instead of the plurality of second fin separation insulating portions FS12.

A lowermost surface vertical level LVC of the plurality of second fin separation insulating portions FS12C may be substantially the same as the vertical level LV1 (refer to FIGS. 2A and 2B) of the main surface 110M of the substrate 110. In some example embodiments, as illustrated in FIG. 2A, a vertical level of a lowermost surface of the first fin separation insulating portion FS11 may be substantially the same as the vertical level LV1 of the main surface 110M of the substrate 110. In this case, the lowermost surface vertical level LVC of the plurality of second fin separation insulating portions FS12C and the vertical level of the lowermost surface of the first fin separation insulating portion FS11 may be substantially the same as each other.

A second fin separation insulating portion FS12C may include the upper insulating portion US and a lower insulating portion LSC integrally connected to each other. Over the first device region RX1, the lower insulating portion LSC of the second fin separation insulating portion FS12C may be between a pair of first fin-type active regions F1A and F1B. Over the second device region RX2, the lower insulating portion LSC of the second fin separation insulating portion FS12C may be between a pair of second fin-type active regions F2A and F2B or between a pair of second fin-type active regions F2B and F2C. Detailed configurations of the plurality of second fin separation insulating portions FS12C are substantially the same as those of the plurality of second fin separation insulating portions FS12 described above with reference to FIGS. 1 to 2D.

Figure 5A:
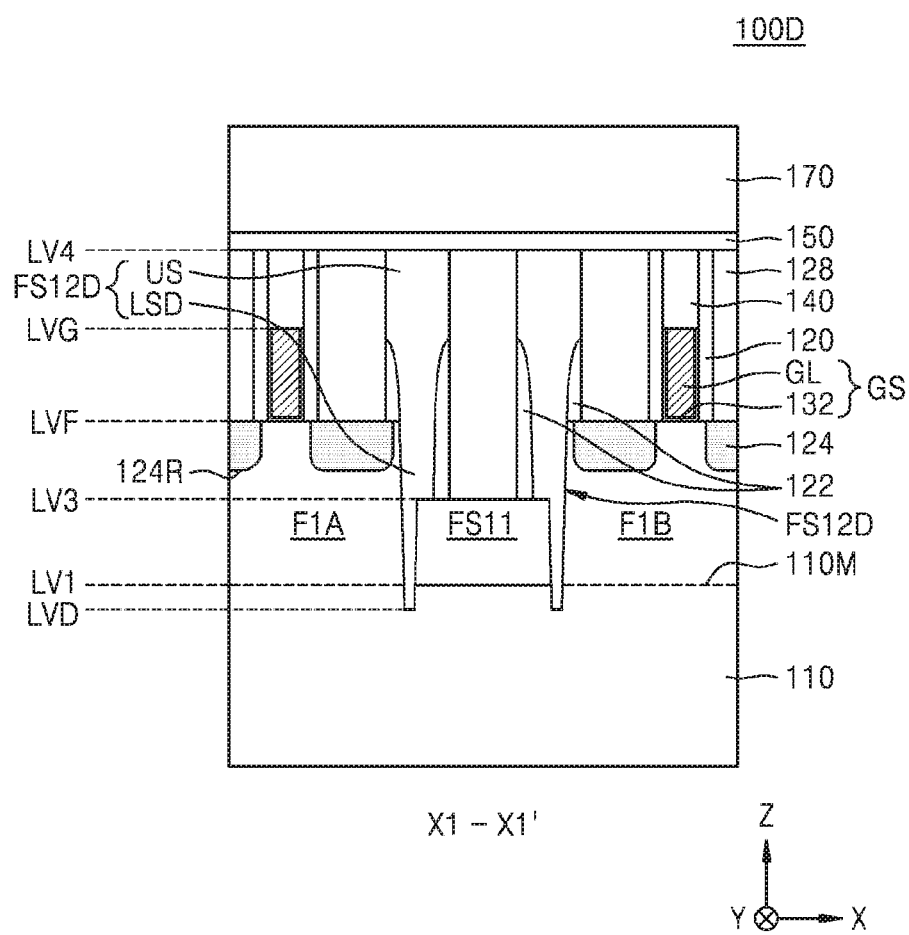
FIGS. 5A and 5B are cross-sectional views for explaining an integrated circuit device according to some example embodiments.
Figure 5B:
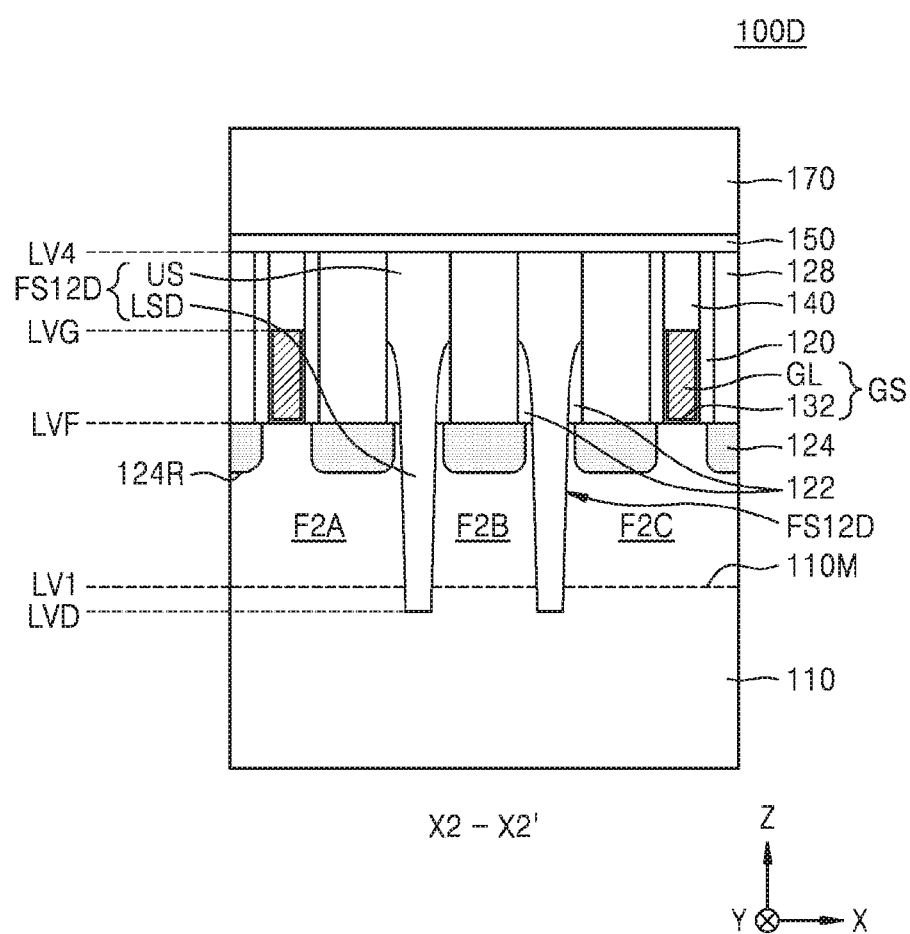

FIGS. 5A and 5B are cross-sectional views for explaining an integrated circuit device 100D according to some example embodiments. FIG. 5A is a cross-sectional view of a portion corresponding to a cross section taken long line X1-X1' of FIG. 1, and FIG. 5B is a cross-sectional view of a portion corresponding to a cross section taken long line X2-X2' of FIG. 1. In FIGS. 5A and 5B, elements that are the same as those in FIGS. 1 to 2D are designated by the same reference numerals, and a repeated description thereof is omitted below.

Referring to FIGS. 5A and 5B, the integrated circuit device 100D may have substantially the same configurations as the integrated circuit device 100 illustrated in FIGS. 1 to 2D. However, the integrated circuit device 100D includes a plurality of second fin separation insulating portions FS12D instead of the plurality of second fin separation insulating portions FS12.

A lowermost surface vertical level LVD of the plurality of second fin separation insulating portions FS12D may be lower than the vertical level LV1 of the main surface 110M of the substrate 110. In some example embodiments, a vertical level of a lowermost surface of the first fin separation insulating portion FS11 may be substantially the same as the vertical level LV1 of the main surface 110M of the substrate 110. In this case, the lowermost surface vertical level LVD of the plurality of second fin separation insulating portions FS12D may be lower than the vertical level of the lowermost surface of the first fin separation insulating portion FS11.

A second fin separation insulating portion FS12D may include the upper insulating portion US and a lower insulating portion LSD integrally connected to each other. Over the first device region RX1, the lower insulating portion LSD of the second fin separation insulating portion FS12D may be between a pair of first fin-type active regions F1A and F1B. Over the second device region RX2, the lower insulating portion LSD of the second fin separation insulating portion FS12D may be between a pair of second fin-type active regions F2A and F2B or between a pair of second fin-type active regions F2B and F2C. Detailed configurations of the plurality of second fin separation insulating portions FS12D are substantially the same as those of the plurality of second fin separation insulating portions FS12 described above with reference to FIGS. 1 to 2D.

Figure 6A:
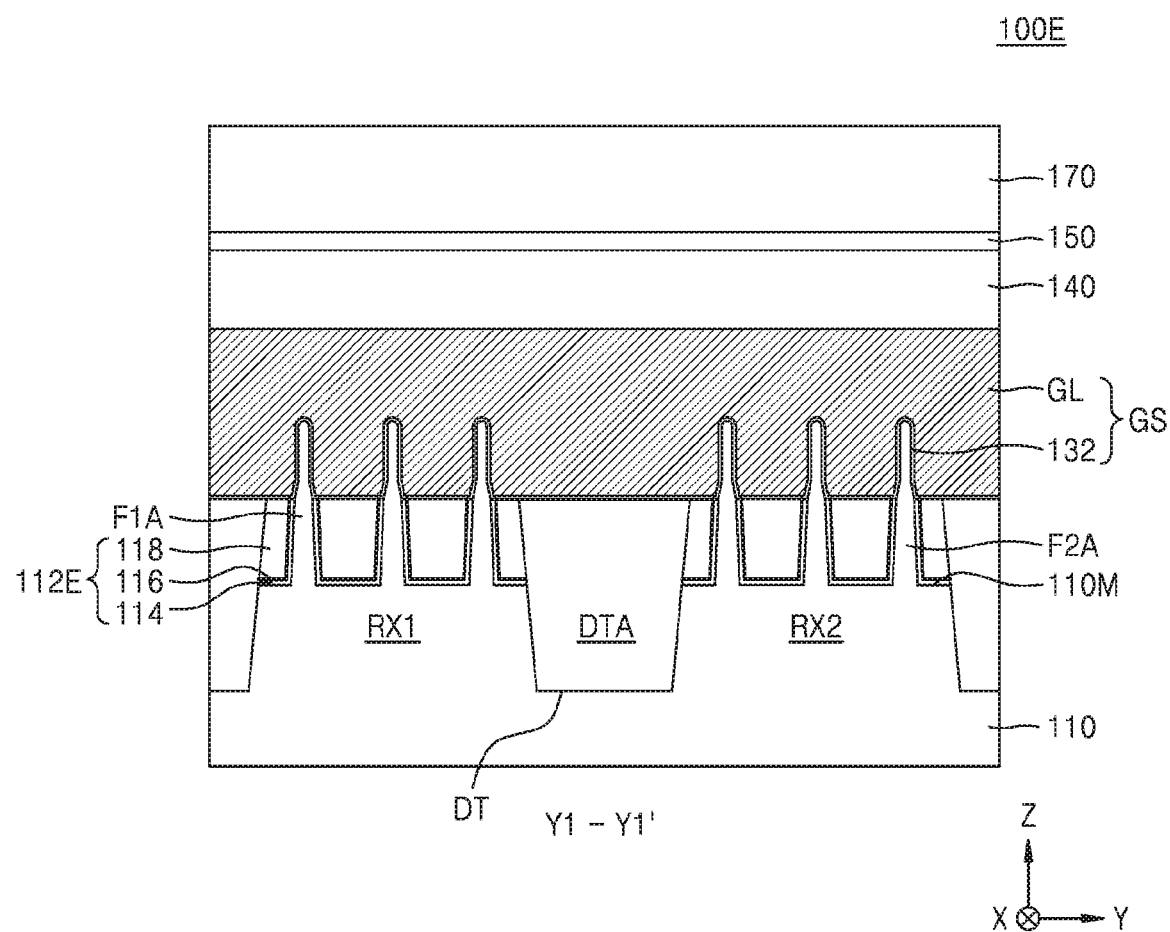
FIGS. 6A and 6B are cross-sectional views for explaining an integrated circuit device according to some example embodiments.
Figure 6B:
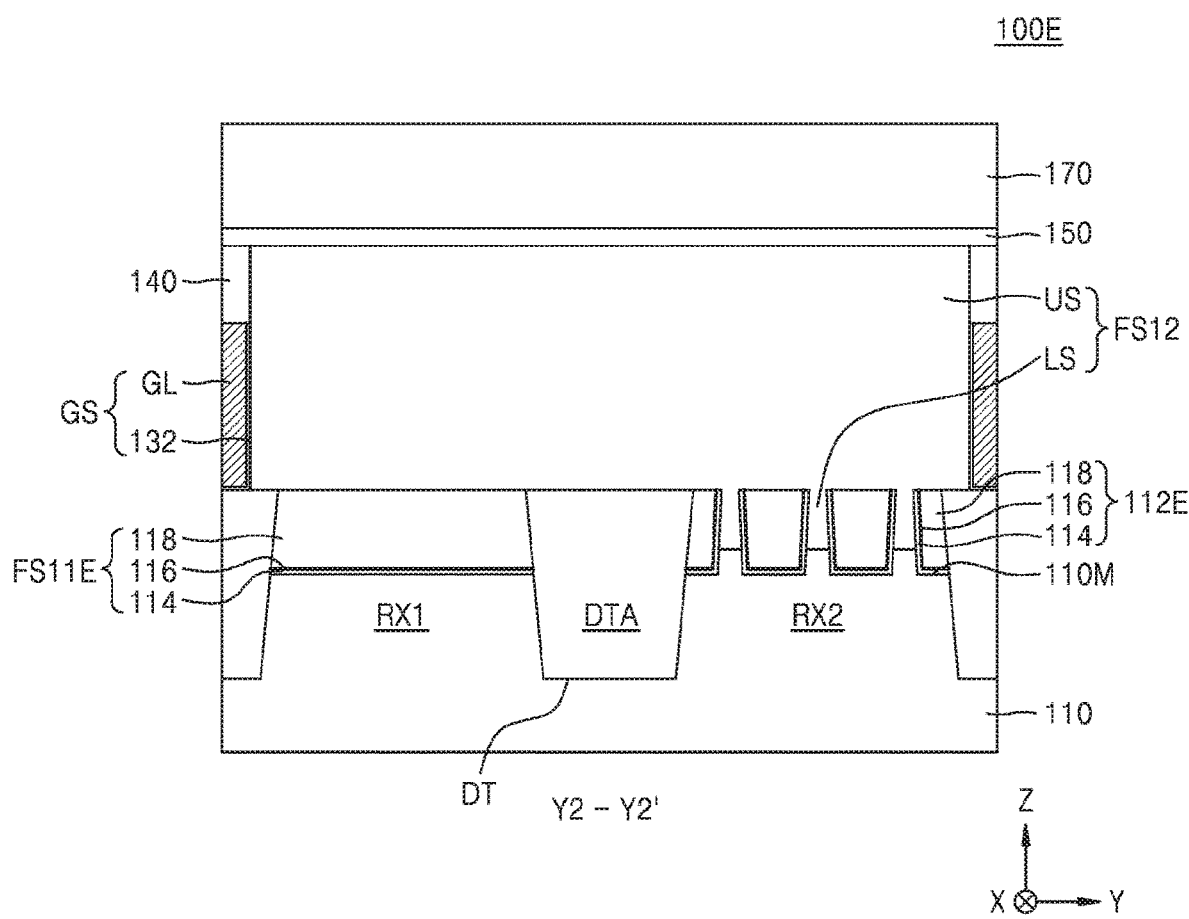

FIGS. 6A and 6B are cross-sectional views for explaining an integrated circuit device 100E according to some example embodiments. FIG. 6A is a cross-sectional view of a portion corresponding to a cross section taken long line Y1-Y1' of FIG. 1, and FIG. 6B is a cross-sectional view of a portion corresponding to a cross section taken long line Y2-Y2' of FIG. 1. In FIGS. 6A and 6B, elements that are the same as those in FIGS. 1 to 2D are designated by the same reference numerals, and a repeated description thereof is omitted below.

Referring to FIGS. 6A and 6B, the integrated circuit device 100E may have substantially the same configurations as the integrated circuit device 100 illustrated in FIGS. 1 to 2D. However, the integrated circuit device 100E includes a device isolation film 112E and a first fin separation insulating portion FS11E instead of the device isolation film 112 and the first fin separation insulating portion FS11.

The device isolation film 112E and the first fin separation insulating portion FS11E may each include a first insulating liner 114, a second insulating liner 116, and a buried insulating film 118 stacked on the substrate 110 in this stated order. The first insulating liner 114 and the second insulating liner 116 may cover respective lower side walls of the plurality of first fin-type active regions F1A and F1B and the plurality of second fin-type active regions F2A, F2B, and F2C. On the second insulating liner 116, the buried insulating film 118 may fill spaces between respective lower side walls of the plurality of first fin-type active regions F1A and F1B and the plurality of second fin-type active regions F2A, F2B, and F2C.

In some example embodiments, the first insulating liner 114 may include a first oxide film. The first oxide film may be obtained through deposition processes or may be obtained by thermally oxidizing respective surfaces of the plurality of first fin-type active regions F1A and F1B and the plurality of second fin-type active regions F2A, F2B, and F2C.

In some example embodiments, the second insulating liner 116 may be used as a stressor. A material that applies tensile stress or compressive stress to respective channel regions of the plurality of first fin-type active regions F1A and F1B, and the plurality of second fin-type active regions F2A, F2B, and F2C may be used to form the second insulating liner 116. For example, the second insulating liner 116 may include silicon nitride (SiN), silicon oxynitride (SiON), silicon boronitride (SiBN), silicon carbide (SiC), SiC:H, SiCN, SiCN:H, SiOCN, SiOCN:H, silicon oxycarbide (SiOC), polysilicon, or a combination thereof, but inventive concepts are not limited thereto. In some example embodiments, a portion of the second insulating liner 116 formed over the first device region RX1 and a portion of the second insulating liner 116 formed over the second device region RX2 may include different materials from each other, the materials selected from the above-described materials.

In some example embodiments, the buried insulating film 118 may include a second oxide film. The second oxide film may include a film formed by deposition processes or coating processes. For example, the second oxide film may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ), but inventive concepts are not limited thereto.

According to the disclosure, various fin separation regions may be provided by using various structures and combinations of the first fin separation insulating portion FS11 and the plurality of second fin separation insulating portions FS12 described above with reference to FIGS. 1 to 2D, the plurality of second fin separation insulating portions FS12A illustrated in FIG. 3A, the plurality of second fin separation insulating portions FS12B illustrated in FIG. 3B, the plurality of second fin separation insulating portions FS12C illustrated in FIGS. 4A and 4B, the plurality of second fin separation insulating portions FS12D illustrated in FIGS. 5A and 5B, the first fin separation insulating portion FS11E illustrated in FIGS. 6A and 6B, and first and second fin separation insulating portions variously modified and changed therefrom within the scope of the disclosure. Accordingly, when transistors including channel regions of different conductive types from each other in the first device region RX1 and the second device region RX2 are included, carrier mobility may be finely controlled according to a channel type of each of the transistors, and reliability of an integrated circuit device may be improved.

FIGS. 7A to 17D are cross-sectional views according to a process sequence, for explaining a method of manufacturing an integrated circuit device, according to some example embodiments.

Figure 7A:
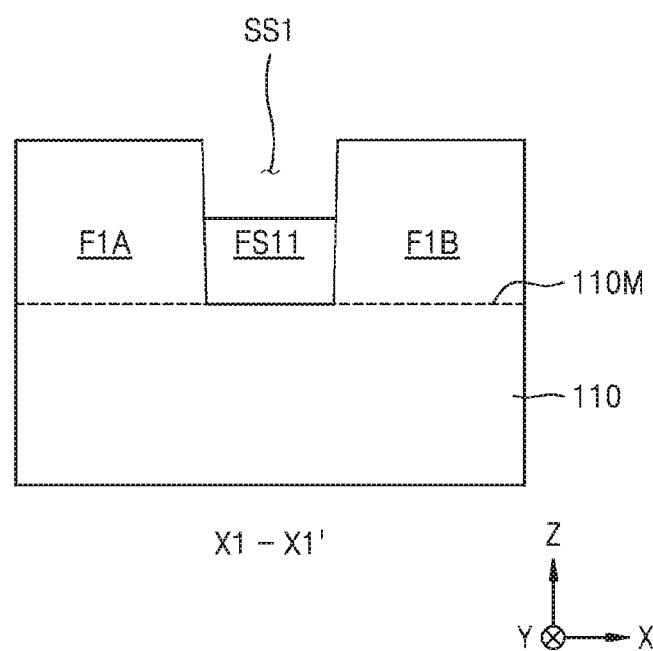
Figure 7B:
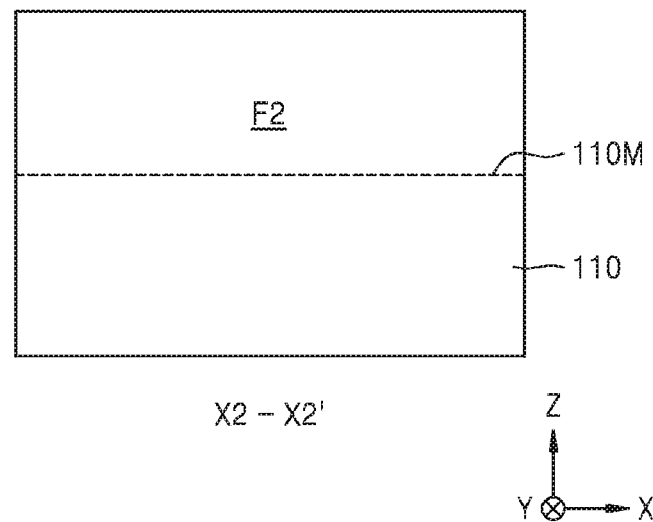
Figure 7C:
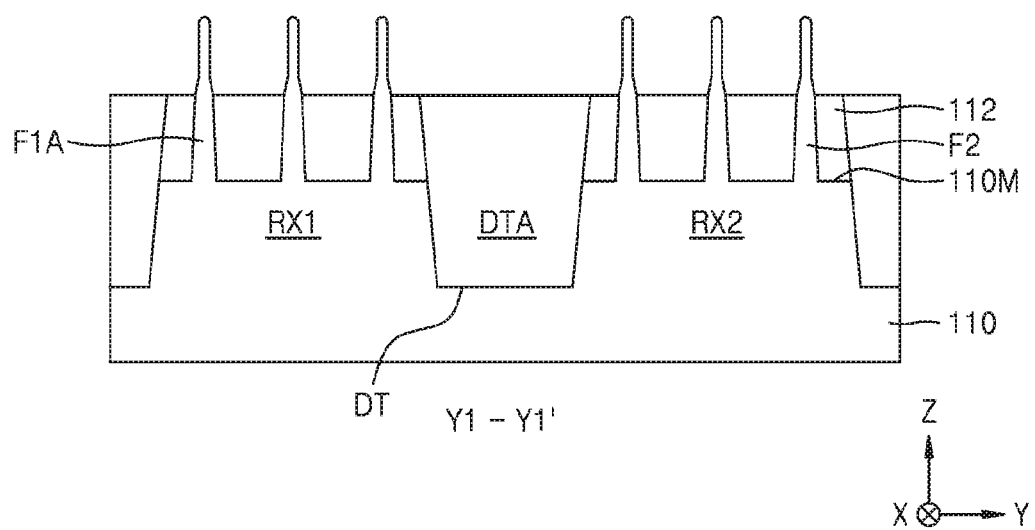
Figure 7D:
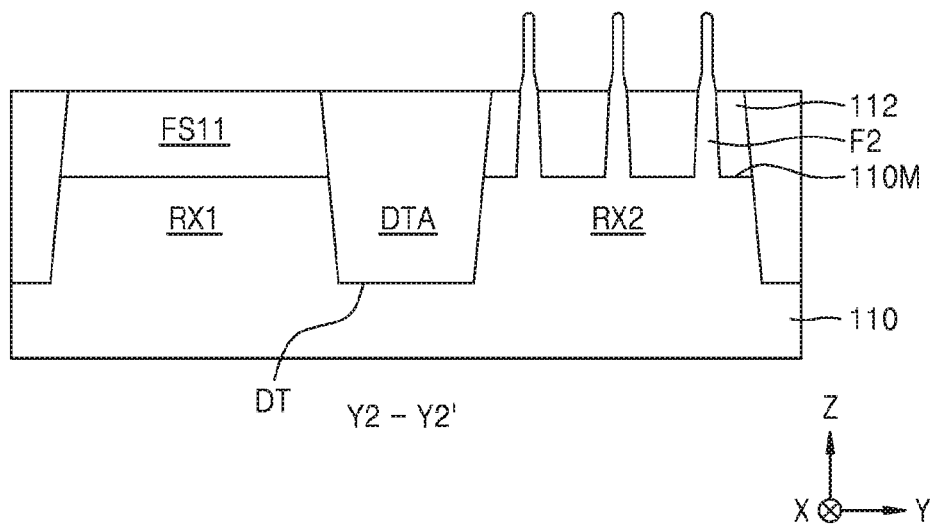
Figure 8A:
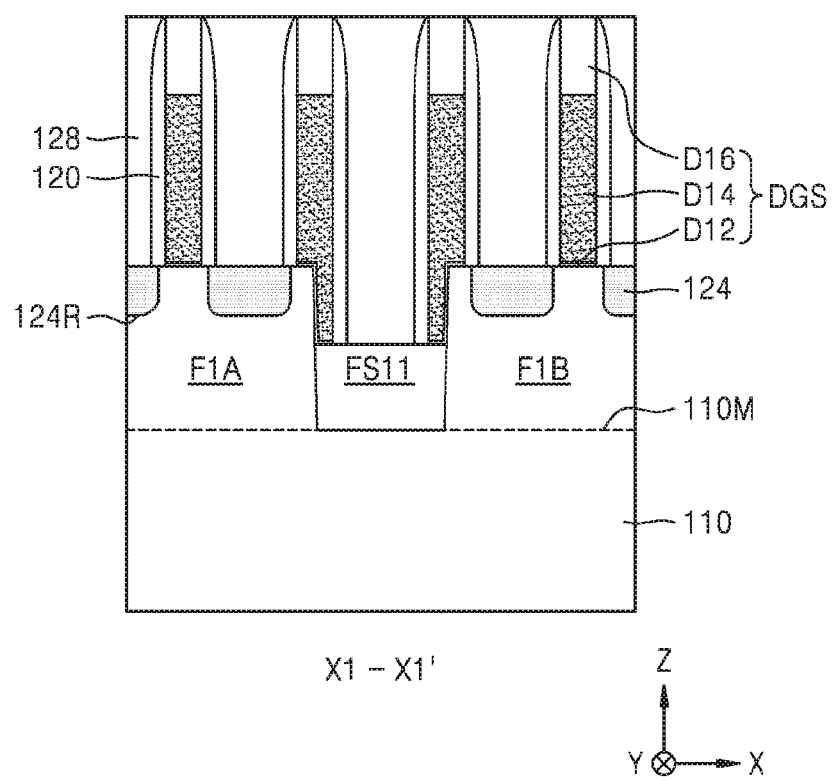
Figure 8B:
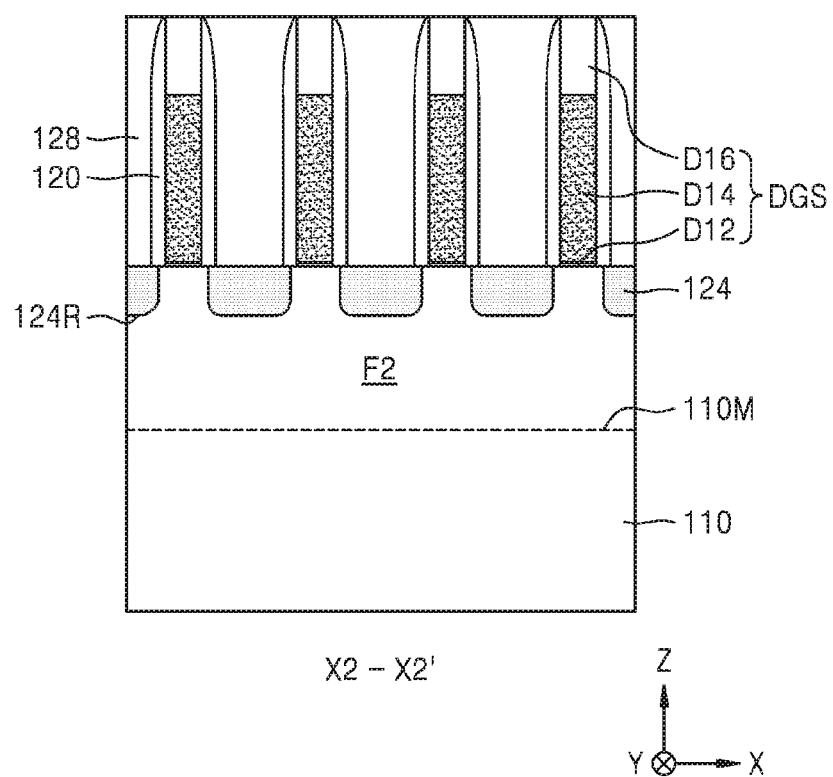
Figure 8C:
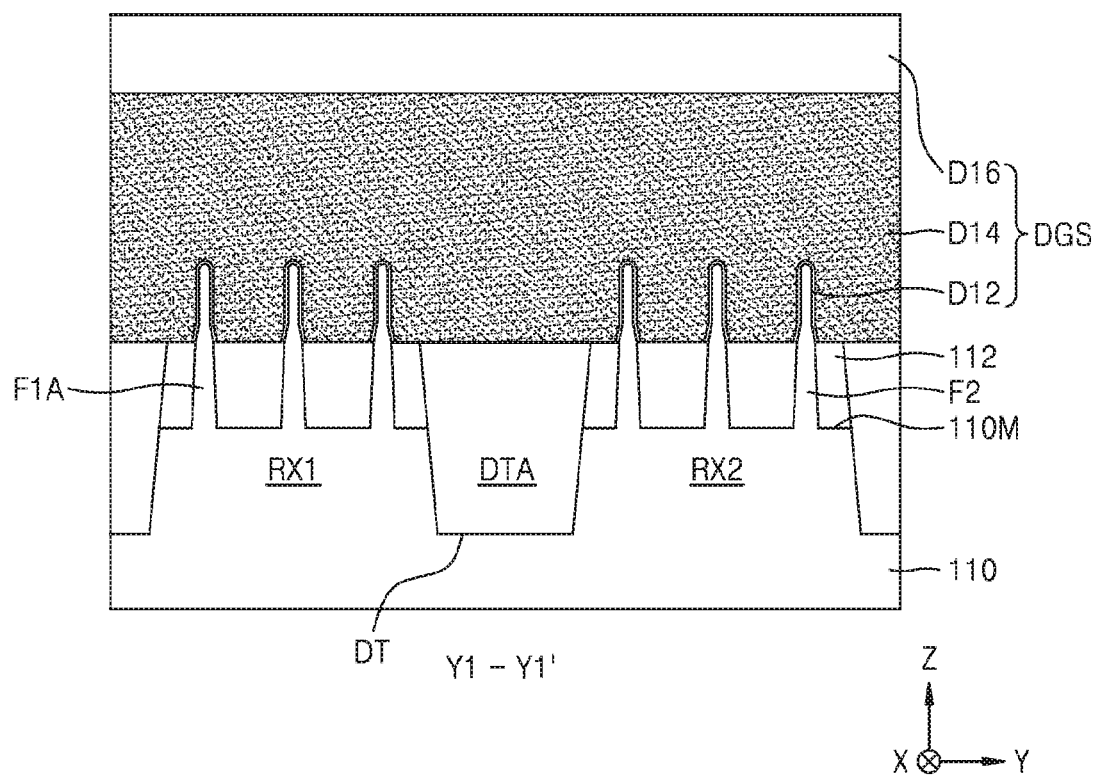
Figure 8D:
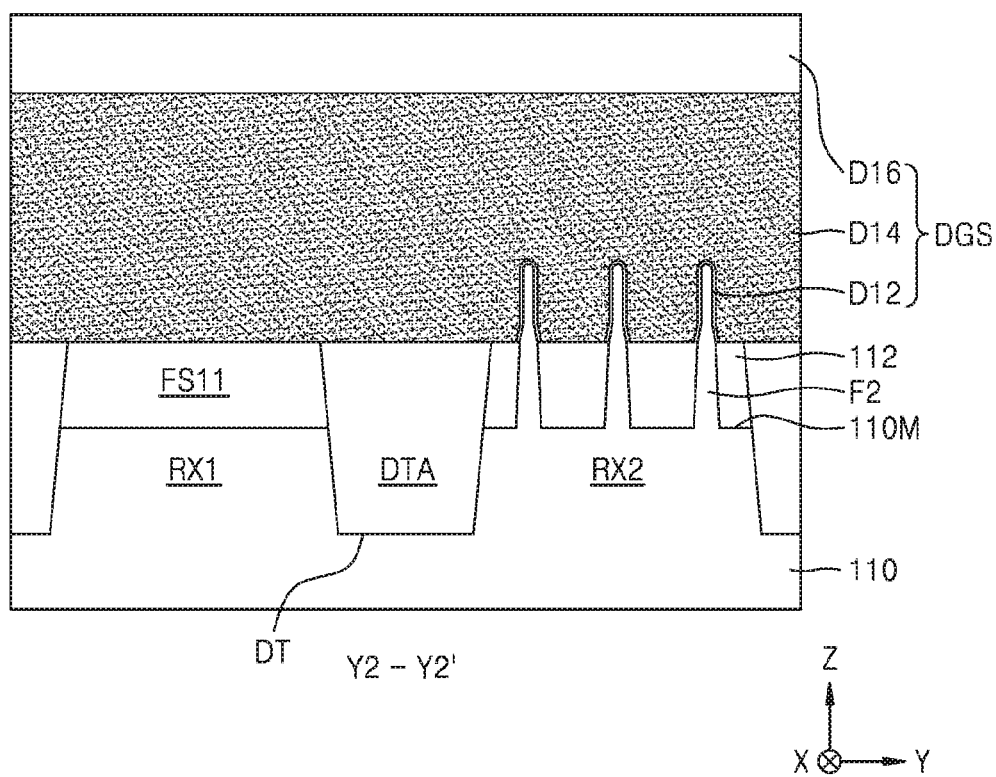
Figure 9A:
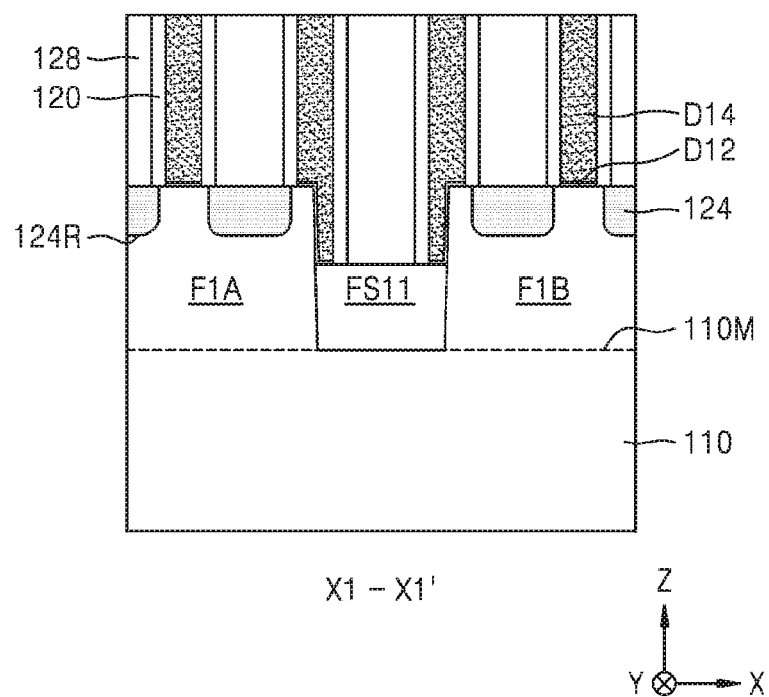
Figure 9B:
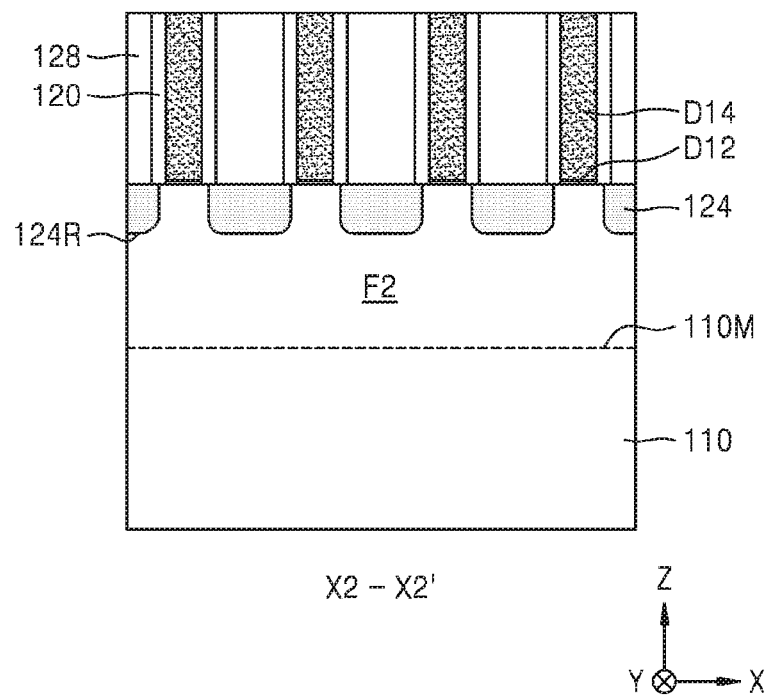
Figure 9C:
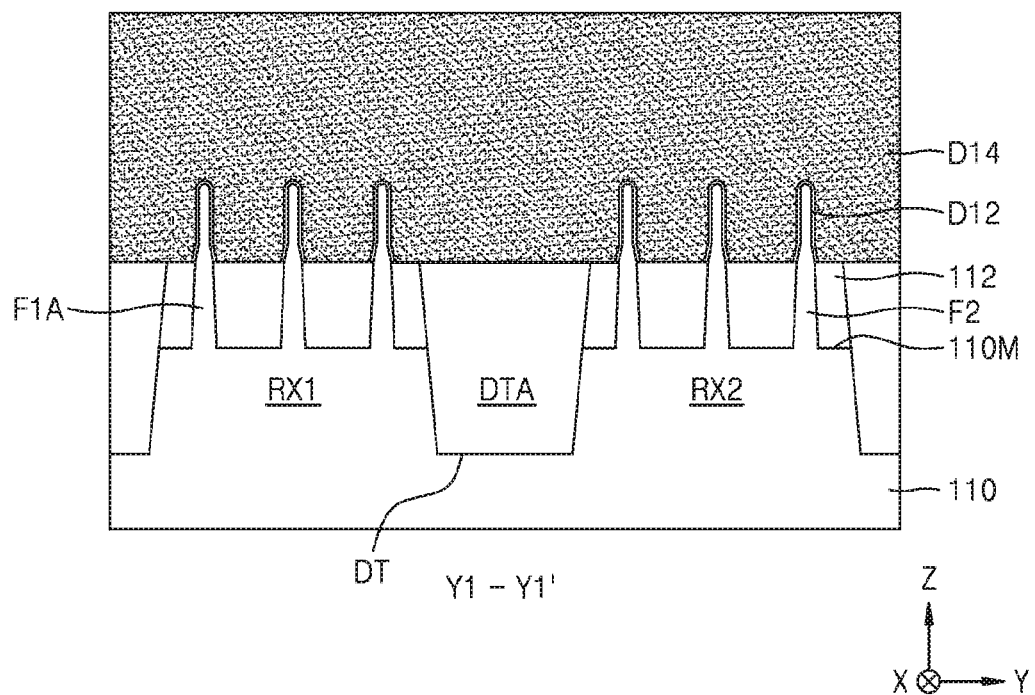
Figure 9D:
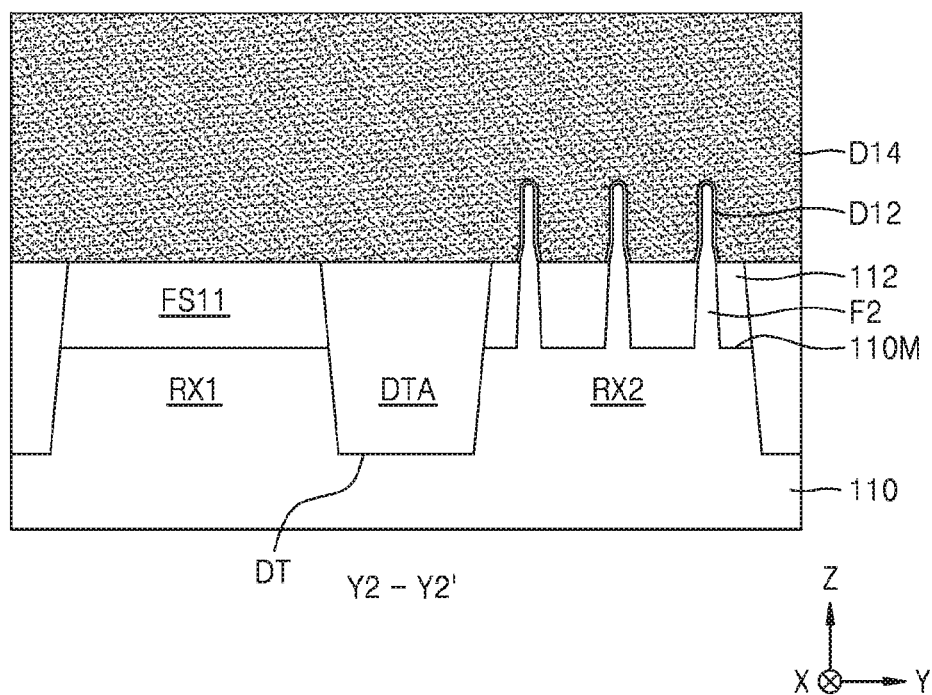
Figure 10A:
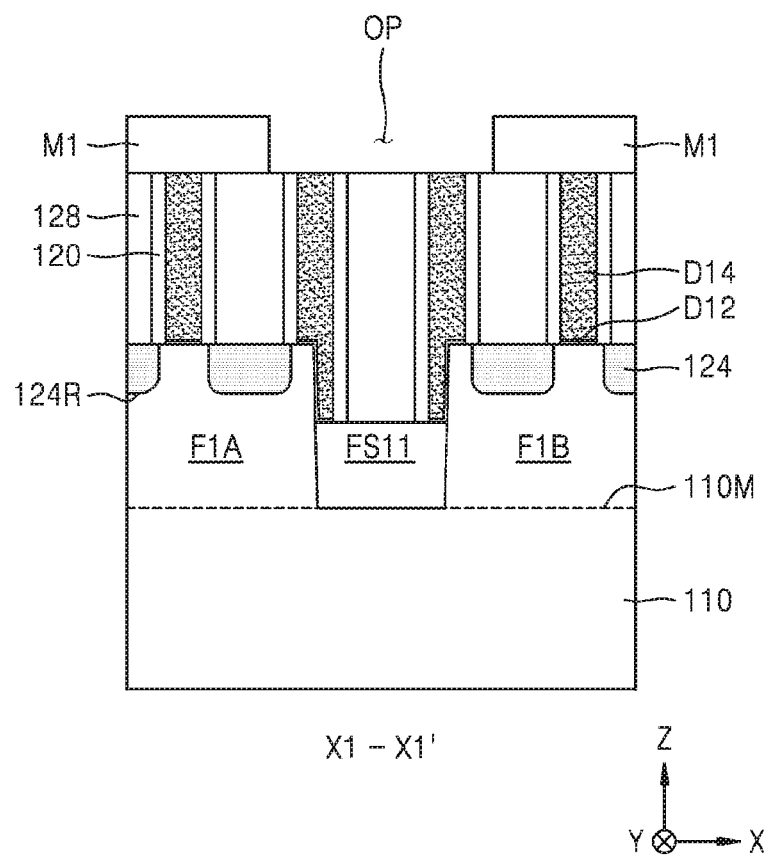
Figure 10B:
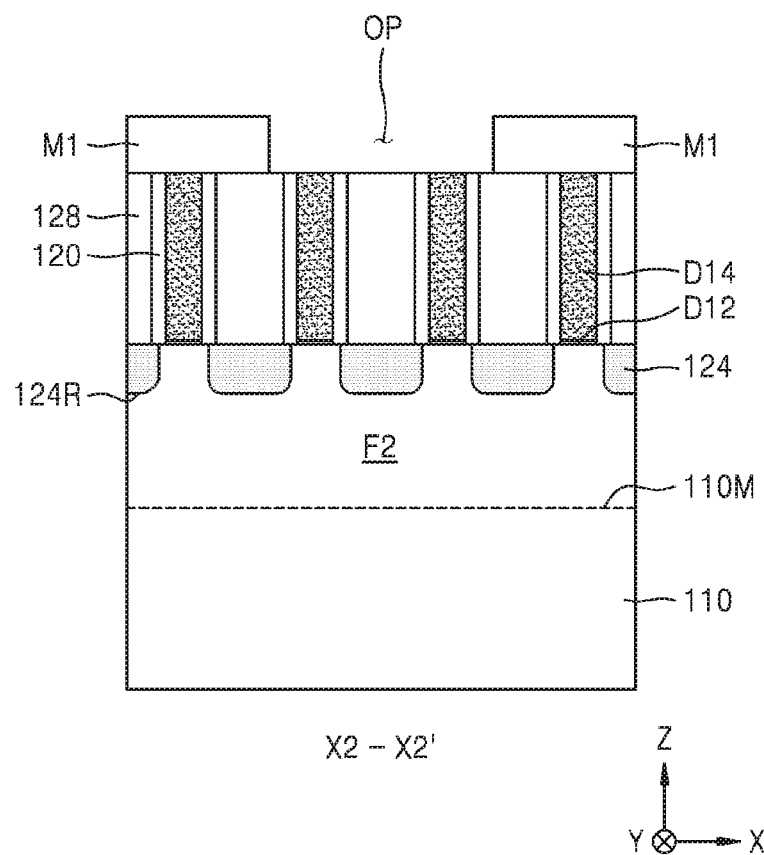
Figure 10C:
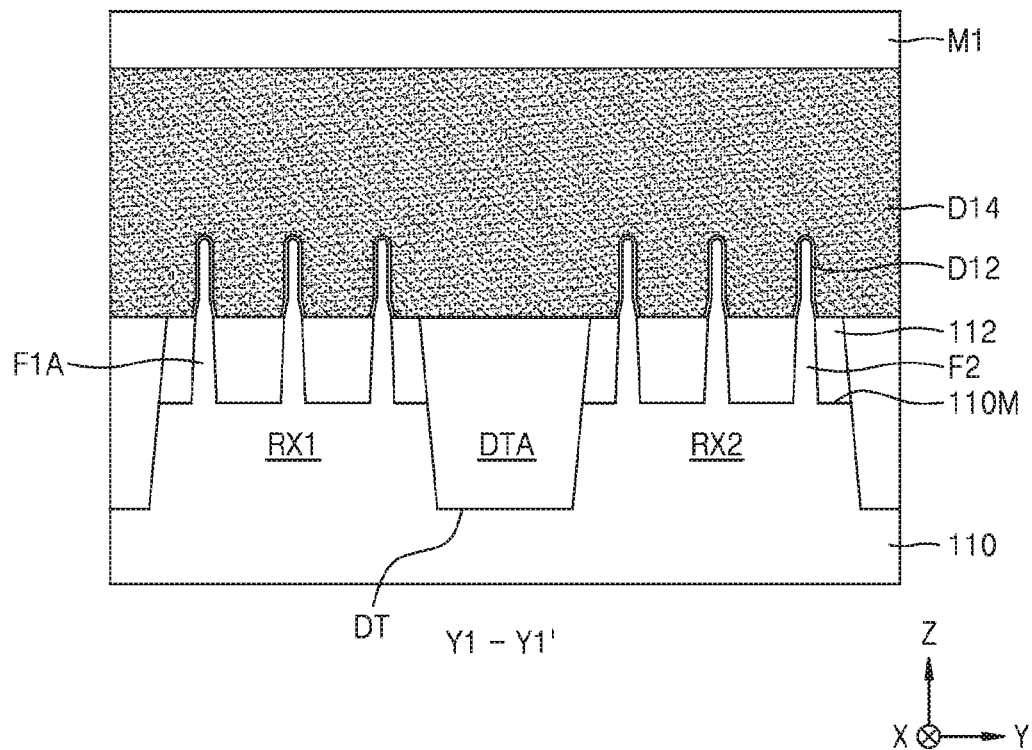
Figure 10D:
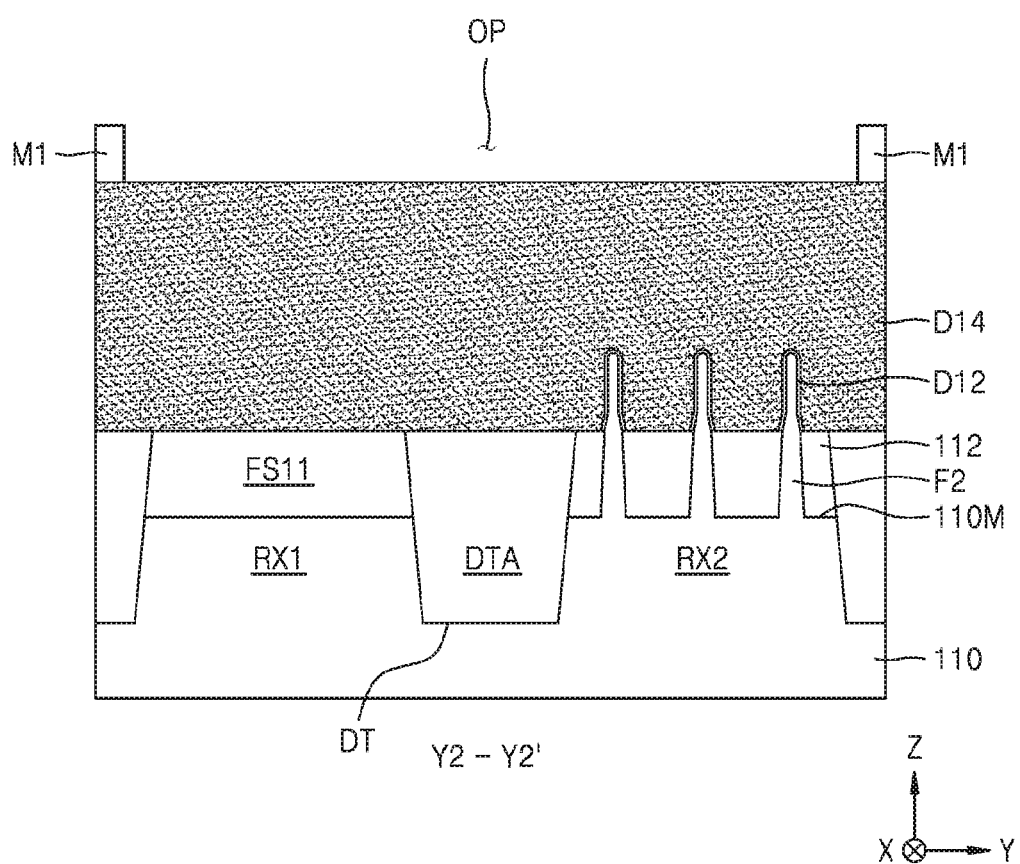
Figure 11A:
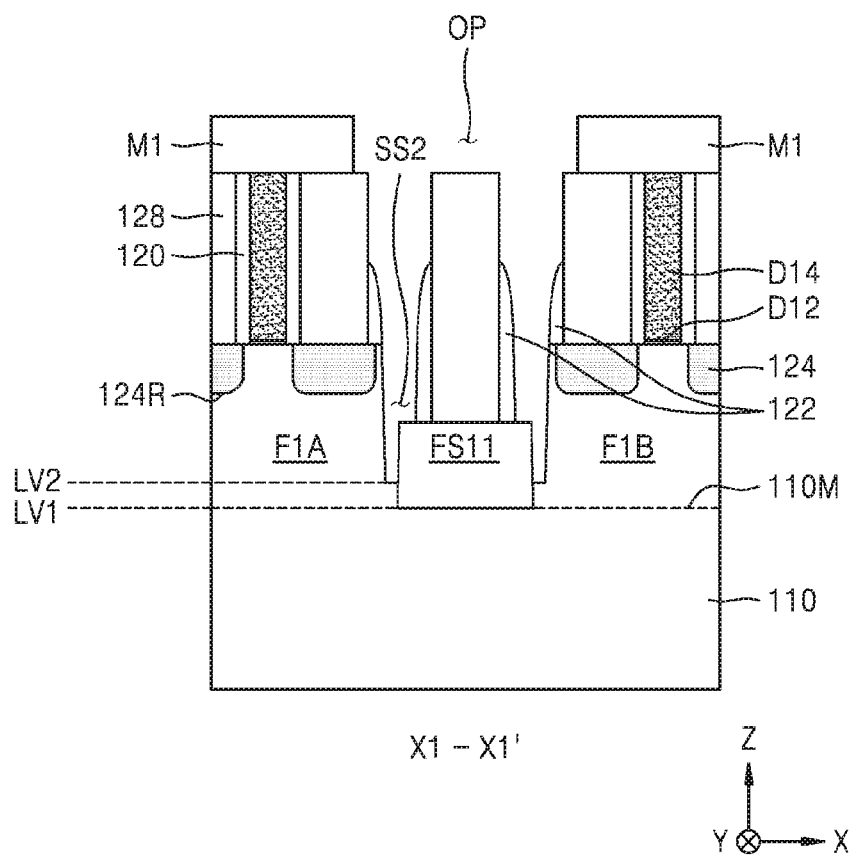
Figure 11B:
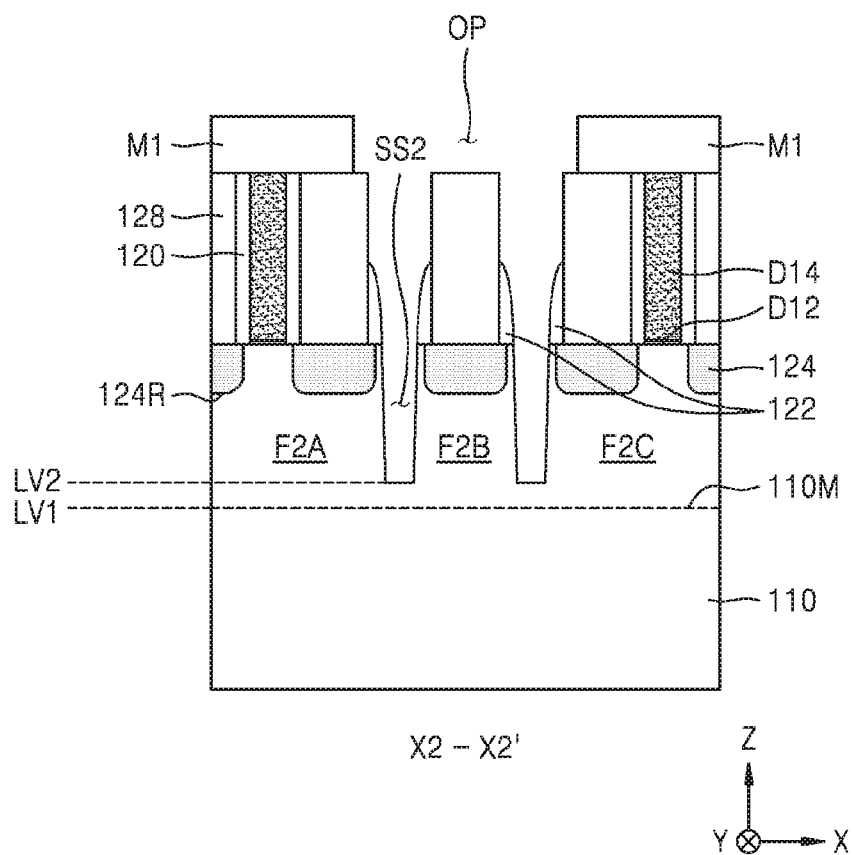
Figure 11C:
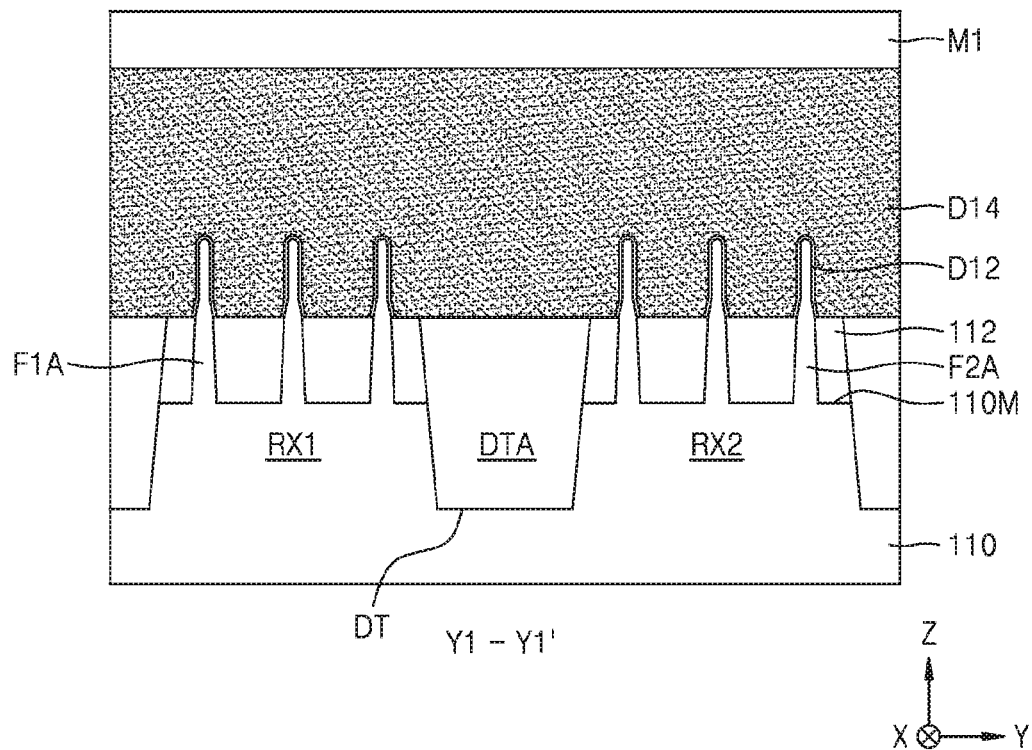
Figure 11D:
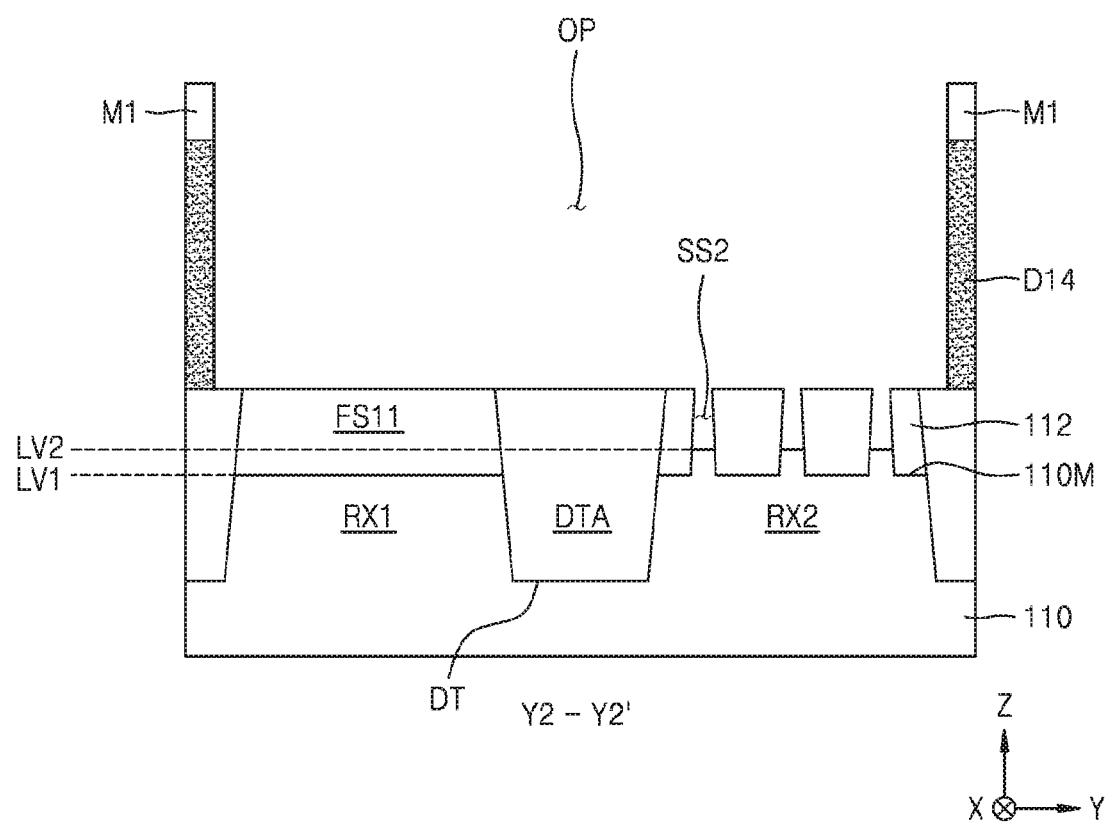
Figure 12A:
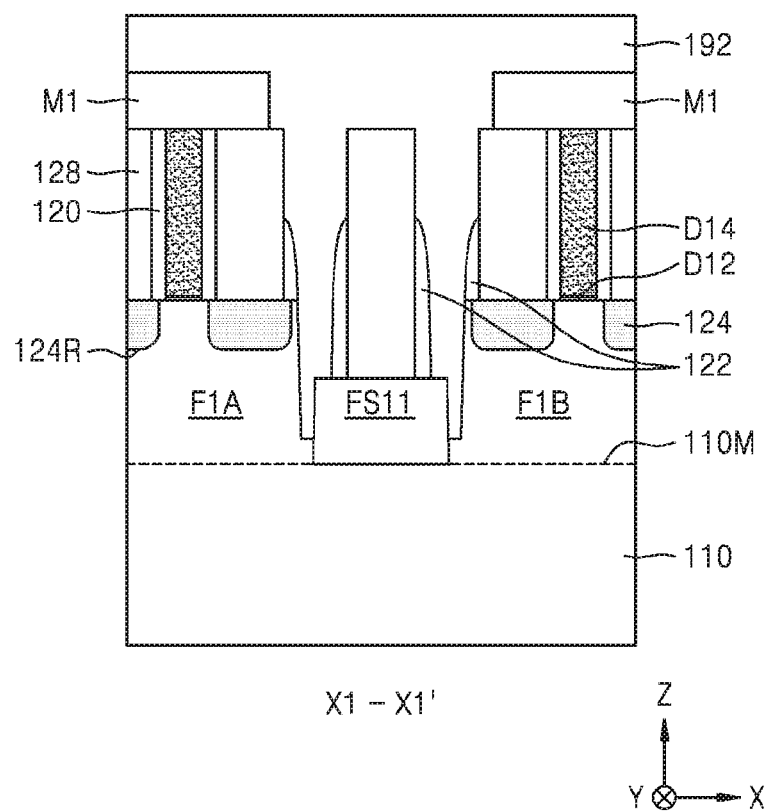
Figure 12B:
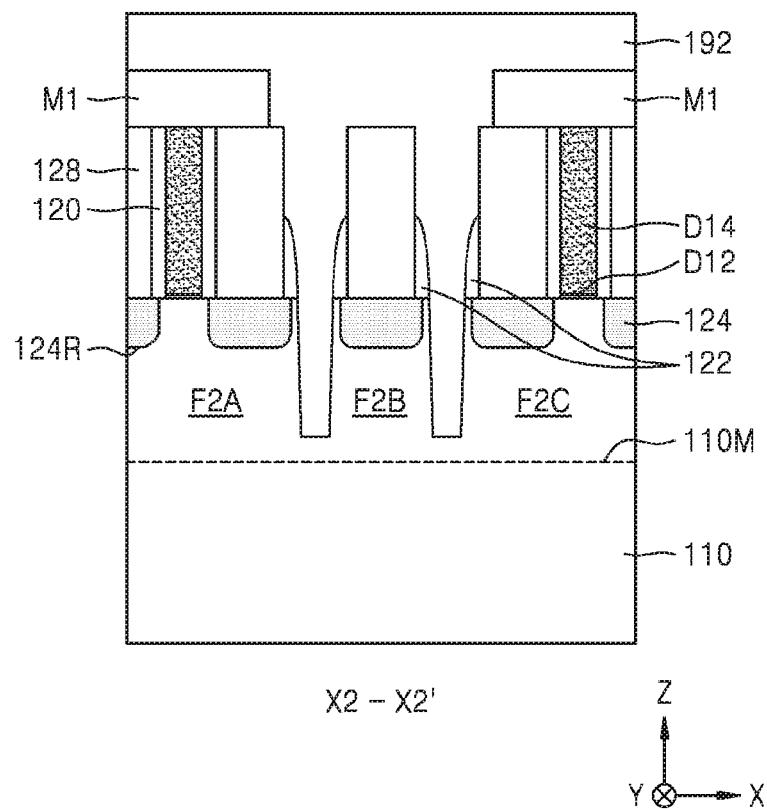
Figure 12C:
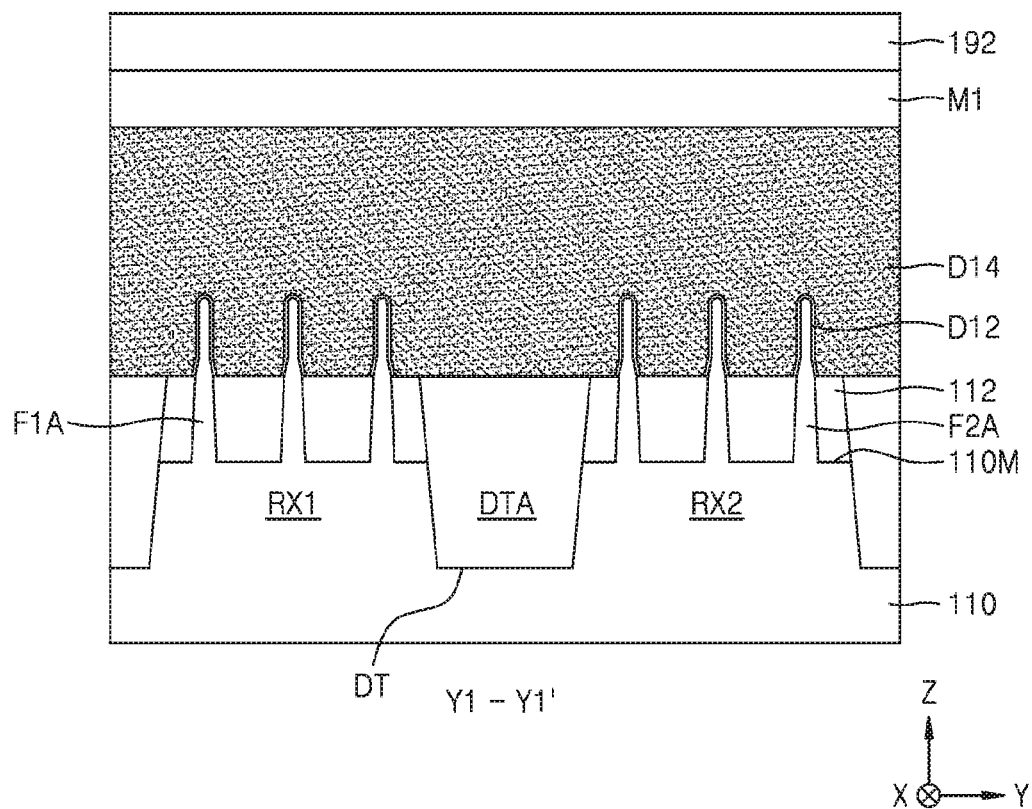
Figure 12D:
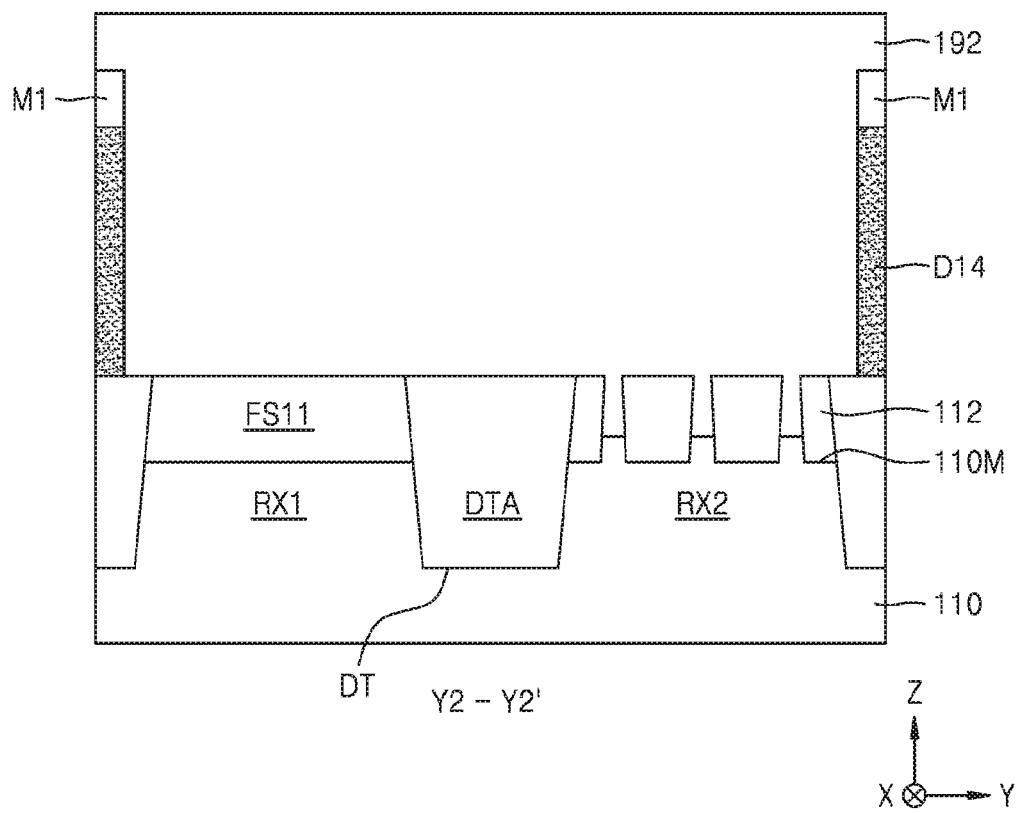
Figure 13A:
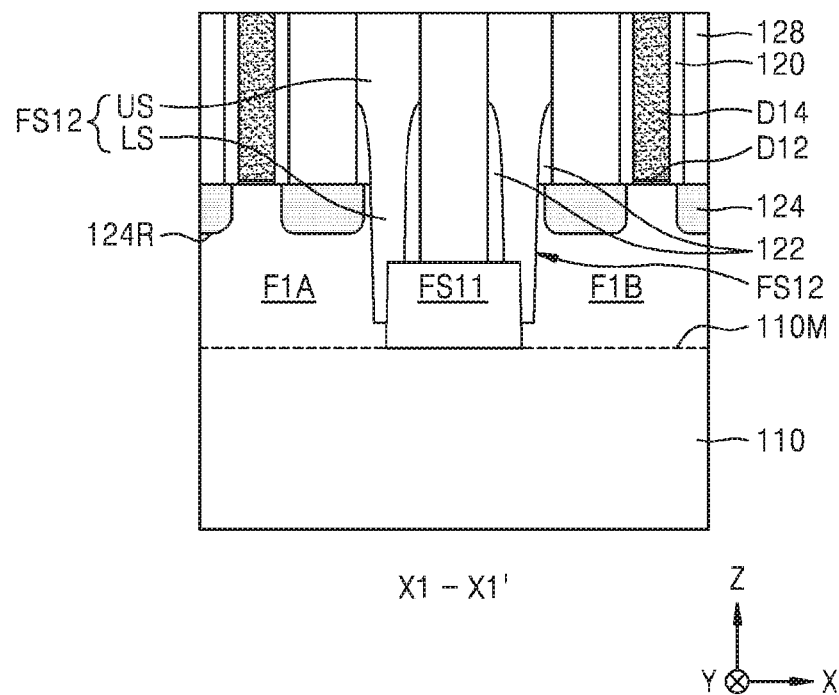
Figure 13B:
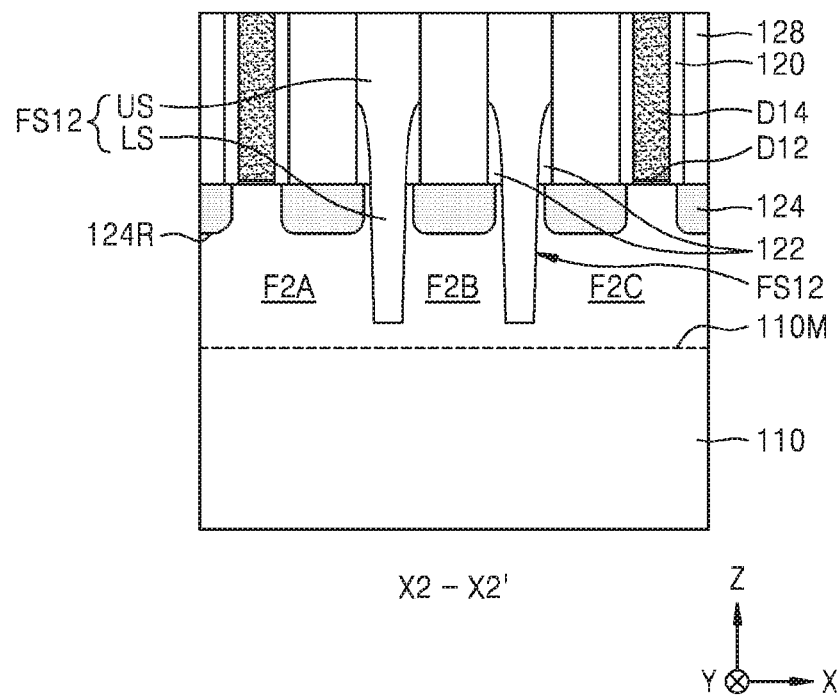
Figure 13C:
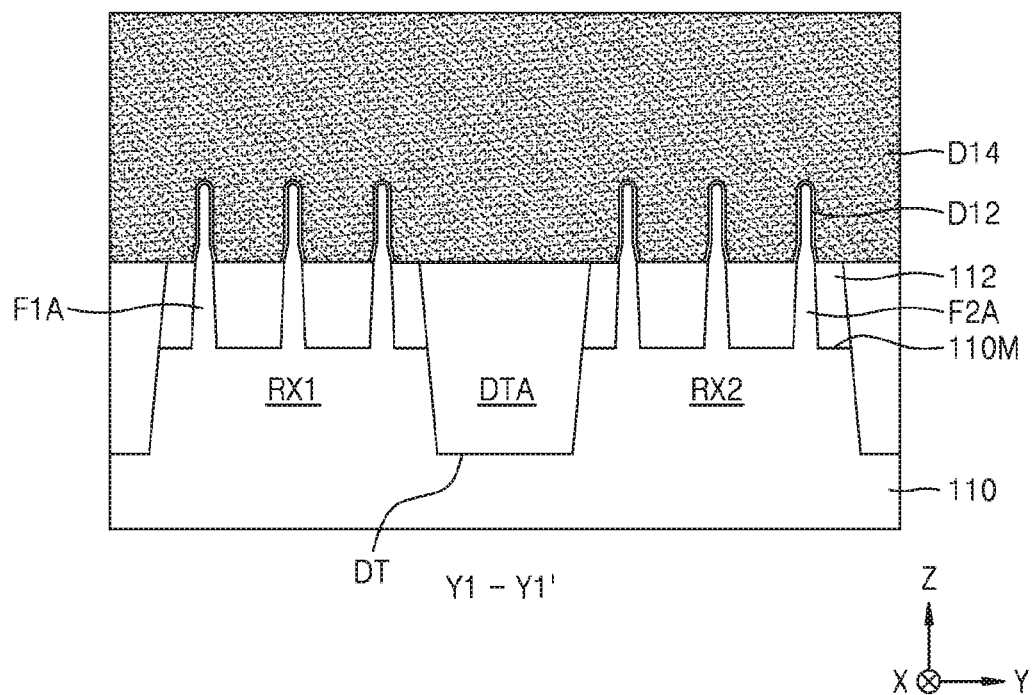
Figure 13D:
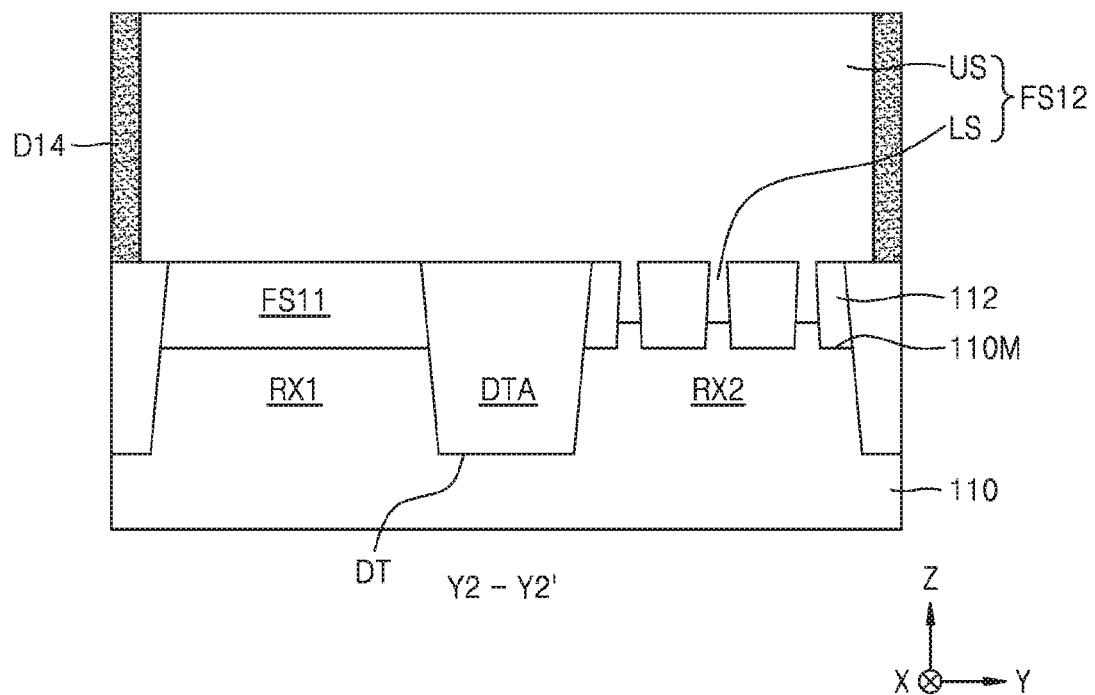
Figure 14A:
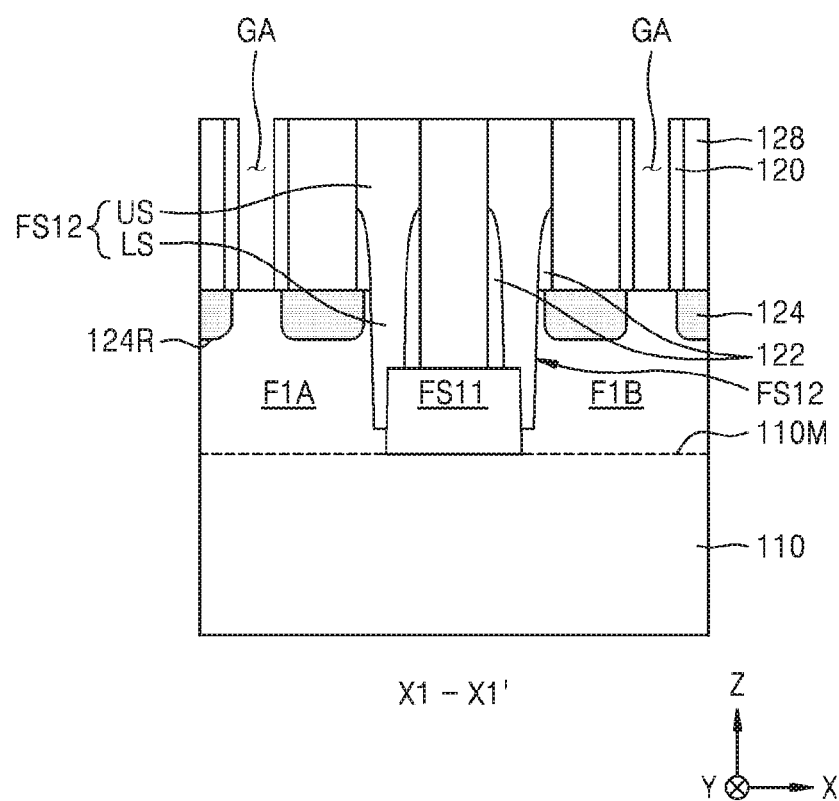
Figure 14B:
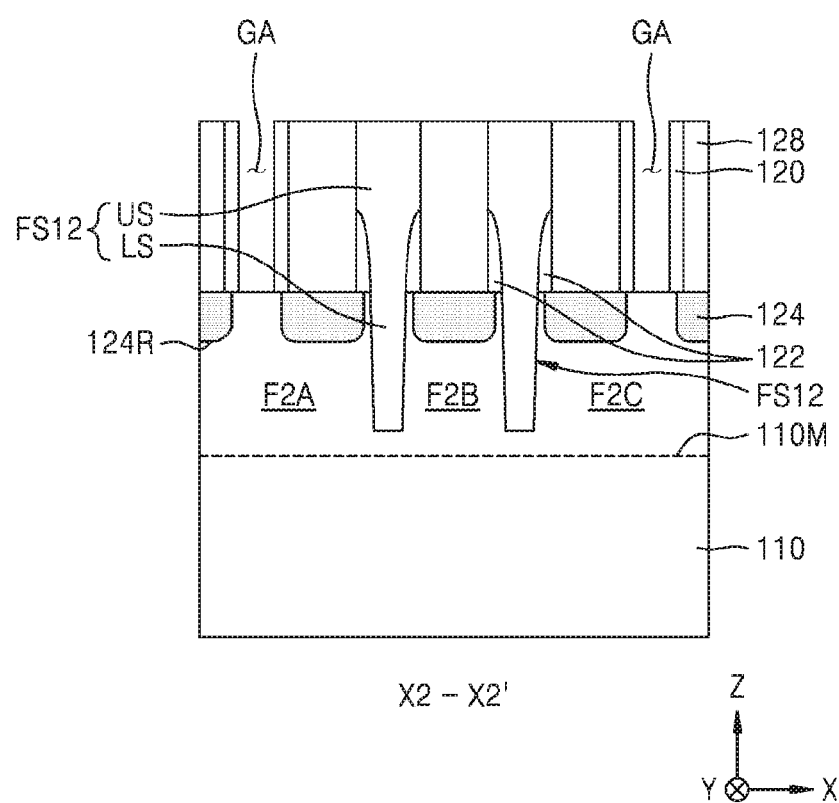
Figure 14C:
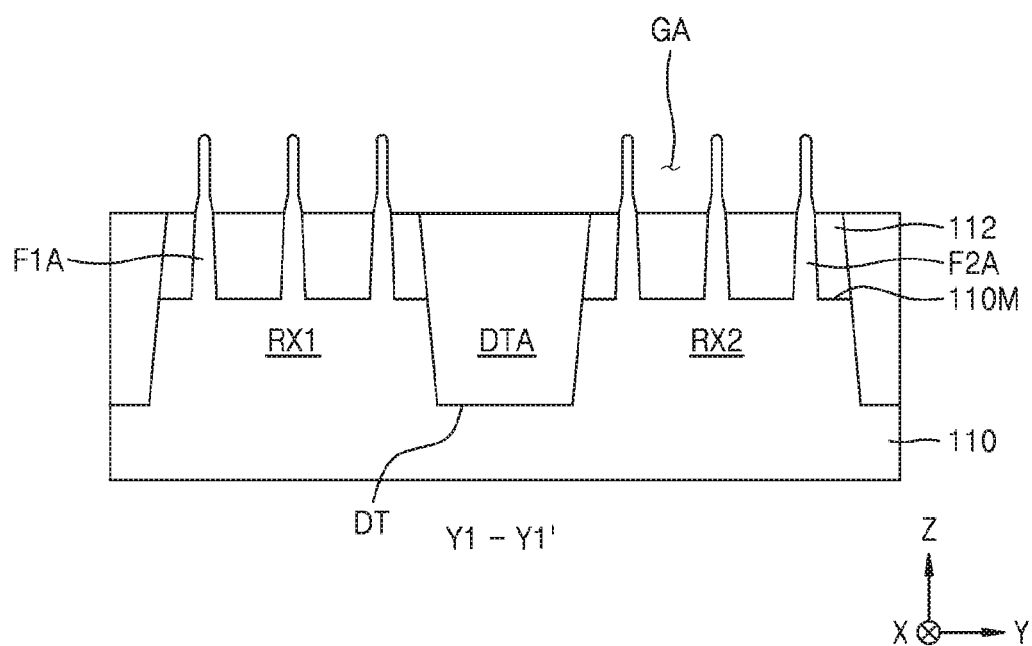
Figure 14D:
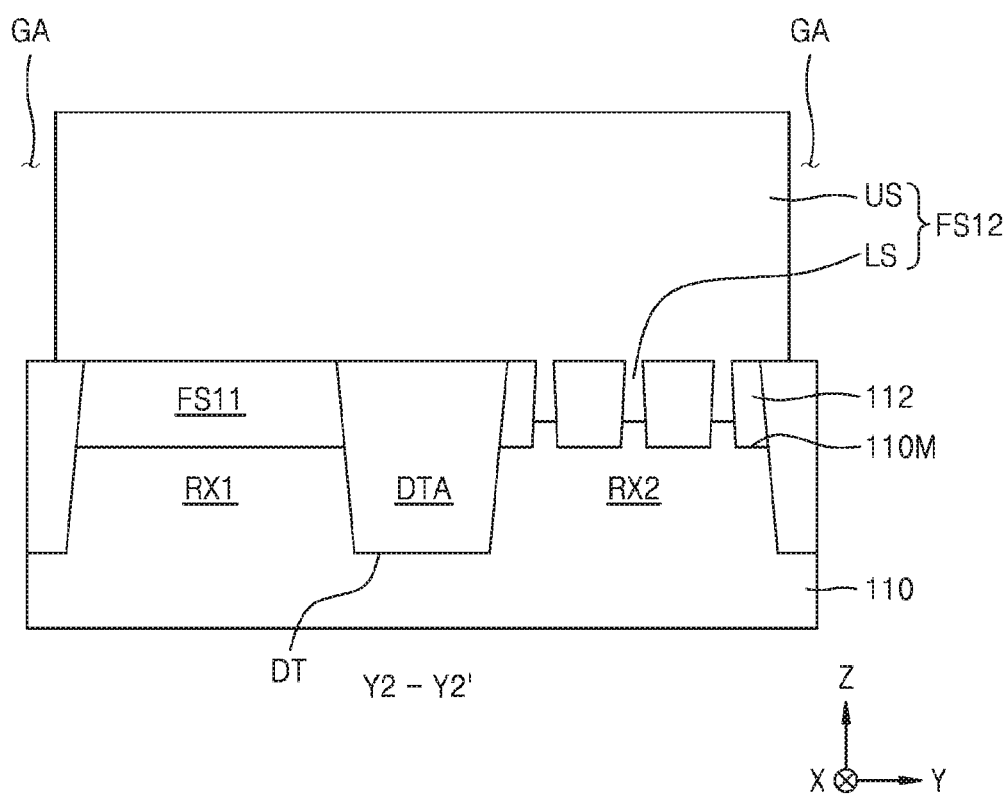
Figure 15A:
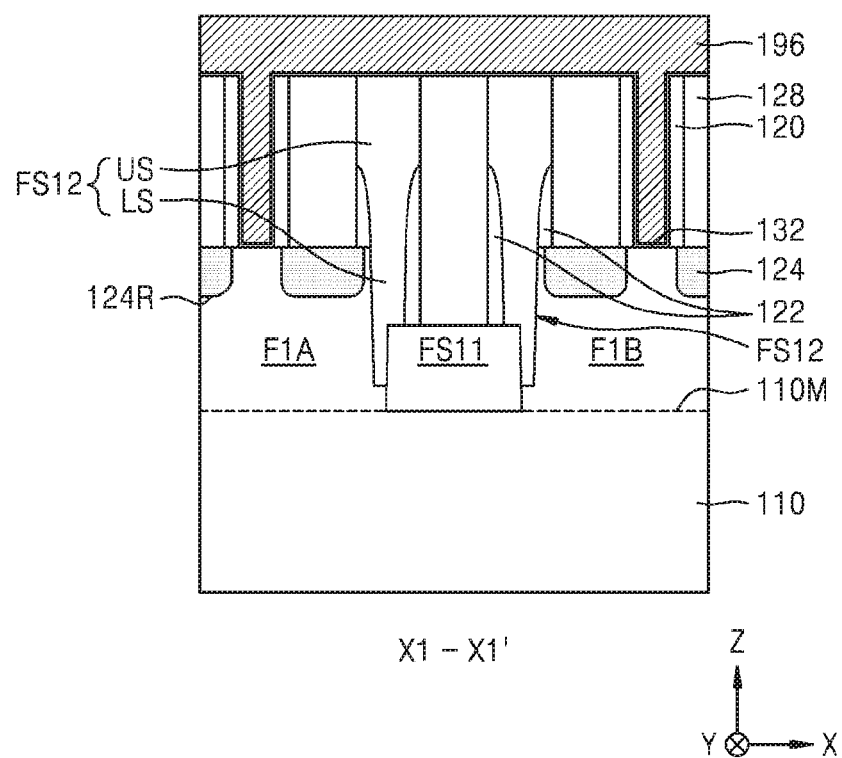
Figure 15B:
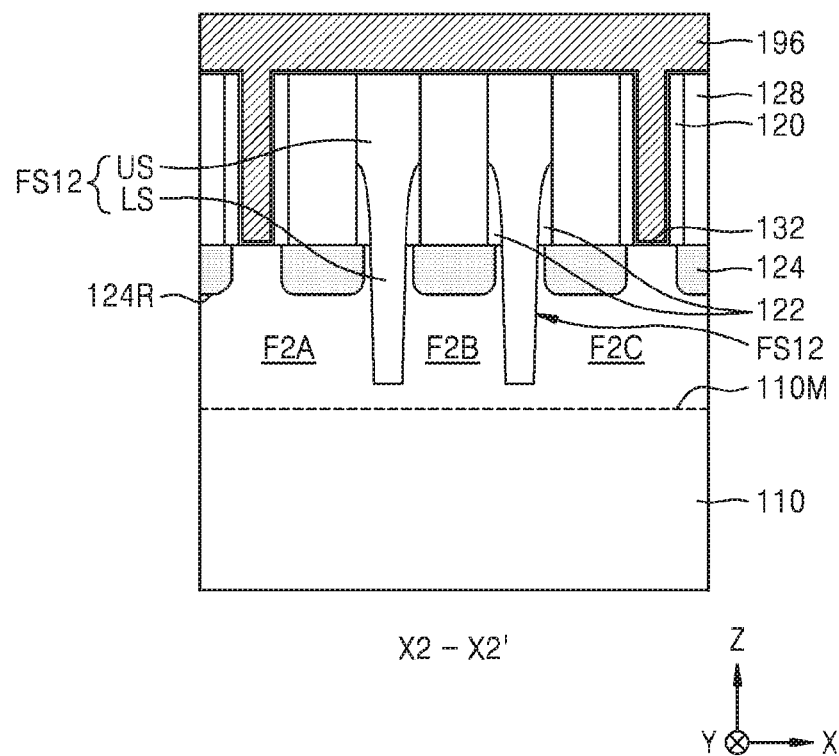
Figure 15C:
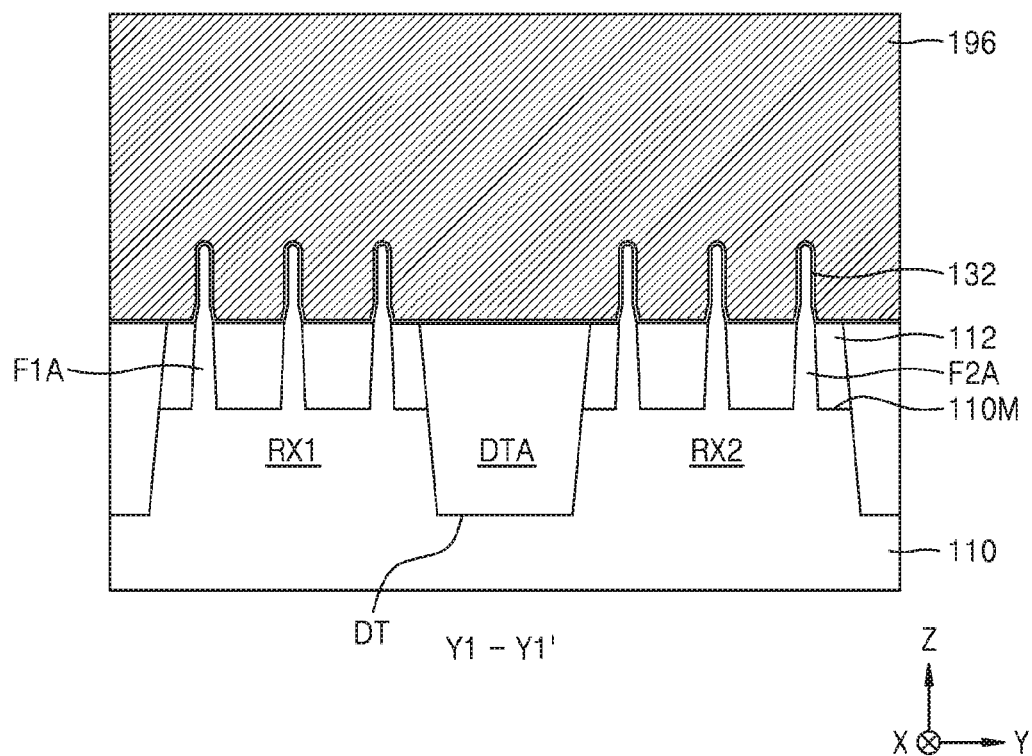
Figure 15D:
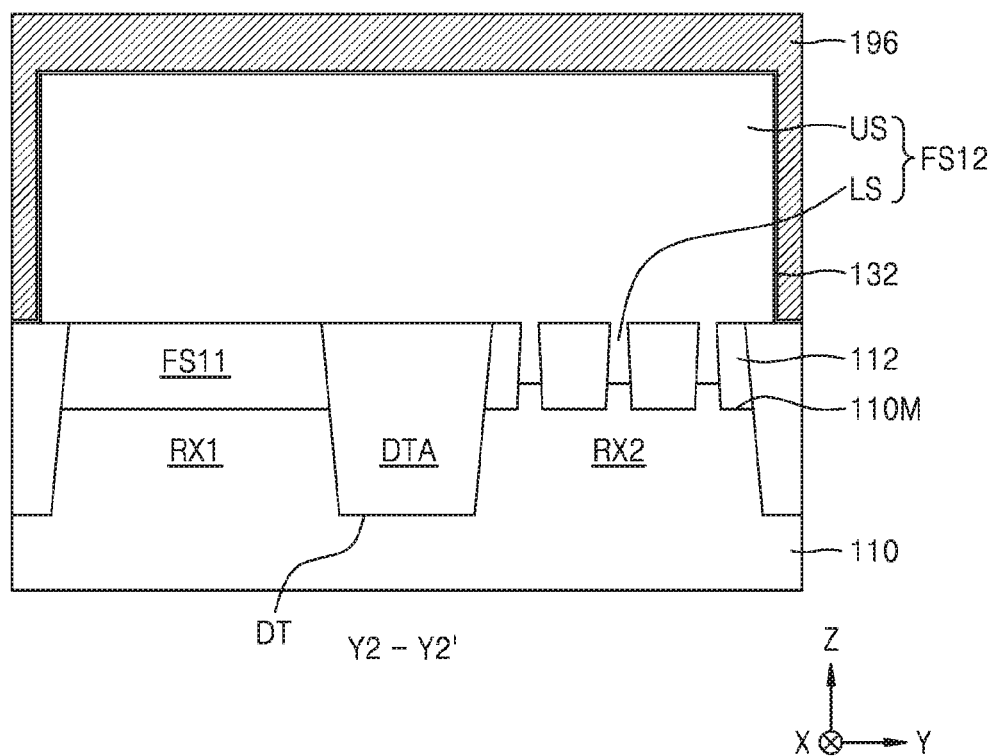
Figure 16A:
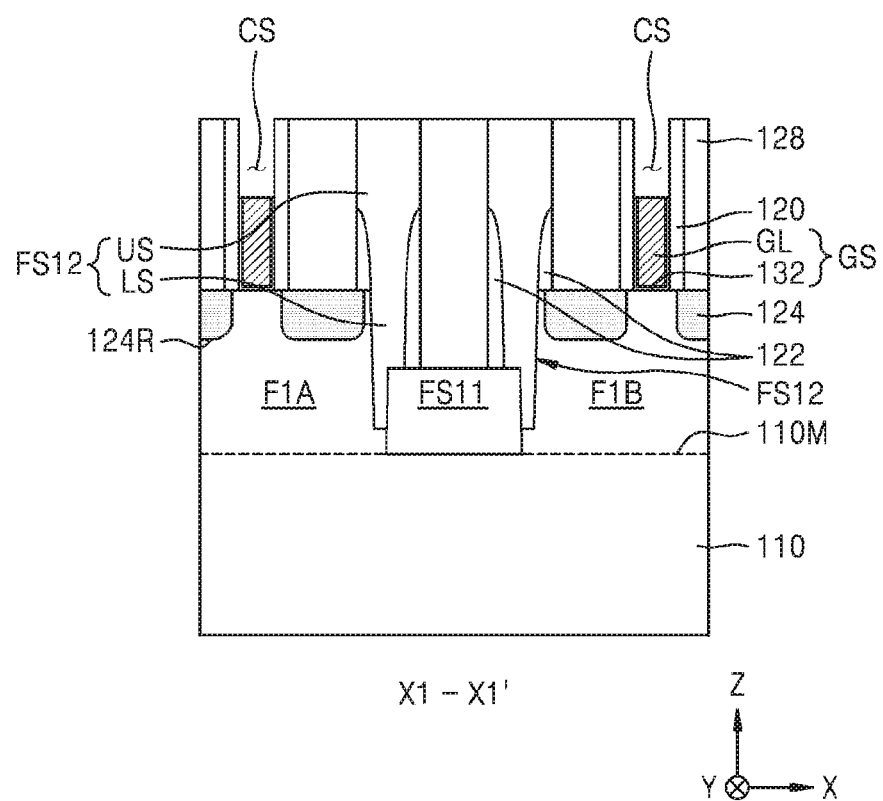
Figure 16B:
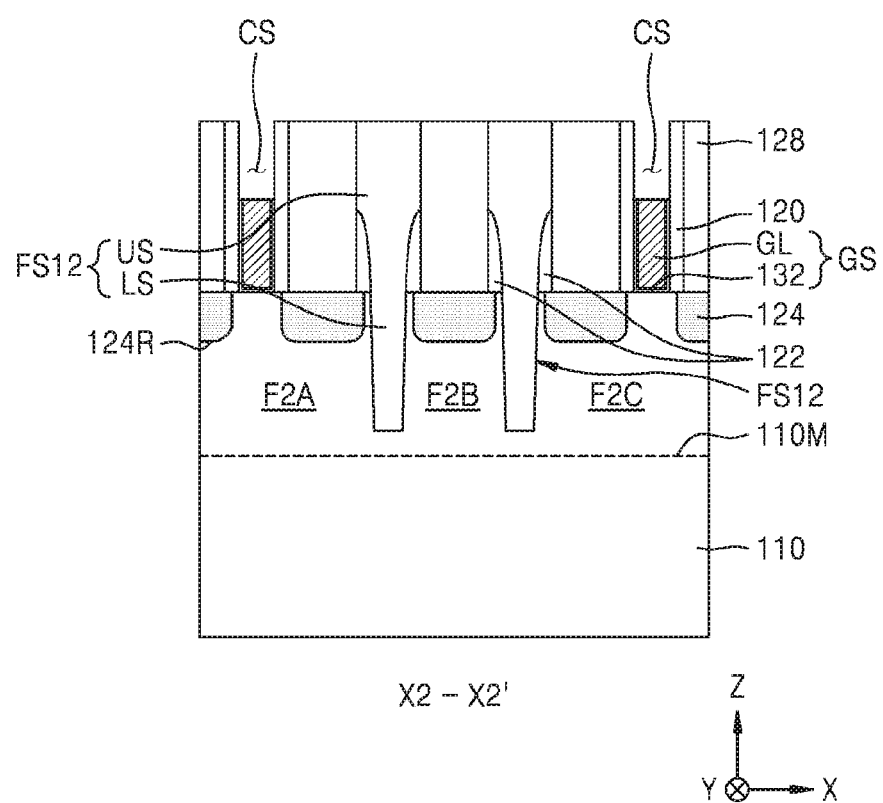
Figure 16C:
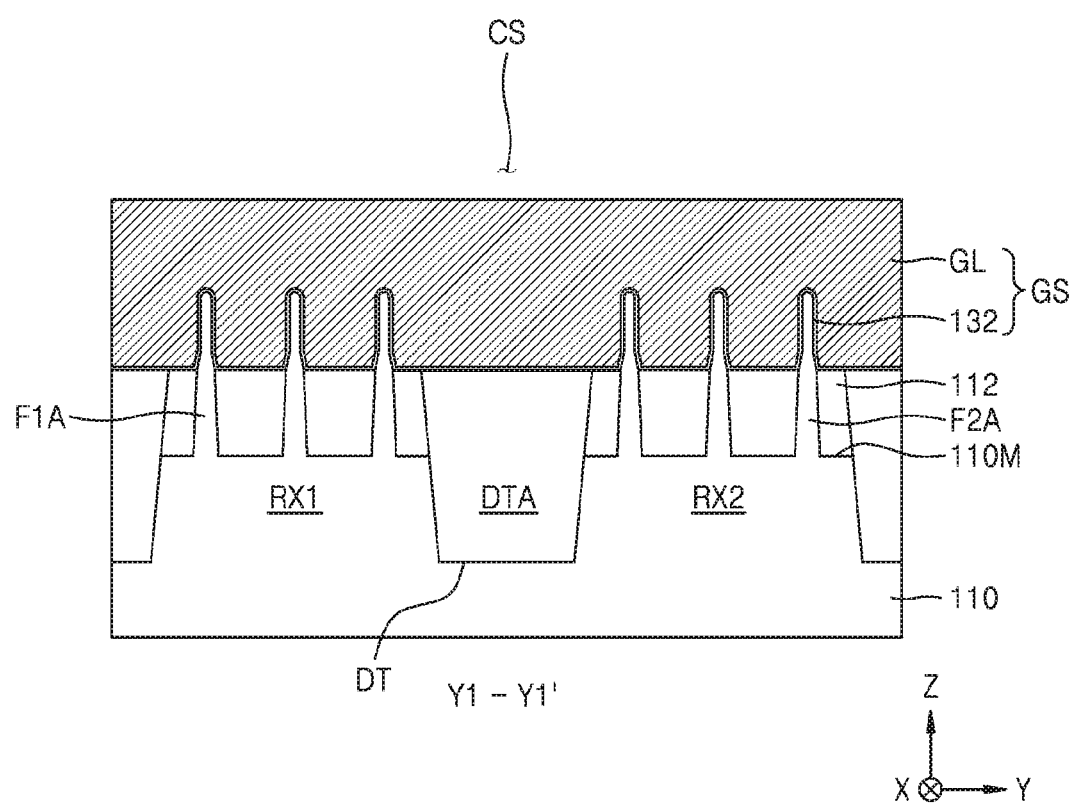
Figure 16D:
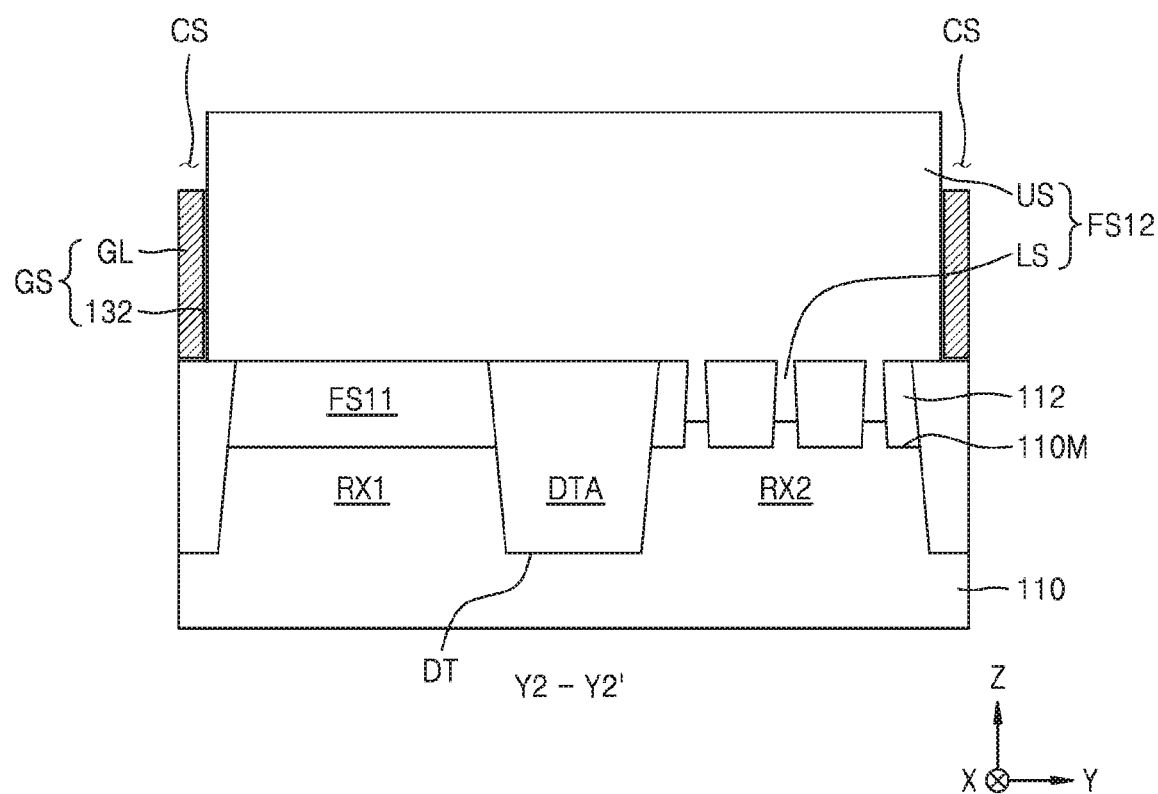
Figure 17A:
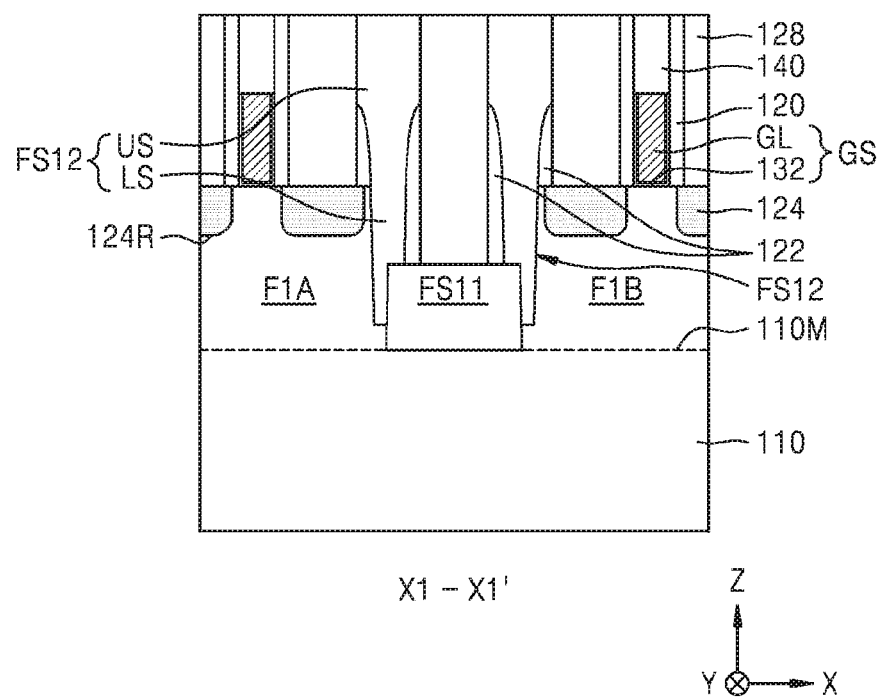
FIG. 17A is a cross-sectional view according to a process sequence of a portion corresponding to a cross section taken along line X1-X1' of FIG. 1, each of FIGS. 7B, 8B, 9B, 10B, 11B, 12B, 13B, 14B, 15B, 16B.
Figure 17B:
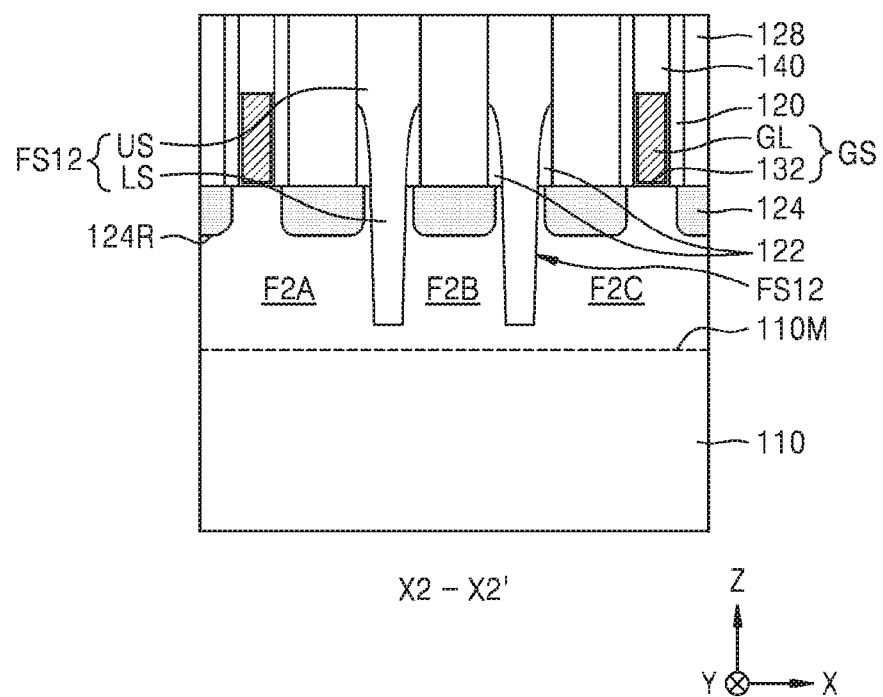
FIG. 17B is a cross-sectional view according to a process sequence of a portion corresponding to a cross section taken along line X2-X2' of FIG. 1, each of FIGS. 7C, 8C, 9C, 10C, 11C, 12C, 13C, 14C, 15C, 16C.
Figure 17C:
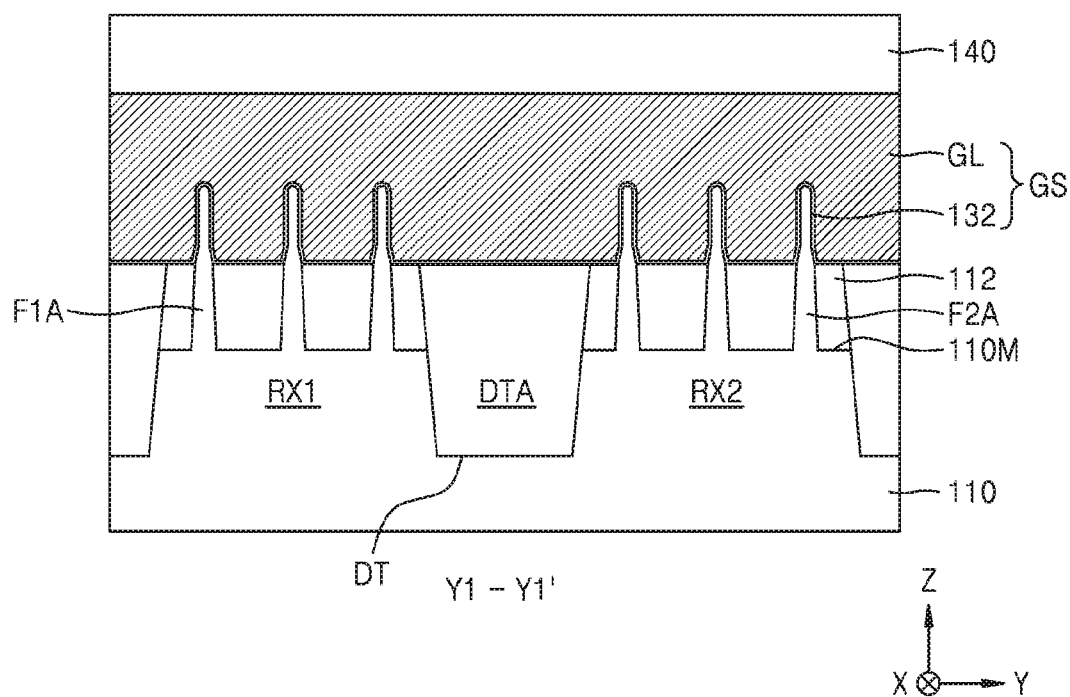
FIG. 17C is a cross-sectional view according to a process sequence of a portion corresponding to a cross section taken along line Y1-Y1' of FIG. 1, and each of FIGS. 7D, 8D, 9D. 10D, 11D, 12D, 13D, 14D, 15D, 16D.
Figure 17D:
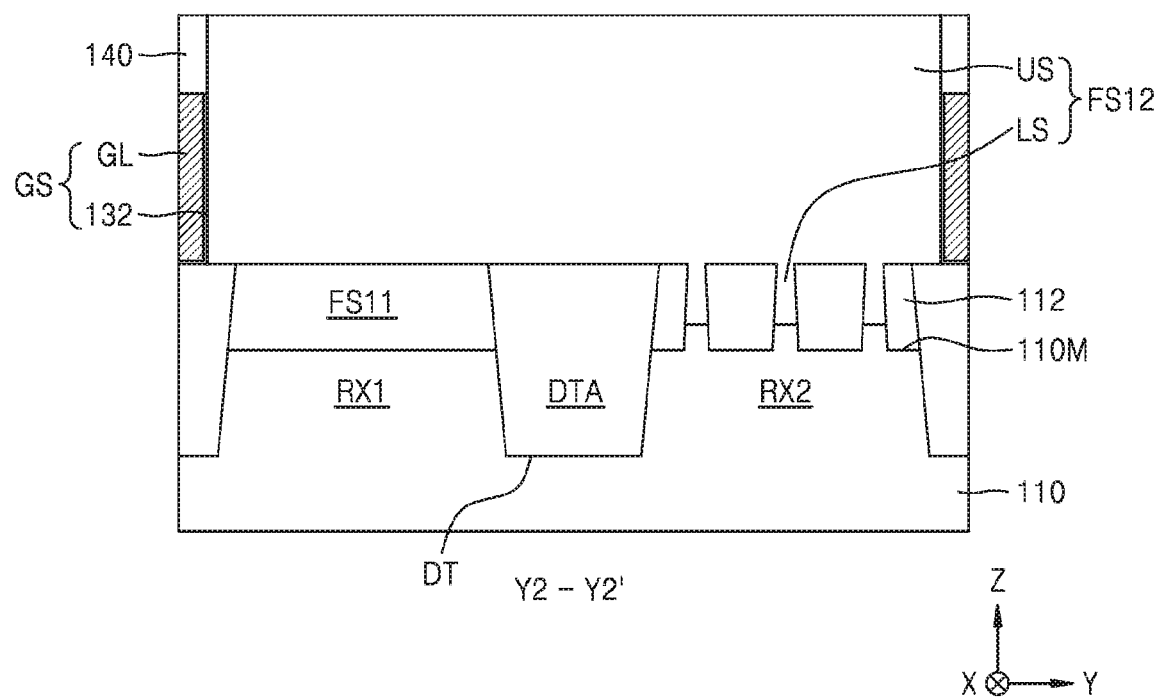

FIGS. 7A, 8A, . . . , and FIG. 17A each illustrate a cross-sectional structure according to a process sequence of a portion corresponding to a cross section taken along line X1-X1' of FIG. 1. FIGS. 7B, 8B, . . . , and FIG. 17B each illustrate a cross-sectional structure according to a process sequence of a portion corresponding to a cross section taken along line X2-X2' of FIG. 1. FIGS. 7C, 8C, . . . , and FIG. 17C each illustrate a cross-sectional structure according to a process sequence of a portion corresponding to a cross section taken along line Y1-Y1' of FIG. 1. FIGS. 7D, 8D, . . . , and FIG. 17D each illustrate a cross-sectional structure according to a process sequence of a portion corresponding to a cross section taken along line Y2-Y2' of FIG. 1. A method of manufacturing the integrated circuit device 100 illustrated in FIGS. 1 to 2D will now be described with reference to FIGS. 7A to 17D. In FIGS. 7A to 17D, elements that are the same as those in FIGS. 1 to 2D are designated by the same reference numerals, and a repeated description thereof is omitted below.

Referring to FIGS. 7A to 7D, a plurality of fin-type active regions protruding from the main surface 110M of the substrate 110 in an upper direction (the Z direction) and extending mutually parallel in the X direction may be formed by etching some regions of the substrate 110 in the first device region RX1 and the second device region RX2, and the device isolation film 112 covering both side walls of a lower portion of each of the plurality of fin-type active regions may be formed. The deep trench DT defining the first device region RX1 and the second device region RX2 may be formed by etching a portion of the device isolation film 112 and a portion of the substrate 110, and the device isolation region DTA may be formed by filling the deep trench DT with an insulating film. The plurality of fin-type active regions may include the plurality of first fin-type active regions F1A and F1B arranged in the first device region RX1 and a plurality of preliminary second fin-type active regions F2 arranged in the second device region RX2.

As the plurality of first fin-type active regions F1A and F1B are formed in the first device region RX1, on the main surface 110M of the substrate 110, a first fin separation space SS1 may be provided between a pair of first fin-type active regions F1A and F1B. A portion of the device isolation film 112 filling the first fin separation space SS1 over the first device region RX1 may be included in the first fin separation insulating portion FS11.

In the first device region RX1 and the second device region RX2, the plurality of first fin-type active regions F1A and F1B and the plurality of preliminary second fin-type active regions F2 may protrude above an upper surface of the device isolation film 112.

Referring to FIGS. 8A to 8D, a plurality of dummy gate structures DGS extending across the plurality of first fin-type active regions F1A and F1B and the plurality of preliminary second fin-type active regions F2 over the first fin separation insulating portion FS11, the device isolation film 112, and the device isolation region DTA are formed. The plurality of dummy gate structures DGS may each include a dummy gate insulating film D12, a dummy gate line D14, and a dummy gate insulating capping layer D16 stacked on the plurality of first fin-type active regions F1A and F1B and the plurality of preliminary second fin-type active regions F2 in this stated order. The dummy gate insulating film D12 may include silicon oxide. The dummy gate line D14 may include polysilicon. The dummy gate insulating capping layer D16 may include silicon nitride. Some dummy gate structures DGS from among the plurality of dummy gate structures DGS may extend in the Y direction while covering the first fin separation insulating portion FS11.

A first insulating spacer 120 may be formed on both side walls of the dummy gate structure DGS. ALD or CVD processes may be used to form the first insulating spacer 120.

The plurality of recesses 124R may be formed by partially etching the plurality of first fin-type active regions F1A and F1B and the plurality of preliminary second fin-type active regions F2 at both sides of the dummy gate structure DGS, and the plurality of source/drain regions 124 may be formed by forming semiconductor layers through epitaxial growth processes from the plurality of recesses 124R. In some example embodiments, the first device region RX1 may be or may include an NMOS transistor region, and the second device region RX2 may be or may include a PMOS transistor region. In this case, the plurality of source/drain regions 124 on the first device region RX1 may include an epitaxially grown Si layer or an epitaxially grown SiC layer, and the plurality of source/drain regions 124 on the second device region RX2 may include a plurality of epitaxially grown SiGe layers.

The inter-gate insulating film 128 covering the first fin separation insulating portion FS11, the device isolation film 112, and the plurality of source/drain regions 124 may be formed between the plurality of dummy gate structures DGS.

Some dummy gate structures DGS from among the plurality of dummy gate structures DGS may include a portion covering an upper surface of the first fin separation insulating portion FS11 on the first device region RX1 and filling a portion of the first fin separation space SS1 (refer to FIG. 7A) between the first fin-type active region F1A and the first fin-type active region F1B.

Referring to FIGS. 9A to 9D, the dummy gate insulating capping layer D16 and surrounding insulating films thereof are removed from a result of FIGS. 8A to 8D through chemical mechanical polishing (CMP) processes, and thus, the dummy gate line D14 is exposed and heights of the inter-gate insulating film 128 and the plurality of first insulating spacers 120 are lowered.

Referring to FIGS. 10A to 10D, a mask pattern M1 having an opening OP is formed on a result of FIGS. 9A to 9D.

The mask pattern M1 may include silicon nitride, silicon oxide, or a combination thereof. Portions of the dummy gate line D14 corresponding to a region where the plurality of second fin separation insulating portions FS12 (refer to FIG. 1) are to be formed may be exposed through the opening OP of the mask pattern M1. The opening OP may have a line shape extending long along the first device region RX1, the device isolation region DTA, and the second device region RX2 in the Y direction.

Referring to FIGS. 11A to 11D, the dummy gate line D14 exposed through the opening OP of the mask pattern M1 is selectively removed by using the mask pattern M1 as an etching mask, and the dummy gate insulating film D12 exposed as a result is removed. Next, a plurality of second fin separation spaces SS2 are formed by etching the plurality of first fin-type active regions F1A and F1B exposed through the opening OP on the first device region RX1 after removal of the dummy gate insulating film D12 and the plurality of preliminary second fin-type active regions F2 exposed through the opening OP on the second device region RX2. As a result of forming the plurality of second fin separation spaces SS2 in the second device region RX2, each of the preliminary second fin-type active regions F2 may be separated into the plurality of second fin-type active regions F2A, F2B, and F2C.

The vertical level LV2 of a lowermost surface of the plurality of second fin separation spaces SS2 may be higher than the vertical level LV1 of the main surface 110M of the substrate 110. In the first device region RX1, the first fin separation insulating portion FS11 may be exposed through the plurality of second fin separation spaces SS2.

While the dummy gate line D14, the dummy gate insulating film D12, the plurality of first fin-type active regions F1A and F1B, and the plurality of second fin-type active regions F2A, F2B, and F2C are etched to form the plurality of second fin separation spaces SS2, the first insulating spacer 120 exposed together to an etching atmosphere through the opening OP may also be partially consumed, and thus, the plurality of second insulating spacers 122, which is a result of lowering a height of the first insulating spacer 120, may be formed.

As the plurality of second insulating spacers 122 are formed, an upper portion on an entrance side of the plurality of second fin separation spaces SS2 may be relatively wide in the X direction, and a portion of the plurality of second fin separation spaces SS2 confined by the plurality of first fin-type active regions F1A and F1B and a portion confined by the plurality of second fin-type active regions F2A, F2B, and F2C may be relatively narrow in the X direction.

Referring to FIGS. 12A to 12D, an isolation insulating film 192 filling the plurality of second fin separation spaces SS2 and covering an upper surface of the mask pattern M1 is formed by depositing an insulating material on a result of FIGS. 11A to 11D where the plurality of second fin separation spaces SS2 are formed. The isolation insulating film 192 may include a silicon nitride film, a silicon oxide film, or a combination thereof.

Referring to FIGS. 13A to 13D, some films covering the inter-gate insulating film 128 are removed by planarization processes so that an upper surface of the inter-gate insulating film 128 is exposed. As a result, the mask pattern M1 (refer to FIGS. 12A to 12D) covering the dummy gate line D14, the first insulating spacer 120, and the inter-gate insulating film 128 over the substrate 110 may be removed, and the plurality of second fin separation insulating portions FS12 having a planar upper surface may be obtained. The plurality of second fin separation insulating portions FS12 may each include the upper insulating portion US and the lower insulating portion LS integrally connected to each other.

Referring to FIGS. 14A to 14D, a plurality of gate structure spaces GA are prepared on the first device region RX1 and the second device region RX2 by removing a plurality of dummy gate lines D14 and a plurality of dummy gate insulating films D12 under the plurality of dummy gate lines D14 from a result of FIGS. 13A to 13D. The first insulating spacer 120, the plurality of first fin-type active regions F1A and F1B, the plurality of second fin-type active regions F2A and F2C, the device isolation film 112, and the device isolation region DTA may be exposed through the plurality of gate structure spaces GA.

Referring to FIGS. 15A to 15D, the gate insulating film 132 and a gate conductive layer 196 are formed in the plurality of gate structure spaces GA (refer to FIGS. 14A to 14D).

In some example embodiments, before the gate insulating film 132 is formed, an interface film (not shown) may be formed on a surface of each of the plurality of first fin-type active regions F1A and F1B and the plurality of second fin-type active regions F2A and F2C exposed through the plurality of gate structure spaces GA. The interface film may be obtained by oxidizing a portion of the plurality of first fin-type active regions F1A and F1B and the plurality of second fin-type active regions F2A and F2C exposed in the plurality of gate structure spaces GA.

The gate insulating film 132 and the gate conductive layer 196 may be formed to cover an upper surface of the inter-gate insulating film 128 while filling a gate structure space GA. The gate insulating film 132 and the gate conductive layer 196 may each be formed by ALD, CVD, physical vapor deposition (PVD), metal organic ALD (MOALD), or metal organic CVD (MOCVD) processes; however, inventive concepts are not limited thereto.

Referring to FIGS. 16A to 16D, after some portions of the gate insulating film 132 and the gate conductive layer 196 (refer to FIGS. 15A to 15D) are removed to expose an upper surface of the inter-gate insulating film 128, portions of the gate insulating film 132 and the gate conductive layer 196 filling the plurality of gate structure spaces GA (refer to FIGS. 14A to 14D) are partially removed from the top, and thus, a plurality of capping spaces CS are prepared. A portion of the gate conductive layer 196 remaining in the gate structure space GA may be included in the gate line GL.

Referring to FIGS. 17A to 17D, the plurality of gate insulating capping layers 140 filling the plurality of capping spaces CS are formed on a result of FIGS. 16A to 16D.

A capping insulating film that is thick enough to fill the plurality of capping spaces CS may be formed over the substrate 110 to form the gate insulating capping layer 140, and then, some portions of the capping insulating film may be removed to expose an upper surface of each of the inter-gate insulating film 128 and the plurality of second fin separation insulating portions FS12. The gate insulating capping layer 140 may include a silicon nitride film.

Next, the upper insulating capping layer 150 and the interlayer insulating film 170 may be formed on a result of FIGS. 17A to 17D to form the integrated circuit device 100 illustrated in FIGS. 1 to 2D.

The method described above with reference to FIGS. 7A to 17D may be used to manufacture the integrated circuit device 100A illustrated in FIG. 3A. However, during the processes described above with reference to FIGS. 12A to 12D, a silicon nitride film for forming the first insulating film 162A, a silicon oxide film for forming the second insulating film 164A, and a silicon oxide film for forming the third insulating film 166A may be formed in this stated order to form the isolation insulating film 192. Next, by using the method described above with reference to FIGS. 13A to 13D, some films covering the inter-gate insulating film 128 may be removed by planarization processes so that an upper surface of the inter-gate insulating film 128 is exposed, and thus, the plurality of second fin separation insulating portions FS12A illustrated in FIG. 3A may be formed.

The method described above with reference to FIGS. 7A to 17D may be used to manufacture the integrated circuit device 100B illustrated in FIG. 3B. However, during the processes described above with reference to FIGS. 12A to 12D, a silicon nitride film for forming the first insulating film 162B and a silicon oxide film for forming the second insulating film 164B may be formed in this stated order to form the isolation insulating film 192. Next, by using the method described above with reference to FIGS. 13A to 13D, some films covering the inter-gate insulating film 128 may be removed by planarization processes so that an upper surface of the inter-gate insulating film 128 is exposed, and thus, the plurality of second fin separation insulating portions FS12B illustrated in FIG. 3B may be formed.

The method described above with reference to FIGS. 7A to 17D may be used to manufacture the integrated circuit device 100C illustrated in FIGS. 4A and 4B. However, as described above with reference to FIGS. 11A to 11D, the plurality of second fin separation spaces SS2 may be formed such that a vertical level of a lowermost surface of the plurality of second fin separation spaces SS2 is substantially the same as the vertical level LV1 of the main surface 110M of the substrate 110. Next, the plurality of second fin separation insulating portions FS12C may be formed in the plurality of second fin separation spaces SS2.

The method described above with reference to FIGS. 7A to 17D may be used to manufacture the integrated circuit device 100D illustrated in FIGS. 5A and 5B. However, as described above with reference to FIGS. 11A to 11D, the plurality of second fin separation spaces SS2 may be formed such that a vertical level of a lowermost surface of the plurality of second fin separation spaces SS2 is lower than the vertical level LV1 of the main surface 110M of the substrate 110. Next, the plurality of second fin separation insulating portions FS12D may be formed in the plurality of second fin separation spaces SS2.

The method described above with reference to FIGS. 7A to 17D may be used to manufacture the integrated circuit device 100E illustrated in FIGS. 6A and 6B. However, during the processes described above with reference to FIGS. 7A to 7D, the first fin separation insulating portion FS11E and the device isolation film 112E each including the first insulating liner 114, the second insulating liner 116, and the buried insulating film 118 as illustrated in FIGS. 6A and 6B may be formed instead of the first fin separation insulating portion FS11 and the device isolation film 112 including the first fin separation insulating portion FS11. Next, the deep trench DT defining the first device region RX1 and the second device region RX2 may be formed by etching a portion of the device isolation film 112E and a portion of the substrate 110, and the device isolation region DTA may be formed by filling the deep trench DT with an insulating film.

Next, the processes described above with reference to FIGS. 8A to 17D may be performed to manufacture the integrated circuit device 100E illustrated in FIGS. 6A and 6B.

According to methods of manufacturing the integrated circuit devices 100, 100A, 100B, 100C, 100D, and 100E described above with reference to FIGS. 7A to 17D, carrier mobility in transistors including channel regions of different conductive types from each other in the first device region RX1 and the second device region RX2 may be independently finely controlled according to conductive types of channel regions by forming, on the first device region RX1, a fin separation region including various combinations selected from various first fin separation insulating portions FS11 and FS11E and various second fin separation insulating portions FS12, FS12A, FS12B, FS12C, and FS12D and forming, on the second device region RX2, a fin separation region selected from various second fin separation insulating portions FS12, FS12A, FS12B, FS12C, and FS12D. Accordingly, optimum or improved performance may be provided according to a channel type of each transistor in the first device region RX1 and the second device region RX2.

FIGS. 18 to 24 are plan layout diagrams for explaining an integrated circuit device according to some example embodiments, respectively. Integrated circuit devices having various structures according to some example embodiments will now be described with reference to FIGS. 18 to 24. In FIGS. 18 to 24, elements that are the same as those in FIG. 1 are designated by the same reference numerals, and a repeated description thereof is omitted below.

Figure 18:
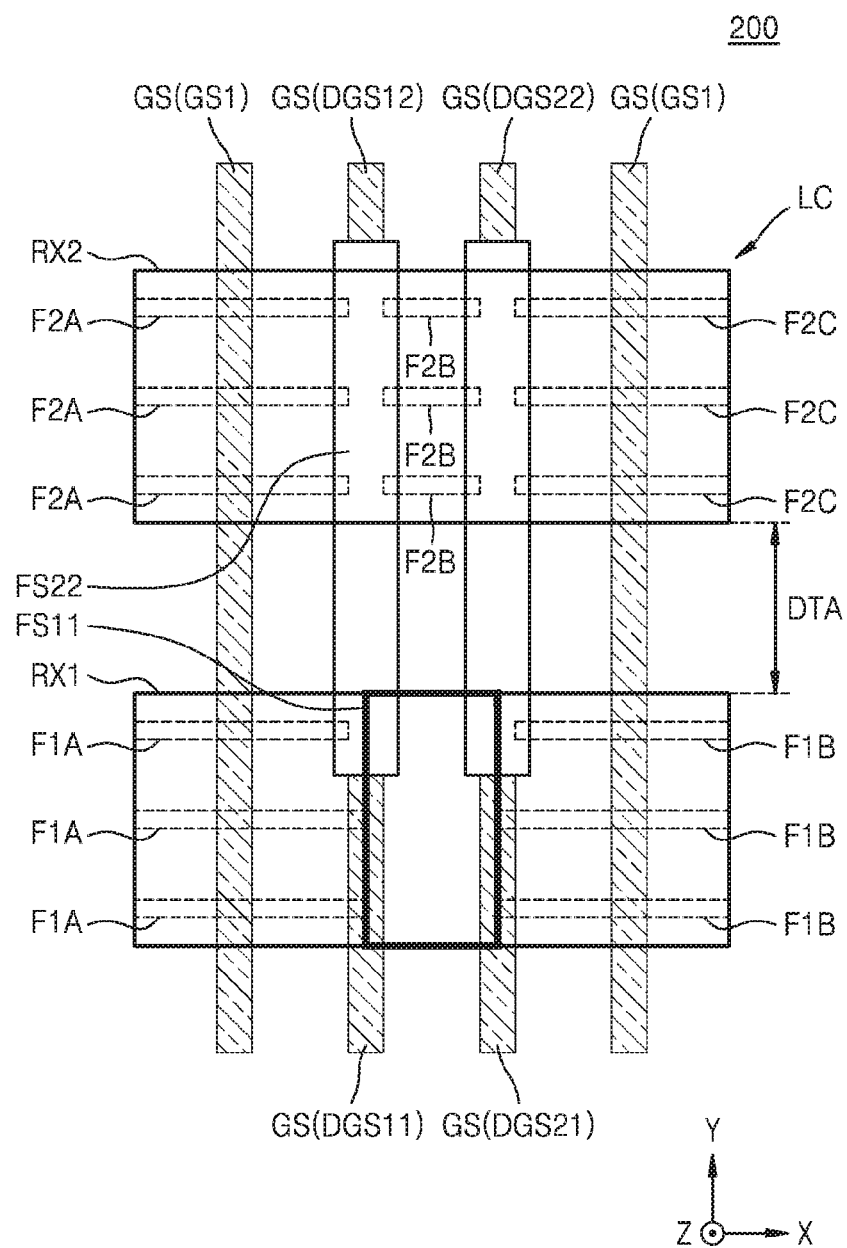
FIGS. 18 to 24 are plan layout diagrams for explaining an integrated circuit device according to some example embodiments, respectively.

An integrated circuit device 200 illustrated in FIG. 18 may have substantially the same configurations as the integrated circuit device 100 described above with reference to FIGS. 1 to 2D. However, the integrated circuit device 200 includes a plurality of second fin separation insulating portions FS22 instead of the plurality of second fin separation insulating portions FS12.

The plurality of second fin separation insulating portions FS22 may have a smaller length in the Y direction than the plurality of second fin separation insulating portions FS12 illustrated in FIG. 1. In the Y direction, the plurality of second fin separation insulating portions FS22 may cover only a portion of the first device region RX1. FIG. 18 illustrates the plurality of second fin separation insulating portions FS22 passing between one pair of first fin-type active regions F1A and F1B from among the plurality of first fin-type active regions F1A and F1B in the first device region RX1 and extending in the Y direction.

From among the plurality of gate structures GS, one pair of dummy gate structures DGS11 and DGS12 spaced from each other in the Y direction with a second fin separation insulating portion FS22 therebetween and collinearly extending in the Y direction together with the second fin separation insulating portion FS22 may have different lengths from each other in the Y direction. Similarly, one pair of dummy gate structures DGS21 and DGS22 may also have different lengths from each other in the Y direction.

Detailed configurations of the plurality of second fin separation insulating portions FS22 are substantially the same as those of the plurality of second fin separation insulating portions FS12 described above with reference to FIGS. 1 to 2D.

Figure 19:
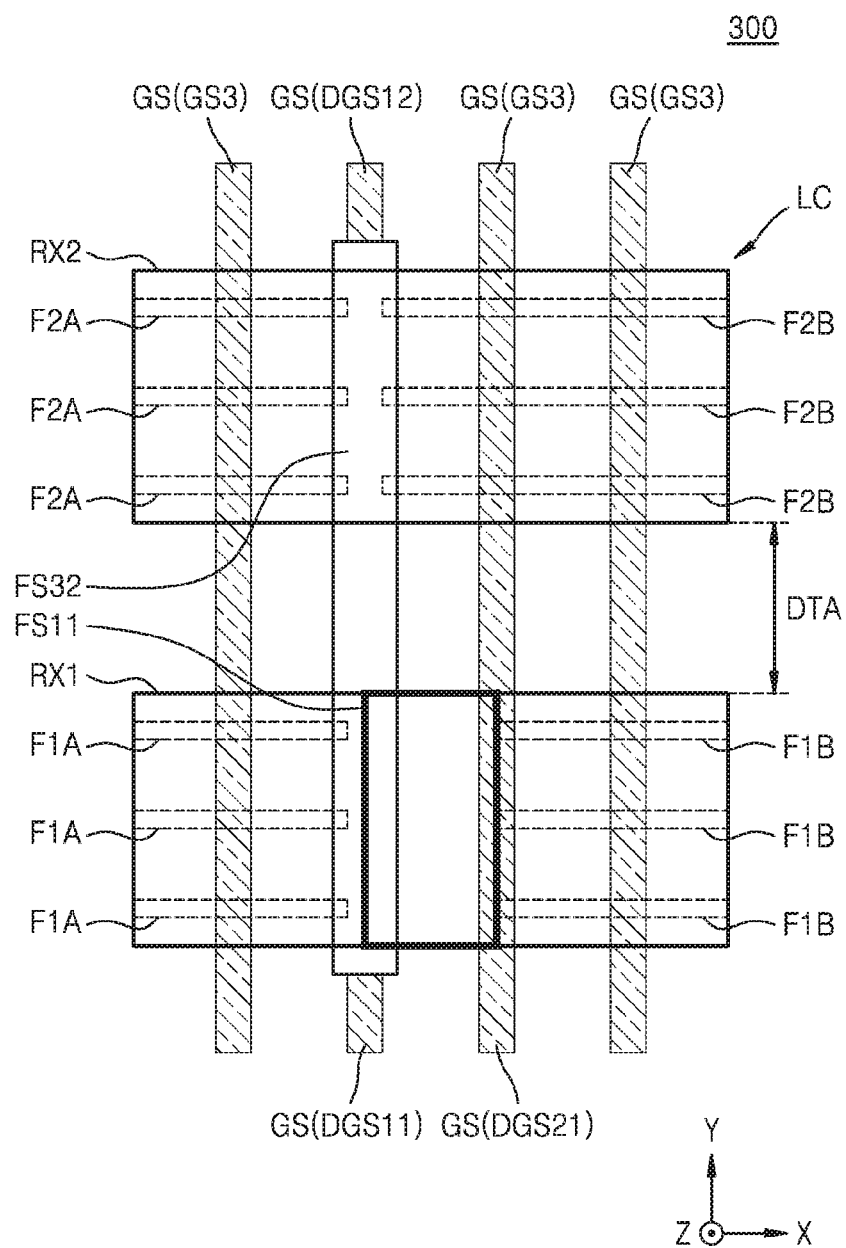

An integrated circuit device 300 illustrated in FIG. 19 may have substantially the same configurations as the integrated circuit device 100 described above with reference to FIGS. 1 to 2D. However, in the integrated circuit device 300, one second fin separation insulating portion FS32 vertically overlaps the first fin separation insulating portion FS11 on the first device region RX1.

The second fin separation insulating portion FS32 may correspond to one of the plurality of second fin separation insulating portions FS12 described above with reference to FIGS. 1 to 2D.

In the second device region RX2, a plurality of second fin-type active regions F2A and F2B protruding from the substrate 110 (refer to FIGS. 2A to 2D) are arranged. The plurality of second fin-type active regions F2A and F2B may extend parallel to each other in the X direction. From among the plurality of second fin-type active regions F2A and F2B, one pair of second fin-type active regions F2A and F2B may be spaced from each other with the second fin separation insulating portion FS32 therebetween and may collinearly extend in the X direction.

In the integrated circuit device 300, the plurality of gate structures GS include one gate structure GS vertically overlapping the first fin separation insulating portion FS11 on the first device region RX1 and spaced from the second fin separation insulating portion FS32 on the second device region RX2. The gate structure GS may be included in the dummy gate structure DGS21 in the first device region RX1 and may be included in a normal gate structure GS3 in the second device region RX2.

Figure 20:
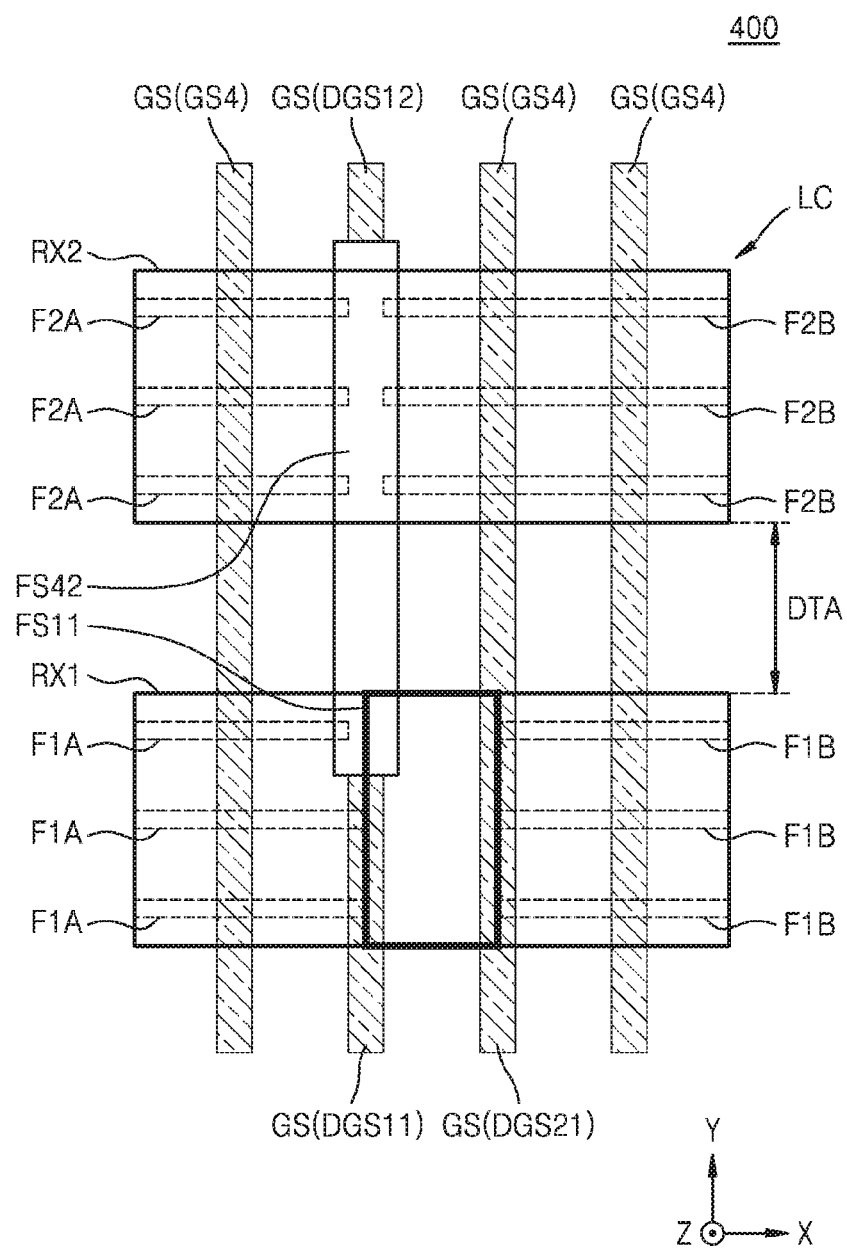

An integrated circuit device 400 illustrated in FIG. 20 may have substantially the same configurations as the integrated circuit device 300 described above with reference to FIG. 19. However, the integrated circuit device 400 includes one second fin separation insulating portion FS42.

The second fin separation insulating portion FS42 may have a smaller length in the Y direction than the second fin separation insulating portion FS32 illustrated in FIG. 19. In the Y direction, the second fin separation insulating portion FS42 may cover only a portion of the first device region RX1. FIG. 20 illustrates the second fin separation insulating portion FS42 passing between one pair of first fin-type active regions F1A and F1B from among the plurality of first fin-type active regions F1A and F1B in the first device region RX1 and extending in the Y direction.

From among the plurality of gate structures GS, one pair of dummy gate structures DGS11 and DGS12 spaced from each other with the second fin separation insulating portion FS42 therebetween and collinearly extending in the Y direction together with the second fin separation insulating portion FS42 may have different lengths from each other in the Y direction.

In the integrated circuit device 400, the plurality of gate structures GS include one gate structure GS vertically overlapping the first fin separation insulating portion FS11 on the first device region RX1 and spaced from the second fin separation insulating portion FS42 on the second device region RX2. The gate structure GS may be included in the dummy gate structure DGS21 in the first device region RX1 and may be included in a normal gate structure GS4 in the second device region RX2.

Figure 21:
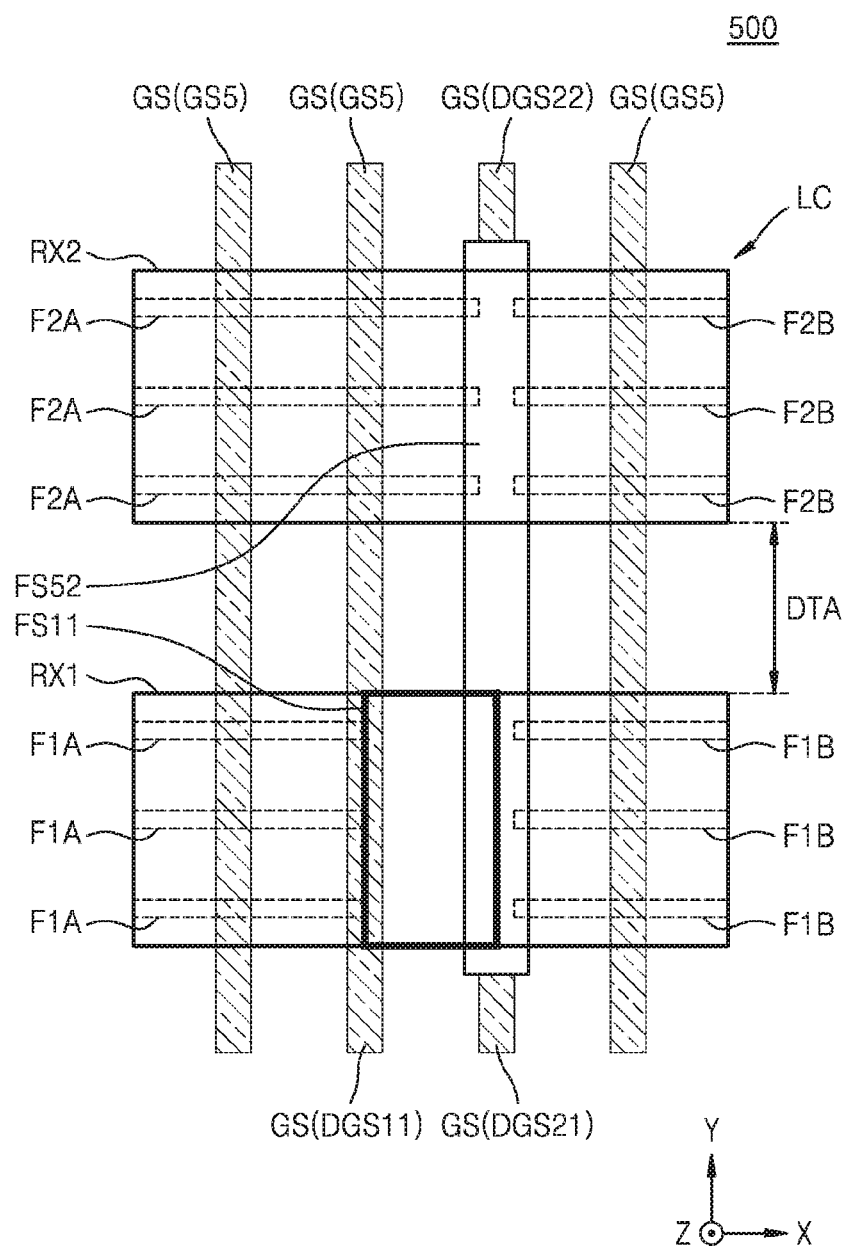

An integrated circuit device 500 illustrated in FIG. 21 may have substantially the same configurations as the integrated circuit device 300 described above with reference to FIG. 19. However, a position of a second fin separation insulating portion FS52 included in the integrated circuit device 500 is different from that of the second fin separation insulating portion FS32 illustrated in FIG. 19.

In the integrated circuit device 500, the plurality of gate structures GS include one gate structure GS vertically overlapping the first fin separation insulating portion FS11 on the first device region RX1 and spaced from the second fin separation insulating portion FS52 on the second device region RX2. The gate structure GS may be included in the dummy gate structure DGS11 on the first device region RX1 and may be included in a normal gate structure GS5 in the second device region RX2.

Figure 22:
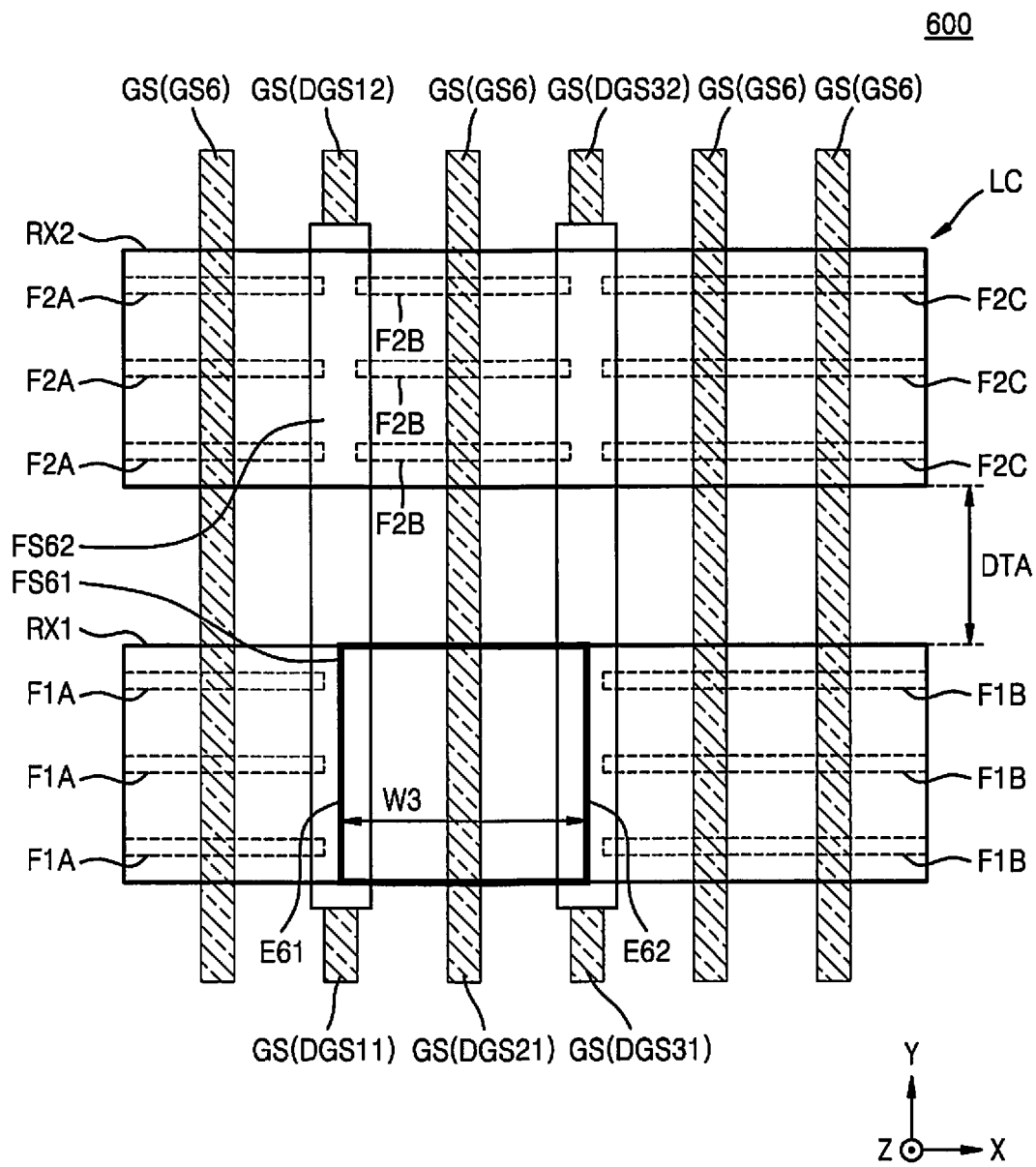

An integrated circuit device 600 illustrated in FIG. 22 may have substantially similar configurations to the integrated circuit device 100 described above with reference to FIGS. 1 to 2D. However, in the integrated circuit device 600, a first fin separation insulating portion FS61 may be over the first device region RX1. The first fin separation insulating portion FS61 may have a third width W3 that is greater than the first width W1 (refer to FIG. 1) of the first fin separation insulating portion FS11 in the X direction.

On the first device region RX1, the first fin separation insulating portion FS61 may vertically overlap two second fin separation insulating portions FS62 and may vertically overlap one gate structure GS from among the plurality of gate structures GS. The two second fin separation insulating portions FS62 may respectively cover both end portions E61 and E62 of the first fin separation insulating portion FS61 opposite to each other in the X direction.

In the integrated circuit device 600, the plurality of gate structures GS include one gate structure GS vertically overlapping the first fin separation insulating portion FS61 on the first device region RX1 and spaced from the second fin separation insulating portions FS62 on the second device region RX2. The gate structure GS may be included in the dummy gate structure DGS21 in the first device region RX1 and may be included in a normal gate structure GS6 in the second device region RX2.

The plurality of gate structures GS may include one pair of dummy gate structures DGS11 and DGS12 and one pair of dummy gate structures DGS31 and DGS32 each spaced from each other in the Y direction with a second fin separation insulating portion FS62 therebetween. The pair of dummy gate structures DGS11 and DGS12 and the pair of dummy gate structures DGS31 and DGS32 may each collinearly extend in the Y direction together with the second fin separation insulating portion FS62.

Figure 23:
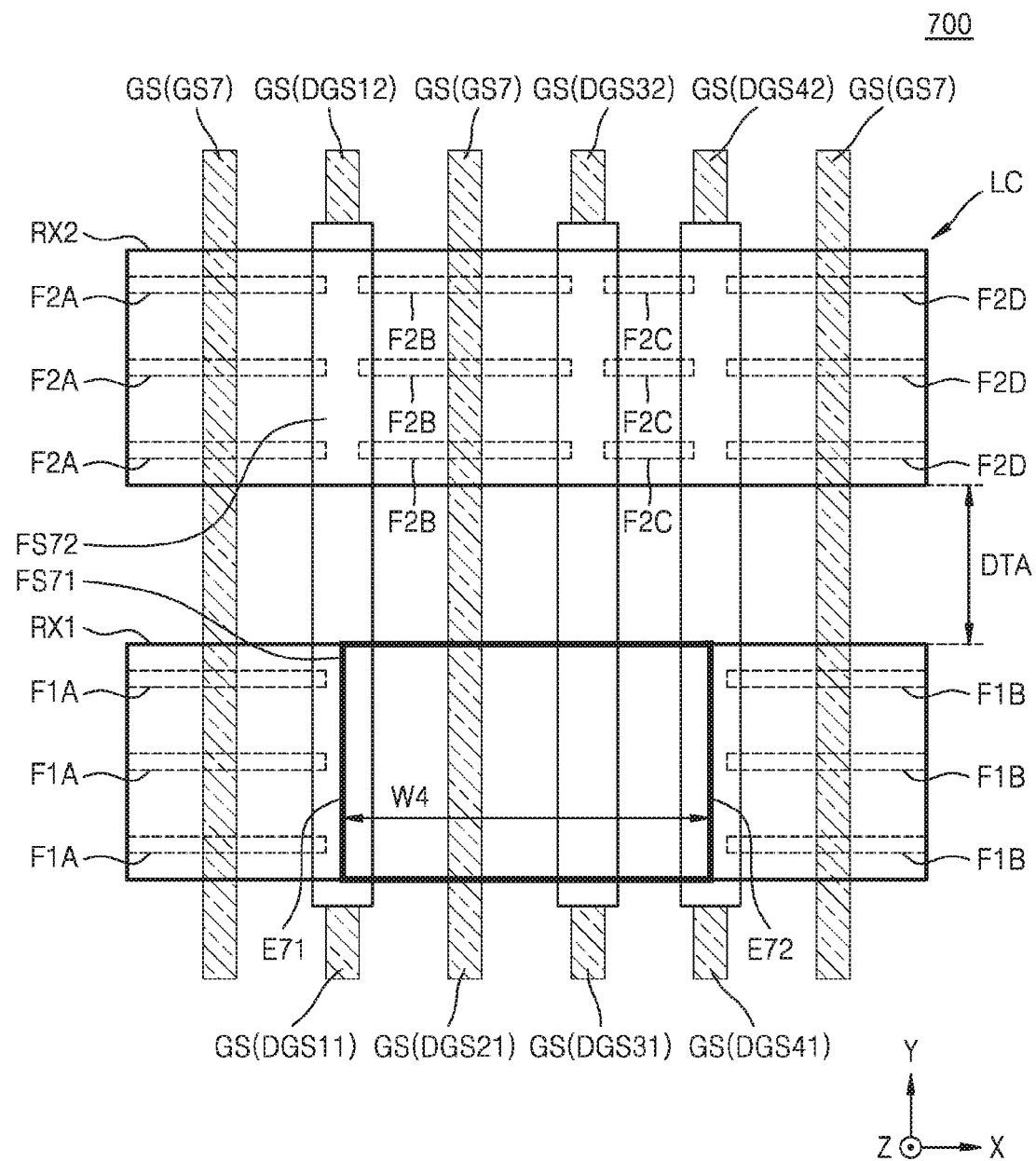

An integrated circuit device 700 illustrated in FIG. 23 may have substantially similar configurations to the integrated circuit device 600 described above with reference to FIG. 22. However, in the integrated circuit device 700, a first fin separation insulating portion FS71 may be over the first device region RX1, and a plurality of second fin separation insulating portions FS72 may be over the second device region RX2. The first fin separation insulating portion FS71 may have a fourth width W4 that is greater than the third width W3 (refer to FIG. 22) of the first fin separation insulating portion FS61 in the X direction.

On the first device region RX1, the first fin separation insulating portion FS71 may vertically overlap three second fin separation insulating portions FS72 and may vertically overlap one gate structure GS from among the plurality of gate structures GS.

In the second device region RX2, there are a plurality of second fin-type active regions F2A, F2B, F2C, and F2D protruding from the substrate 110 in the Z direction and spaced apart from one another. The plurality of second fin-type active regions F2A, F2B, F2C, and F2D may include four second fin-type active regions F2A, F2B, F2C, and F2D arranged in a straight line extending in the X direction across the three second fin separation insulating portions FS72.

In the integrated circuit device 700, the plurality of gate structures GS may include a plurality of pairs of dummy gate structures each spaced from each other in the Y direction with a second fin separation insulating portion FS72 therebetween. The plurality of pairs of dummy gate structures may include one pair of dummy gate structures DGS11 and DGS12, one pair of dummy gate structures DGS31 and DGS32, and one pair of dummy gate structures DGS41 and DGS42. The plurality of pairs of dummy gate structures may each collinearly extend in the Y direction together with the second fin separation insulating portion FS72.

In the integrated circuit device 700, the plurality of gate structures GS include one gate structure GS vertically overlapping the first fin separation insulating portion FS71 on the first device region RX1 and spaced apart from the second fin separation insulating portions FS72 on the second device region RX2. The gate structure GS may be included in the dummy gate structure DGS21 on the first device region RX1 and may be included in a normal gate structure GS7 on the second device region RX2.

The plurality of second fin separation insulating portions FS72 may include two second fin separation insulating portions FS72 covering both end portions E71 and E72 of the first fin separation insulating portion FS71 opposite to each other in the X direction. From among the plurality of second fin separation insulating portions FS72, a second fin separation insulating portion FS72 between the two second fin separation insulating portions FS72 may be omitted. For example, from among the plurality of second fin separation insulating portions FS72, the second fin separation insulating portion FS72 other than the two second fin separation insulating portions FS72 arranged on outermost sides in the X direction may be omitted. Accordingly, from among the plurality of gate structures GS, the dummy gate structure DGS31 may continuously extend to an upper portion of the second device region RX2 in the Y direction in a similar way to the normal gate structure GS7.

Detailed configurations of the first fin separation insulating portion FS71 and the plurality of second fin separation insulating portions FS72 are substantially similar to those of the first fin separation insulating portion FS11 and the plurality of second fin separation insulating portions FS12 described above with reference to FIGS. 1 to 2D.

Figure 24:
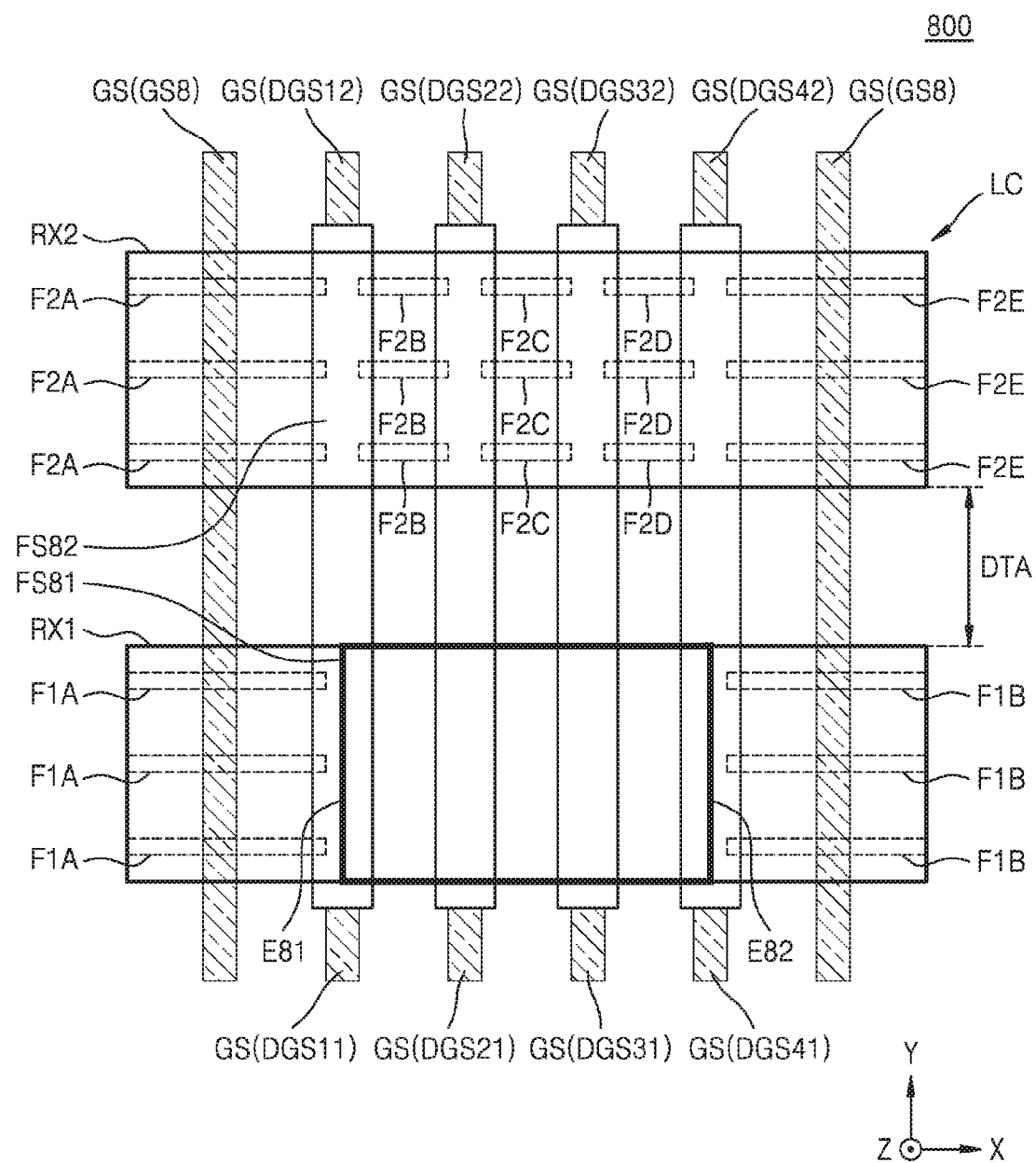

An integrated circuit device 800 illustrated in FIG. 24 may have substantially similar configurations to the integrated circuit device 700 described above with reference to FIG. 23. However, in the integrated circuit device 800, a first fin separation insulating portion FS81 may be over the first device region RX1, and a plurality of second fin separation insulating portions FS82 may be over the first device region RX1 and the second device region RX2.

In the first device region RX1, the first fin separation insulating portion FS81 may vertically overlap four second fin separation insulating portions FS82.

In the second device region RX2, there are a plurality of second fin-type active regions F2A, F2B, F2C, F2D, and F2E protruding from the substrate 110 in the Z direction and spaced apart from one another. The plurality of second fin-type active regions F2A, F2B, F2C, F2D, and F2E may include five second fin-type active regions F2A, F2B, F2C, F2D, and F2E arranged in a straight line extending in the X direction across the four second fin separation insulating portions FS82.

In the integrated circuit device 800, the plurality of gate structures GS may include a plurality of pairs of dummy gate structures each spaced from each other in the Y direction with a second fin separation insulating portion FS82 therebetween. The plurality of pairs of dummy gate structures may include one pair of dummy gate structures DGS11 and DGS12, one pair of dummy gate structures DGS21 and DGS22, one pair of dummy gate structures DGS31 and DGS32, and one pair of dummy gate structures DGS41 and DGS42. The plurality of pairs of dummy gate structures may each collinearly extend in the Y direction together with the second fin separation insulating portion FS82.

The plurality of second fin separation insulating portions FS82 may include two second fin separation insulating portions FS82 covering both end portions E81 and E82 of the first fin separation insulating portion FS81 opposite to each other in the X direction. From among the plurality of second fin separation insulating portions FS82, at least one of a plurality of second fin separation insulating portions FS82 between the two second fin separation insulating portions FS82 may be omitted. In this case, at least one of the dummy gate structures DGS21 and DGS31 may continuously extend to an upper portion of the second device region RX2 in the Y direction in a similar way to a normal gate structure GS8.

Detailed configurations of the first fin separation insulating portion FS81 and the plurality of second fin separation insulating portions FS82 are substantially similar to those of the first fin separation insulating portion FS11 and the plurality of second fin separation insulating portions FS12 described above with reference to FIGS. 1 to 2D.

The integrated circuit devices 200, 300, 400, 500, 600, 700, and 800 described above with reference to FIGS. 18 to 24 may be manufactured by variously modifying and changing a method of manufacturing an integrated circuit device described above with reference to FIGS. 7A to 17D within the scope of the disclosure.

Figure 25A:
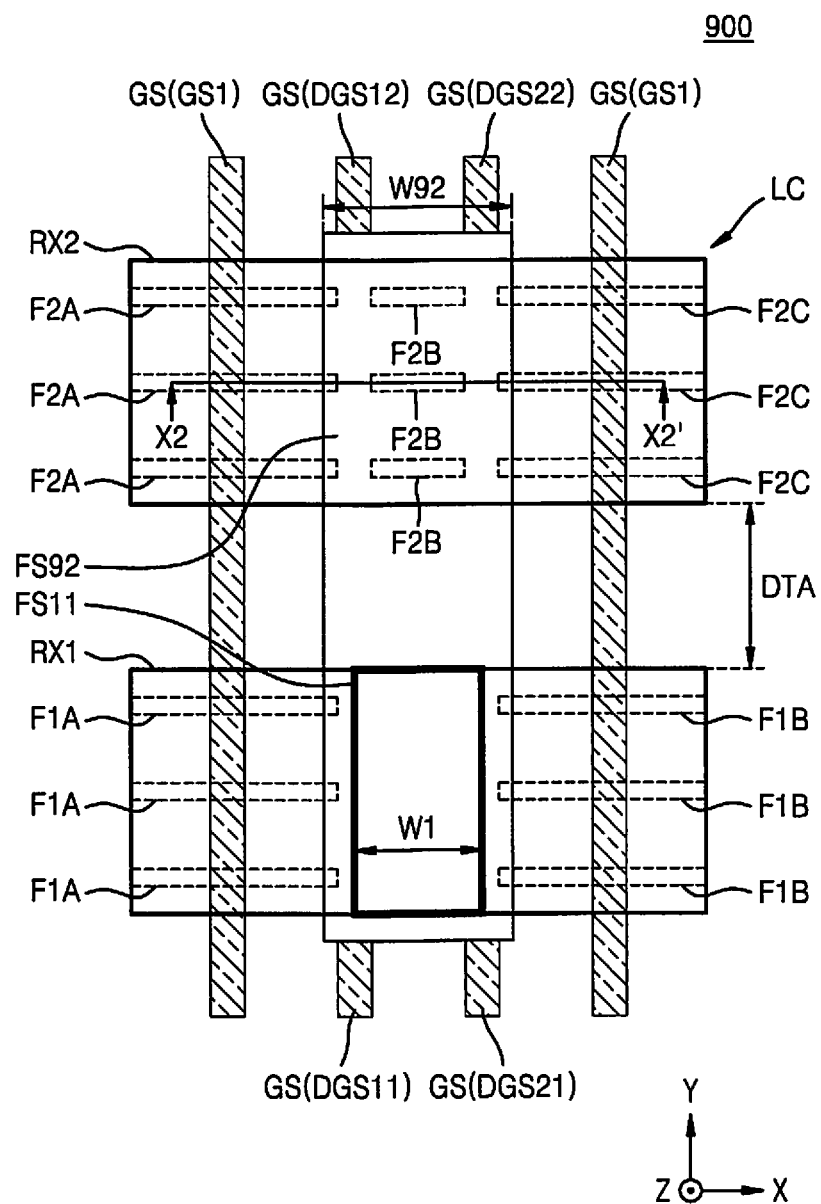
FIG. 25A is a plan layout diagram for explaining major configurations of an integrated circuit device according to some example embodiments.
Figure 25B:
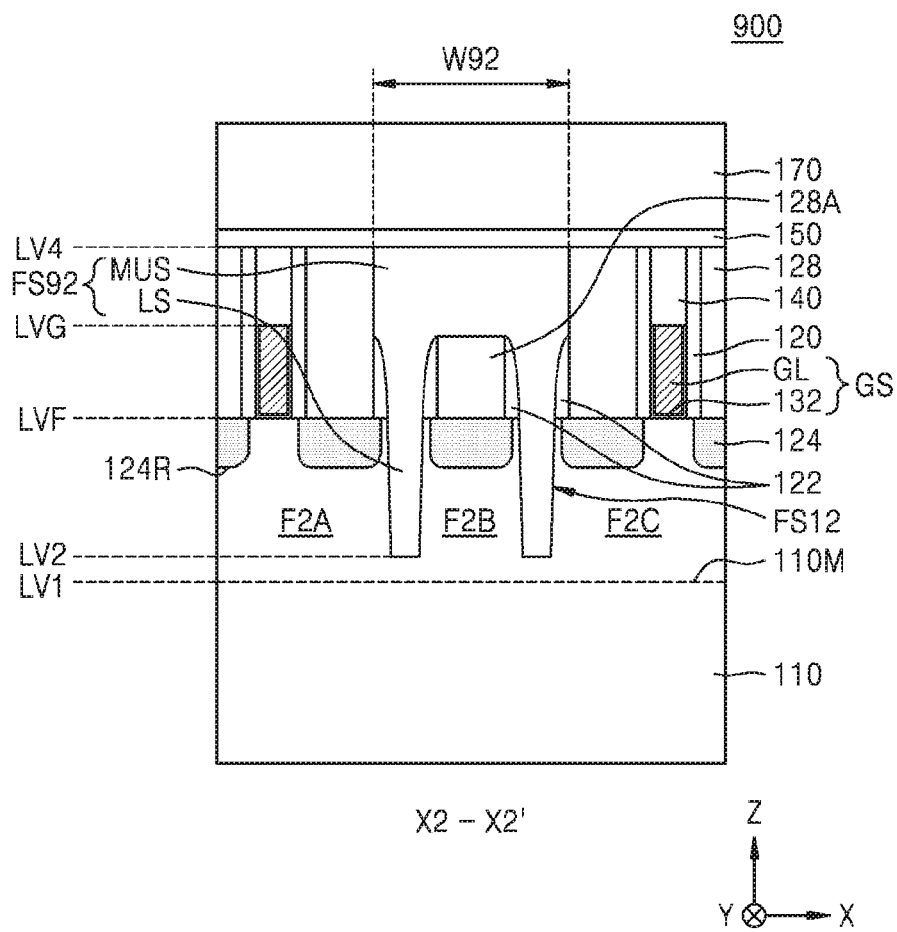
FIG. 25B is a cross-sectional view taken along line X2-X2' of FIG. 25A.

FIGS. 25A and 25B are diagrams for explaining an integrated circuit device 900 according to some example embodiments. FIG. 25A is a plan layout diagram for explaining major components of the integrated circuit device 900, and FIG. 25B is a cross-sectional view taken along line X2-X2' of FIG. 25A. In FIGS. 25A and 25B, elements that are the same as those in FIGS. 1 to 2D are designated by the same reference numerals, and a repeated description thereof is omitted below.

Referring to FIGS. 25A and 25B, the integrated circuit device 900 may have substantially the same configurations as the integrated circuit device 100 described above with reference to FIGS. 1 to 2D. However, the integrated circuit device 900 includes one second fin separation insulating portion FS92 on the second device region RX2.

The second fin separation insulating portion FS92 may have a width W92 that is greater than the first width W1 of the first fin separation insulating portion FS11 in the X direction.

On the second device region RX2, the second fin separation insulating portion FS92 may include one upper insulating portion MUS and a plurality of lower insulating portions LS integrally connected to the upper insulating portion MUS. The inter-gate insulating film 128 may include a separation insulating portion 128A between two neighboring lower insulating portions LS. The separation insulating portion 128A may have a height lower than another portion of the inter-gate insulating film 128. The upper insulating portion MUS may extend to cover an upper surface of the separation insulating portion 128A of the inter-gate insulating film 128.

To manufacture the integrated circuit device 900 illustrated in FIGS. 25A and 25B, the method described above with reference to FIGS. 7A to 17D may be used. However, during the processes described above with reference to FIGS. 11A to 11D, when the plurality of preliminary second fin-type active regions F2 are etched to form the plurality of second fin separation spaces SS2 after the dummy gate line D14 exposed through the opening OP and the dummy gate insulating film D12 are removed, a horizontal width of the opening OP of the mask pattern M1 may be or may include adjusted to a desired size, and an etching atmosphere having etch selectivity of the inter-gate insulating film 128 properly controlled may be or may include applied. Accordingly, an etching amount of a portion of the inter-gate insulating film 128 exposed through the opening OP may be increased compared to that illustrated in FIGS. 11A to 11D, and thus, a thickness of a portion of the inter-gate insulating film 128 between two neighboring second fin separation spaces SS2 may be decreased to form the separation insulating portion 128A. Next, the processes described above with reference to FIGS. 12A to 17D may be performed to manufacture the integrated circuit device 900 illustrated in FIGS. 25A and 25B.

Figure 26:
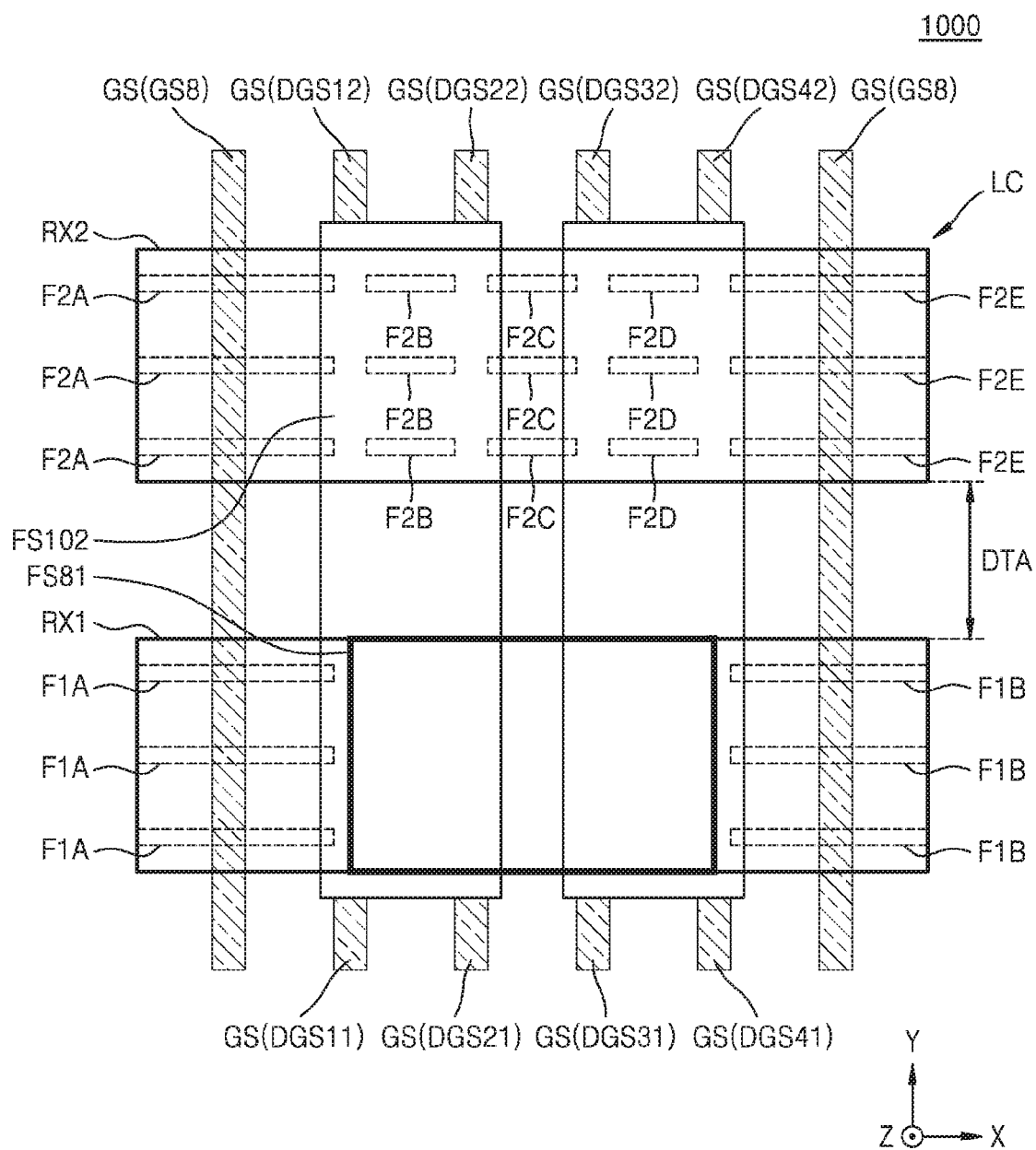
FIGS. 26 and 27 are plan layout diagrams for explaining an integrated circuit device according to some example embodiments, respectively.

FIG. 26 is a plan layout diagram for explaining an integrated circuit device 1000 according to some example embodiments. In FIG. 26, elements that are the same as those in FIG. 24 are designated by the same reference numerals, and a repeated description thereof is omitted below.

Referring to FIG. 26, the integrated circuit device 1000 may have substantially the same configurations as the integrated circuit device 800 described above with reference to FIG. 24. However, the integrated circuit device 1000 includes a plurality of second fin separation insulating portions FS102 arranged over the first device region RX1 and the second device region RX2.

The plurality of second fin separation insulating portions FS102 may each have a cross-sectional structure that is the same as or similar to that of the second fin separation insulating portion FS92 illustrated in FIG. 25B. In some example embodiments, as illustrated in FIG. 25B, the plurality of second fin separation insulating portions FS102 may each include one upper insulating portion MUS and a plurality of lower insulating portions LS integrally connected to the upper insulating portion MUS. The plurality of second fin separation insulating portions FS102 may be or may include spaced apart from each other in the X direction.

To manufacture the integrated circuit device 1000 illustrated in FIG. 26, the manufacturing method illustrated in FIGS. 7A to 17D may be used, and a method changed with reference to the above description of the manufacturing method of FIGS. 25A and 25B may be used.

Figure 27:
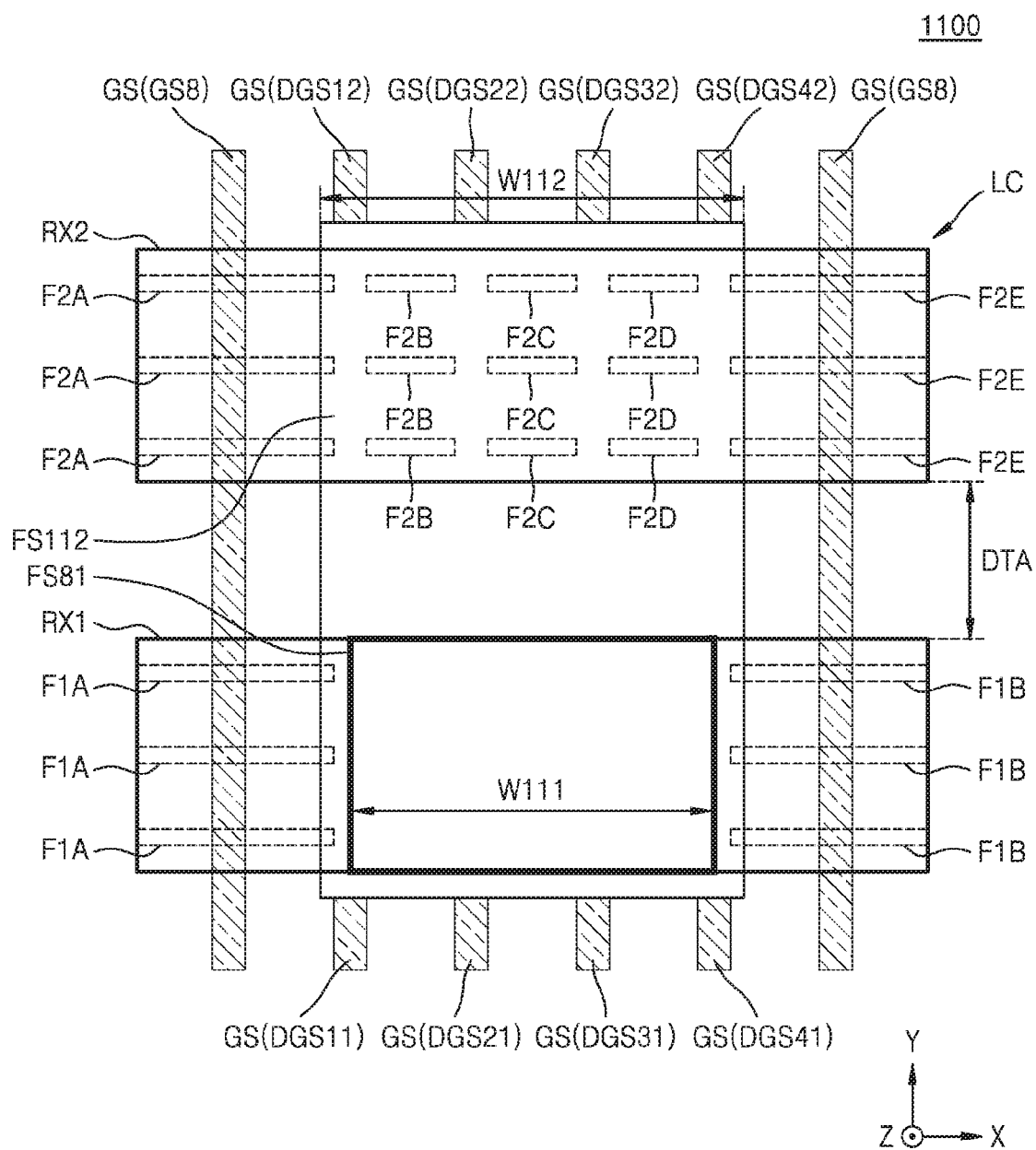

FIG. 27 is a plan layout diagram for explaining an integrated circuit device 1100 according to some example embodiments. In FIG. 27, elements that are the same as those in FIG. 24 are designated by the same reference numerals, and a repeated description thereof is omitted below.

Referring to FIG. 27, the integrated circuit device 1100 may have substantially the same configurations as the integrated circuit device 800 described above with reference to FIG. 24. However, the integrated circuit device 1100 includes one second fin separation insulating portion FS112 extending over the first device region RX1 and the second device region RX2.

The second fin separation insulating portion FS112 may have a width W112 that is greater than the width W111 of the first fin separation insulating portion FS81 in the X direction.

In a similar way to a cross-sectional structure of the second fin separation insulating portion FS92 illustrated in FIG. 25B, the second fin separation insulating portion FS112 may include one upper insulating portion and a plurality of lower insulating portions integrally connected to the upper insulating portion. In some example embodiments, the second fin separation insulating portion FS112 may include one upper insulating portion and four lower insulating portions integrally connected to the upper insulating portion, and the four lower insulating portions may each have the structure described above with respect to a lower insulating portion LS illustrated in FIG. 25B.

To manufacture the integrated circuit device 1100 illustrated in FIG. 27, the manufacturing method illustrated in FIGS. 7A to 17D may be used, and a method changed with reference to the above description of the manufacturing method of FIGS. 25A and 25B may be used.

In some example embodiments, at least some of the second fin separation insulating portions FS22, FS32, FS42, FS52, FS62, FS72, FS82, FS92, FS102, and FS112 of the integrated circuit devices 200, 300, 400, 500, 600, 700, 800, 900, 1000, and 1100 illustrated in FIGS. 18 to 27 may have a structure that is the same as or similar to that of the second fin separation insulating portion FS12A illustrated in FIG. 3A, the second fin separation insulating portion FS12B illustrated in FIG. 3B, the second fin separation insulating portion FS12C illustrated in FIGS. 4A and 4B, or the second fin separation insulating portion FS12D illustrated in FIGS. 5A and 5B. In some example embodiments, at least some of the first fin separation insulating portions FS61, FS71, and FS81 of the integrated circuit devices 200, 300, 400, 500, 600, 700, 800, 900, 1000, and 1100 illustrated in FIGS. 22 to 27 may have a structure that is the same as or similar to that of the first fin separation insulating portion FS11E illustrated in FIG. 6B.

According to one or more example embodiments, configurations of the first fin separation region FSA1 arranged on the first device region RX1 and the second fin separation region FSA2 arranged on the second device region RX2 as illustrated in FIG. 1 may be variously modified by combining various configurations illustrated in FIGS. 3A to 27. Accordingly, optimum or improved performance may be provided according to a channel type of each transistor in the first device region RX1 and the second device region RX2, and reliability of an integrated circuit device may be improved.

While inventive concepts has been particularly shown and described with reference to embodiments thereof, it will be understood that various changes in form and details may be made therein without departing from the spirit and scope of the following claims.

What is claimed is:

1. An integrated circuit device comprising:
a substrate comprising a first device region and a second device region spaced from the first device region;
a device isolation region between the first device region and the second device region;
a first fin separation insulating portion arranged on the first device region and having a first width in a first horizontal direction;
a pair of first fin-type active regions in the first device region, the pair of first fin-type active regions including a first element and a second element spaced from each other, with the first fin separation insulating portion between the first element and the second element, the first element and the second element collinearly extending in the first horizontal direction;
a second fin separation insulating portion extending in a second horizontal direction over the first device region, the device isolation region, and the second device region, and having a second width in the first horizontal direction that is less than the first width, the second horizontal direction crossing the first horizontal direction; and
a pair of second fin-type active regions spaced from each other with the second fin separation insulating portion therebetween in the second device region and collinearly extending in the first horizontal direction,
wherein the first fin separation insulating portion and the second fin separation insulating portion vertically overlap each other.

2. The integrated circuit device of claim 1, wherein the first fin separation insulating portion and the second fin separation insulating portion contact each other on the first device region.

3. The integrated circuit device of claim 1, wherein a lowermost surface of the first fin separation insulating portion is at a different vertical level than a lowermost surface of the second fin separation insulating portion.

4. The integrated circuit device of claim 1, wherein an uppermost surface of the first fin separation insulating portion is at a different vertical level than an uppermost surface of the second fin separation insulating portion.

5. The integrated circuit device of claim 1, further comprising:
a gate structure extending in the second horizontal direction over the first device region, the device isolation region, and the second device region,
wherein the second fin separation insulating portion extends parallel to the gate structure over the first device region, the device isolation region, and the second device region.

6. The integrated circuit device of claim 5, wherein an uppermost surface of the first fin separation insulating portion is at a lower vertical level than an uppermost surface of the pair of first fin-type active regions, and
an uppermost surface of the second fin separation insulating portion is at a vertical level higher than an uppermost surface of the gate structure.

7. The integrated circuit device of claim 1, wherein the second fin separation insulating portion comprises:
an upper insulating portion over the first device region, the device isolation region, and the second device region, the upper insulating portion extending in the second horizontal direction; and
a lower insulating portion protruding from the upper insulating portion toward the substrate and arranged between the first element and the second element of the pair of second fin-type active regions.

8. The integrated circuit device of claim 1, wherein the second fin separation insulating portion is configured to extend between the pair of first fin-type active regions over the first device region.

9. The integrated circuit device of claim 1, wherein the first fin separation insulating portion comprises a first insulating film,
the second fin separation insulating portion comprises a second insulating film having a different composition from the first insulating film, and
the first insulating film and the second insulating film contact each other in the first device region.

10. An integrated circuit device comprising:
a substrate comprising a first device region and a second device region spaced from the first region;
a device isolation region between the first device region and the second device region;
a first fin separation insulating portion on the first device region;
a plurality of pairs of first fin-type active regions in the first device region, each of the plurality of pairs including a first element and a second element spaced from the first element with the first fin separation insulating portion therebetween, the first element collinearly extending with the second element in a first horizontal direction;
a plurality of second fin separation insulating portions extending in a second horizontal direction over the first device region, the device isolation region, and the second device region, and spaced apart from each other, the second horizontal direction crossing the first horizontal direction; and
a plurality of second fin-type active regions in the second device region, the plurality of second fin-type active regions arranged in a straight line extending in a direction across the plurality of second fin separation insulating portions,
wherein the first fin separation insulating portion and the plurality of second fin separation insulating portions vertically overlap each other.

11. The integrated circuit device of claim 10, wherein a width of each of the plurality of second fin separation insulating portions in the first horizontal direction is less than a width of the first fin separation insulating portion in the first horizontal direction.

12. The integrated circuit device of claim 10, wherein the first fin separation insulating portion comprises a first side wall and a second side wall facing opposite to the first side wall in the first horizontal direction,
wherein one second fin separation insulating portion from among the plurality of second fin separation insulating portions contacts the first side wall, and another second fin separation insulating portion from among the plurality of second fin separation insulating portions contacts the second side wall.

13. The integrated circuit device of claim 10, wherein a vertical length of each of the plurality of second fin separation insulating portions is greater than a vertical length of the first fin separation insulating portion.

14. The integrated circuit device of claim 10, further comprising:

a gate structure extending in the second horizontal direction over the first device region, the device isolation region, and the second device region;

a first insulating spacer covering a side wall of the gate structure; and a second insulating spacer covering side walls of the plurality of second fin separation insulating portions, wherein a vertical length of the second insulating spacer is less than a vertical length of the first insulating spacer.

15. The integrated circuit device of claim 10, wherein the first device region includes an NMOS transistor region, and the second device region includes a PMOS transistor region.

16. An integrated circuit device comprising:

a substrate comprising a first device region and a second device region spaced apart from each other;

a first fin separation insulating portion over the first device region;

a pair of first fin-type active regions in the first device region, the pair of first fin-type active regions including a first element and a second element spaced from the first element with the first fin separation insulating portion therebetween, the first element collinearly extending with the second element in a first horizontal direction;

a device isolation region;

a plurality of second fin separation insulating portions covering an upper surface of the first fin separation insulating portion and vertically overlapping the first fin separation insulating portion, the plurality of second fin separation insulating portions extending in a second horizontal direction from an upper portion of the first device region to an upper portion of the second device region through the device isolation region, the second horizontal direction crossing the first horizontal direction; and a plurality of second fin-type active regions in the second device region, the plurality of second fin-type active regions spaced from each other with the plurality of second fin separation insulating portions therebetween, the plurality of second fin-type active regions collinearly extending in the first horizontal direction.

17. The integrated circuit device of claim 16, wherein a lowermost surface of the plurality of second fin separation insulating portions is at a different vertical level than that of lowermost surface of the first fin separation insulating portion.

18. The integrated circuit device of claim 16, further comprising:

a gate structure spaced apart from the plurality of second fin separation insulating portions in the first horizontal direction and extending parallel to the plurality of second fin separation insulating portions, wherein an uppermost surface of the plurality of second fin separation insulating portions is at a vertical level that is higher than an uppermost surface of the gate structure, and a lowermost surface of the plurality of second fin separation insulating portions is at a vertical level that is substantially the same as or lower than a lowermost surface of the first fin separation insulating portion.

19. The integrated circuit device of claim 18, further comprising a dummy gate structure covering the first fin separation insulating portion over the first device region, wherein the dummy gate structure is integrally connected to the gate structure extending over the first device region.

20. The integrated circuit device of claim 16, wherein the first fin separation insulating portion vertically overlaps at least three second fin separation insulating portions.

* * * * *